US012341049B2

(12) United States Patent
Ono et al.

(10) Patent No.: US 12,341,049 B2
(45) Date of Patent: Jun. 24, 2025

(54) ELECTROSTATIC CHUCK INCLUDING A HEATER ELEMENT WITH MUTIPLE HEATING ZONES

(71) Applicant: TOTO LTD., Kitakyushu (JP)

(72) Inventors: Akihito Ono, Kitakyushu (JP); Jumpei Uefuji, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 172 days.

(21) Appl. No.: 18/121,353

(22) Filed: Mar. 14, 2023

(65) Prior Publication Data

US 2023/0317494 A1    Oct. 5, 2023

(30) Foreign Application Priority Data

Mar. 29, 2022  (JP) ................................. 2022-053875
Sep. 28, 2022  (JP) ................................. 2022-154887
Sep. 28, 2022  (JP) ................................. 2022-154888

(51) Int. Cl.
*H01L 21/683* (2006.01)
*H01J 37/32* (2006.01)
*H05B 3/26* (2006.01)

(52) U.S. Cl.
CPC .... *H01L 21/6833* (2013.01); *H01J 37/32724* (2013.01); *H05B 3/265* (2013.01); *H01J 2237/002* (2013.01); *H01J 2237/2007* (2013.01)

(58) Field of Classification Search
CPC ........... H01L 21/6833; H01L 21/67103; H01L 21/67109; H01L 21/6831; H01L 21/68785; H05B 3/283; B23Q 3/15; H02N 13/00

USPC ......................................................... 361/234
See application file for complete search history.

(56) References Cited

U.S. PATENT DOCUMENTS

| 6,423,949 | B1 | 7/2002 | Chen et al. |
| 10,224,228 | B2* | 3/2019 | Kim .................... H01J 37/3211 |
| 11,694,881 | B2* | 7/2023 | Endo ................ H01L 21/67103 |
| | | | 156/345.27 |
| 2004/0108308 | A1 | 6/2004 | Okajima |
| 2006/0291132 | A1* | 12/2006 | Kanno ............... H01L 21/6831 |
| | | | 361/234 |

(Continued)

FOREIGN PATENT DOCUMENTS

JP    2004-111107 A    4/2004
JP    2017-152537 A    8/2017

(Continued)

*Primary Examiner* — Thienvu V Tran
*Assistant Examiner* — Sreeya Sreevatsa
(74) *Attorney, Agent, or Firm* — Carrier, Shende & Associates P.C.; Joseph P. Carrier; Fulchand P. Shende

(57) ABSTRACT

An electrostatic chuck includes a ceramic dielectric substrate, a base plate, and a heater unit. The heater unit includes first and second heater elements. The first heater element includes a first zone. The first heater element includes first and second protruding portions. The first zone includes a first facing region in which the first protruding portion and the second protruding portion are disposed so as to face and be adjacent to each other. The second heater element includes a second zone. The second zone includes a central region and an outer peripheral region. The central region is positioned at a center of the second zone. The outer peripheral region is positioned outside the central region. The first facing region is located at a position where the first facing region overlaps the central region.

19 Claims, 18 Drawing Sheets

(56) References Cited

U.S. PATENT DOCUMENTS

| | | | | |
|---|---|---|---|---|
| 2018/0286732 A1* | 10/2018 | Uefuji | ................ | H01L 21/6831 |
| 2021/0007183 A1* | 1/2021 | Miwa | ..................... | H05B 3/283 |
| 2021/0090930 A1* | 3/2021 | Miwa | ................... | H01L 21/683 |
| 2023/0010049 A1* | 1/2023 | Vellanki | ............ | H01L 21/68757 |

FOREIGN PATENT DOCUMENTS

| | | | |
|---|---|---|---|
| JP | 2018-120910 A | | 8/2018 |
| KR | 2005-0054952 A | | 6/2005 |
| KR | 2018-0110613 A | | 10/2018 |

* cited by examiner

ELECTROSTATIC CHUCK INCLUDING A HEATER ELEMENT WITH MUTIPLE HEATING ZONES

CROSS-REFERENCE TO RELATED APPLICATIONS

This application is based upon and claims the benefit of priority from Japanese Patent Application No. 2022-053875, filed on Mar. 29, 2022, No. 2022-154887, filed on Sep. 28, 2022, and No. 2022-154888, filed on Sep. 28, 2022; the entire contents of which are incorporated herein by reference.

FIELD

Embodiments described herein relate generally to an electrostatic chuck.

BACKGROUND

In a plasma processing chamber where etching, chemical vapor deposition (CVD), sputtering, ion implantation, ashing, or the like is performed, an electrostatic chuck is used as a member for clamping and holding a process object such as a semiconductor wafer or a glass substrate. The electrostatic chuck applies an electrostatic clamping power to built-in electrodes and clamps a substrate such as a silicon wafer by an electrostatic force.

In recent years, IC chips including semiconductor elements such as transistors have been required to be miniaturized and improved in processing speed. Along with this requirement, in forming the semiconductor element on a wafer, it is required to improve processing accuracy of etching or the like. The processing accuracy of etching indicates whether or not a pattern having a width and depth as designed can be formed by processing a wafer. By increasing the processing accuracy of etching or the like, the semiconductor element can be miniaturized, and the integration density can be increased. That is, by increasing the processing accuracy, it is possible to reduce the size of the chip and to increase the speed of the chip.

It is known that a processing accuracy of etching or the like depends on the temperature of a wafer during processing. Therefore, in a substrate processing apparatus having an electrostatic chuck, it is required to control an in-plane temperature distribution of the wafer during the processing in order to allow an etching rate to be uniform. As a method of controlling the in-plane temperature distribution of the wafer, a method of using an electrostatic chuck having an embedded heater (heating element) is known.

Especially in recent years, along with the miniaturization of semiconductor elements, faster heating and stricter control of the in-plane temperature distribution have been required, and as a method for implementing this, the use of a two-layer structure of a main heater and a sub-heater as a heater is known. Heater patterns when the heater includes multiple zones also are known.

However, providing multiple zones in the heater allows for fine temperature control, but causes design constraints on the shape of the heater pattern and increases the number of pads, terminals, and the like for feeding power, which results in a new problem, i.e., the degradation of the uniformity of the temperature distribution in the wafer surface due to the occurrence in the heater plane of many cool spots having relatively low temperatures and hotspots having relatively high temperatures.

Therefore, for example, it may be considered to increase the uniformity of the temperature distribution in the wafer surface by dispersing the cool spots and the hotspots in the heater plane. However, there is a risk that dispersing the cool spots and the hotspots in the heater plane may make the temperature control complex. It is desirable to increase the uniformity of the temperature distribution in the wafer surface while suppressing complex temperature control.

SUMMARY

According to the embodiment, an electrostatic chuck includes a ceramic dielectric substrate, a base plate, and a heater unit. The ceramic dielectric substrate has a first major surface and a second major surface. The first major surface is configured to have a process object placed thereon. The second major surface is opposite to the first major surface. The base plate has an upper surface and a lower surface. The upper surface is at the ceramic dielectric substrate side. The lower surface is opposite to the upper surface. The base plate supports the ceramic dielectric substrate. The heater unit heats the ceramic dielectric substrate. The heater unit includes a first heater element and a second heater element. The first heater element is located between the first major surface and the upper surface. The second heater element is located between the first major surface and the first heater element or between the first heater element and the upper surface. The first heater element includes a plurality of zones. The plurality of zones of the first heater element includes a first zone. The first zone includes a first heater line, a first power feeding portion, and a second power feeding portion. The first heater line emits heat by allowing a current to flow. The first power feeding portion and the second power feeding portion feed power to the first heater line. The first heater line includes a plurality of extension portions, and a plurality of protruding portions. The plurality of extension portions extends along a first direction. The plurality of extension portions is arranged in a second direction. the second direction is perpendicular to the first direction. The plurality of protruding portions is provided in the plurality of extension portions. The plurality of protruding portions protrudes in the second direction. The plurality of extension portions includes a first extension portion and a second extension portion. The plurality of protruding portions includes a first protruding portion and a second protruding portion. The first protruding portion is provided in the first extension portion. The second protruding portion is provided in the second extension portion. The first protruding portion protrudes toward the second protruding portion. The second protruding portion protrudes toward the first protruding portion. The first zone includes a first facing region in which the first protruding portion and the second protruding portion are disposed so as to face and be adjacent to each other. The second heater element includes a plurality of zones. The plurality of zones of the second heater element includes a second zone. The second zone includes a second heater line, a third power feeding portion, and a fourth power feeding portion. The second heater line emits heat by allowing a current to flow. The third power feeding portion and the fourth power feeding portion feeds power to the second heater line. The second zone includes a central region and an outer peripheral region. The central region is positioned at a center of the second zone when viewed along a Z-direction. The Z-direction is perpendicular to the first major surface. The outer peripheral region is positioned outside the central region. The first facing region is located at a position where the first facing region overlaps the central region in the Z-direction.

DETAILED DESCRIPTION

Figure 1:
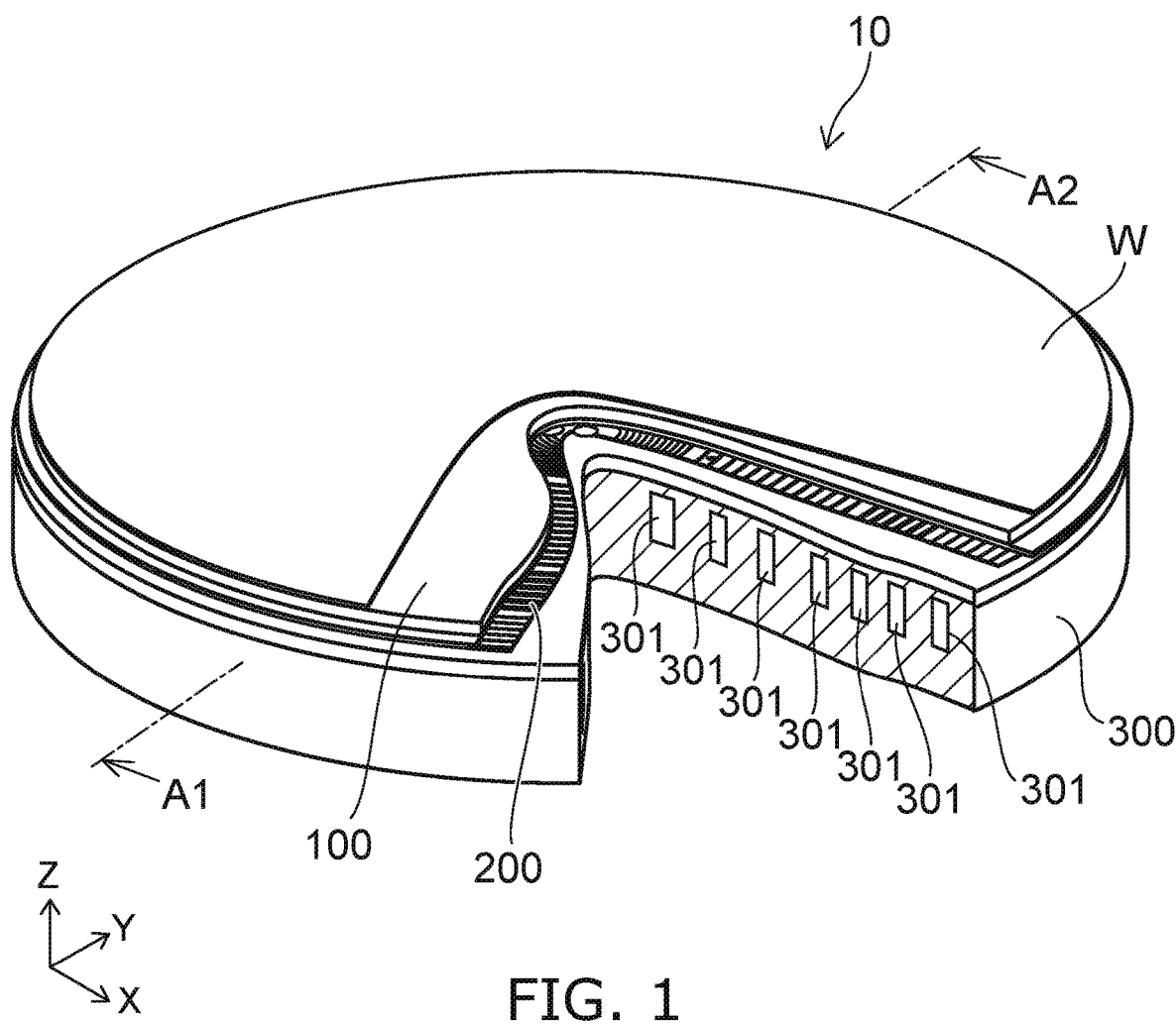
FIG. 1 is a perspective view schematically illustrating an electrostatic chuck according to an embodiment.

A first invention is an electrostatic chuck including a ceramic dielectric substrate, a base plate supporting the ceramic dielectric substrate, and a heater unit heating the ceramic dielectric substrate; the ceramic dielectric substrate has a first major surface configured to have a process object placed thereon, and a second major surface opposite to the first major surface; the base plate has an upper surface at the ceramic dielectric substrate side and a lower surface opposite to the upper surface; the heater unit includes a first heater element and a second heater element; the first heater element is located between the first major surface and the upper surface; the second heater element is located between the first major surface and the first heater element or between the first heater element and the upper surface; the first heater element includes multiple zones; the multiple zones of the first heater element include a first zone; the first zone includes a first heater line emitting heat by allowing a current to flow, and a first power feeding portion and a second power feeding portion feeding power to the first heater line; the first heater line includes multiple extension portions and multiple protruding portions; the multiple extension portions extend along a first direction and are arranged in a second direction perpendicular to the first direction; the multiple protruding portions are provided in the multiple extension portions and protrude in the second direction; the multiple extension portions include a first extension portion and a second extension portion; the multiple protruding portions include a first protruding portion provided in the first extension portion, and a second protruding portion provided in the second extension portion; the first protruding portion protrudes toward the second protruding portion; the second protruding portion protrudes toward the first protruding portion; the first zone includes a first facing region in which the first protruding portion and the second protruding portion are disposed so as to face and be adjacent to each other; the second heater element includes multiple zones; the multiple zones of the second heater element include a second zone; the second zone includes a second heater line emitting heat by allowing a current to flow, and a third power feeding portion and a fourth power feeding portion feeding power to the second heater line; the second zone includes a central region and an outer peripheral region; the central region is positioned at a center of the second zone when viewed along a Z-direction perpendicular to the first major surface; the outer peripheral region is positioned outside the central region when viewed along the Z-direction; and the first facing region is located at a position where the first facing region overlaps the central region in the Z-direction.

When the number of zones of the heater unit is increased to increase the uniformity of the in-plane temperature distribution of the process object, the number of power feeding portions and the like for feeding power to the zones is increased. When the number of power feeding portions and the like is increased, the number of protruding portions provided in the heater line also is increased to avoid the power feeding portions and the like. Normally, current flows over the shortest distance, so when a current flows in the protruding portion of the heater line, the current flows more easily at the inner side of the protruding portion than at the outer side of the protruding portion. Accordingly, the generated heat amount is likely to be less at the outer side of the protruding portion than at the inner side of the protruding portion. That is, the protruding portions are likely to become cool spots. To increase the uniformity of the in-plane temperature distribution of the heater unit, for example, it may be considered to dispose the protruding portions so as to be dispersed in the heater unit plane. However, when the protruding portions are disposed so as to be dispersed in the heater unit plane, there is a risk that temperature control may become complex due to the dispersion of the cool spots. On the other hand, when the protruding portions are disposed so as to be aggregated in the heater unit plane, there is a risk that the uniformity of the in-plane temperature distribution of the heater unit may degrade due to the reduction of the temperatures at the cool spots. In contrast, according to the electrostatic chuck, the first facing region of the first zone in which the first protruding portion and the second protruding portion are disposed so as to face and be adjacent to each other (i.e., the protruding portions are aggregated) is located at a position where the first facing region overlaps the central region, which is likely to have a higher temperature than the outer peripheral region in a second zone. Accordingly, a drastic reduction of the temperatures at the cool spots can be suppressed by suppressing the dispersion of the cool spots and by setting the first facing region of the first zone, i.e., the cool spot, so as to overlap the central region of the second zone, i.e., the hotspot. That is, the temperature unevenness can be canceled. Accordingly, the uniformity of the in-plane temperature distribution of the process object can be increased while suppressing complex temperature control.

A second invention is an electrostatic chuck including a ceramic dielectric substrate, a base plate supporting the ceramic dielectric substrate, and a heater unit heating the ceramic dielectric substrate; the ceramic dielectric substrate has a first major surface configured to have a process object placed thereon, and a second major surface opposite to the first major surface; the base plate has an upper surface at the ceramic dielectric substrate side and a lower surface opposite to the upper surface; the heater unit includes a first heater element; the first heater element is located between the first major surface and the upper surface; the first heater element includes multiple zones; the multiple zones of the first heater element include a first zone; the first zone includes a first heater line emitting heat by allowing a current to flow, and a first power feeding portion and a second power feeding portion feeding power to the first heater line; the first heater line includes multiple extension portions and multiple protruding portions; the multiple extension portions extend along a first direction and are arranged in a second direction perpendicular to the first direction; the multiple protruding portions are provided in the multiple extension portions and protrude in the second direction; the multiple extension portions include a first extension portion and a second extension portion; the multiple protruding portions include a first protruding portion provided in the first extension portion, and a second protruding portion provided in the second extension portion; the first protruding portion protrudes toward the second protruding portion; the second protruding portion protrudes toward the first protruding portion; the first zone includes a first facing region in which the first protruding portion and the second protruding portion are disposed so as to face and be adjacent to each other; the first zone includes a central region and an outer peripheral region; the central region is positioned at a center of the first zone when viewed along a Z-direction perpendicular to the first major surface; the outer peripheral region is positioned outside the central region when viewed along the Z-direction; and the first facing region is located in the central region.

When the number of zones of the heater unit is increased to increase the uniformity of the in-plane temperature distribution of the process object, the number of power feeding portions and the like for feeding power to the zones is increased. When the number of power feeding portions and the like is increased, the number of protruding portions provided in the heater line also is increased to avoid the power feeding portions and the like. Normally, current flows over the shortest distance, so when a current flows in the protruding portion of the heater line, the current flows more easily at the inner side of the protruding portion than at the outer side of the protruding portion. Accordingly, the generated heat amount is likely to be less at the outer side of the protruding portion than at the inner side of the protruding portion. That is, the protruding portions are likely to become cool spots. To increase the uniformity of the in-plane temperature distribution of the heater unit, for example, it may be considered to dispose the protruding portions so as to be dispersed in the heater unit plane. However, when the protruding portions are disposed so as to be dispersed in the heater unit plane, there is a risk that temperature control may become complex due to the dispersion of the cool spots. On the other hand, when the protruding portions are disposed so as to be aggregated in the heater unit plane, there is a risk that the uniformity of the in-plane temperature distribution of the heater unit may degrade due to the reduction of the temperatures at the cool spots. In contrast, according to the electrostatic chuck, the first facing region of the first zone in which the first protruding portion and the second protruding portion are disposed so as to face and be adjacent to each other (i.e., the protruding portions are aggregated) is located in the central region, which is likely to have a higher temperature than the outer peripheral region in the first zone. Accordingly, a drastic reduction of the temperatures at the cool spots can be suppressed by suppressing the dispersion of the cool spots and by providing the first facing region of the first zone, i.e., the cool spot, in the central region of the first zone, i.e., the hotspot. That is, the temperature unevenness can be canceled. Accordingly, the uniformity of the in-plane temperature distribution of the process object can be increased while suppressing complex temperature control.

A third invention is an electrostatic chuck including a ceramic dielectric substrate, a base plate supporting the ceramic dielectric substrate, and a heater unit heating the ceramic dielectric substrate; the ceramic dielectric substrate has a first major surface configured to have a process object placed thereon, and a second major surface opposite to the first major surface; the base plate has an upper surface at the ceramic dielectric substrate side and a lower surface opposite to the upper surface; the heater unit includes a first heater element; the first heater element is located between the first major surface and the upper surface; the first heater element includes multiple zones divided in a radial direction; the multiple zones of the first heater element include a first zone; the first zone includes a first heater line emitting heat by allowing a current to flow, and a first power feeding portion and a second power feeding portion feeding power to the first heater line; the first heater line includes multiple extension portions and multiple protruding portions; the multiple extension portions extend along a first direction and are arranged in a second direction perpendicular to the first direction; the multiple protruding portions are provided in the multiple extension portions and protrude in the second direction; the multiple extension portions includes a first extension portion and a second extension portion; the multiple protruding portions include a first protruding portion provided in the first extension portion, and a second protruding portion provided in the second extension portion; the first protruding portion protrudes toward the second protruding portion; the second protruding portion protrudes toward the first protruding portion; the first zone includes a first facing region in which the first protruding portion and the second protruding portion are disposed so as to face and be adjacent to each other; the first zone includes an outer circumference edge of the first heater element; the first zone includes an inner circumference portion and an outer circumference portion; the inner circumference portion is positioned radially inward of a center line of the radial direction; the center line of the radial direction bisects the first zone in the radial direction; the outer circumference portion includes the outer circumference edge and is positioned radially outward of the center line of the radial direction; and the first facing region is located in the inner circumference portion.

When the number of zones of the heater unit is increased to increase the uniformity of the in-plane temperature distribution of the process object, the number of power feeding portions and the like for feeding power to the zones is increased. When the number of power feeding portions and the like is increased, the number of protruding portions provided in the heater line also is increased to avoid the power feeding portions and the like. Normally, current flows over the shortest distance, so when a current flows in the protruding portion of the heater line, the current flows more easily at the inner side of the protruding portion than at the outer side of the protruding portion. Accordingly, the generated heat amount is likely to be less at the outer side of the protruding portion than at the inner side of the protruding portion. That is, the protruding portions are likely to become cool spots. To increase the uniformity of the in-plane temperature distribution of the heater unit, for example, it may be considered to dispose the protruding portions so as to be dispersed in the heater unit plane. However, when the protruding portions are disposed so as to be dispersed in the heater unit plane, there is a risk that temperature control may become complex due to the dispersion of the cool spots. On the other hand, when the protruding portions are disposed so as to be aggregated in the heater unit plane, there is a risk that the uniformity of the in-plane temperature distribution of the heater unit may degrade due to the reduction of the temperatures at the cool spots. The outermost circumference portion of the process object is likely to have a lower temperature than the inner portion. In contrast, according to the electrostatic chuck, when the first zone includes the outer circumference edge of the first heater element (i.e., the first zone is positioned at the outermost circumference portion of the first heater element), the first facing region of the first zone in which the first protruding portion and the second protruding portion are disposed so as to face and be adjacent to each other (i.e., the protruding portions are aggregated) is located in the inner circumference portion of the first zone, which is likely to have a higher temperature than the outer circumference portion of the first zone. Accordingly, a drastic reduction of the temperatures at the cool spots can be suppressed by suppressing the dispersion of the cool spots and by providing the first facing region of the first zone, i.e., the cool spot, in the inner circumference portion of the first zone, i.e., the hotspot. That is, the temperature unevenness can be canceled. Accordingly, the uniformity of the in-plane temperature distribution of the process object can be increased while suppressing complex temperature control.

A fourth invention is the electrostatic chuck of any one of the first to third inventions, wherein the multiple zones of the first heater element are divided in a radial direction, and the first direction is a circumferential direction.

According to the electrostatic chuck, the control of the in-plane temperature of the process object can be efficiently performed.

A fifth invention is the electrostatic chuck of any one of the first to third inventions, wherein the multiple zones of the first heater element are divided in a radial direction, and the first direction is the radial direction.

According to the electrostatic chuck, the control of the in-plane temperature of the process object can be efficiently performed.

A sixth invention is the electrostatic chuck of any one of the first to third inventions, wherein the multiple extension portions further include a third extension portion positioned between the first extension portion and the second extension portion in the second direction, and the third extension portion is located at a position where the third extension portion does not overlap the first and second protruding portions in the second direction.

The first protruding portion and the second protruding portion are disposed so as to face and be adjacent to each other. Therefore, there are cases where the shortest distance between the first extension portion and the second extension portion is greater than the shortest distance when the first protruding portion and the second protruding portion are not formed.

According to the electrostatic chuck, the area of the first facing region can be relatively small because the third extension portion is disposed between the first extension portion and the second extension portion at a position where the third extension portion does not overlap the first and second protruding portions. Accordingly, the uniformity of the in-plane temperature distribution of the process object can be increased.

A seventh invention is the electrostatic chuck of any one of the first to third inventions, wherein the multiple protruding portions further include a third protruding portion that is located in the first extension portion and protrudes toward the second protruding portion; and the third protruding portion is disposed so as to face and be adjacent to the second protruding portion.

According to the electrostatic chuck, the number of cool spots in the entire plane can be relatively low by disposing a region (a second facing region) in which the second protruding portion and the third protruding portion are aggregated proximate to the first facing region. Accordingly, the uniformity of the in-plane temperature distribution of the process object can be increased while suppressing complex temperature control.

An eighth invention is an electrostatic chuck including a ceramic dielectric substrate, a base plate supporting the ceramic dielectric substrate, and a heater unit heating the ceramic dielectric substrate; the ceramic dielectric substrate has a first major surface configured to have a process object placed thereon, and a second major surface opposite to the first major surface; the base plate has an upper surface at the ceramic dielectric substrate side and a lower surface opposite to the upper surface; the heater unit includes a first heater element; the first heater element is located between the first major surface and the upper surface; the first heater element includes multiple zones; the multiple zones of the first heater element include a first zone; the first zone includes a first heater line emitting heat by allowing a current to flow, and a first power feeding portion and a second power feeding portion feeding power to the first heater line; the first heater line includes a first protruding portion and a second protruding portion that are curved; a curve direction of the first protruding portion is the opposite of a curve direction of the second protruding portion; the first zone includes a first facing region in which the first protruding portion and the second protruding portion are disposed so as to face and be adjacent to each other; the first zone includes a central region and an outer peripheral region; the central region is positioned at a center of the first zone when viewed along a Z-direction perpendicular to the first major surface; the outer peripheral region is positioned outside the central region when viewed along the Z-direction; and the first facing region is located in the central region.

When the number of zones of the heater unit is increased to increase the uniformity of the in-plane temperature distribution of the process object, the number of power feeding portions and the like for feeding power to the zones is increased. When the number of the power feeding portions and the like is increased, the number of protruding portions provided in the heater line to avoid the power feeding portions and the like also is increased. Normally, current flows over the shortest distance, so when a current flows in the protruding portion of the heater line, the current flows more easily at the inner side of the protruding portion than at the outer side of the protruding portion. Accordingly, the generated heat amount is likely to be less at the outer side of the protruding portion than at the inner side of the protruding portion. That is, the protruding portions are likely to become cool spots. To increase the uniformity of the in-plane temperature distribution of the heater unit, for example, it may be considered to dispose the protruding portions so as to be dispersed in the heater unit plane. However, when the protruding portions are disposed so as to be dispersed in the heater unit plane, there is a risk that temperature control may become complex due to the dispersion of the cool spots. On the other hand, when the protruding portions are disposed so as to be aggregated in the heater unit plane, there is a risk that the uniformity of the in-plane temperature distribution of the heater unit may degrade due to the reduction of the temperatures at the cool spots. In contrast, according to the electrostatic chuck, the first facing region of the first zone in which the first protruding portion and the second protruding portion are disposed so as to face and be adjacent to each other (i.e., the protruding portions are aggregated) is located in the central region, which is likely to have a higher temperature than the outer peripheral region of the first zone. Accordingly, a drastic reduction of the temperatures at the cool spots can be suppressed by suppressing the dispersion of the cool spots and by providing the first facing region of the first zone, i.e., the cool spot, in the central region of the first zone, i.e., the hotspot. That is, the temperature unevenness can be canceled. Accordingly, the uniformity of the in-plane temperature distribution of the process object can be increased while suppressing complex temperature control.

A ninth invention is an electrostatic chuck including a ceramic dielectric substrate, a base plate supporting the ceramic dielectric substrate, and a heater unit heating the ceramic dielectric substrate; the ceramic dielectric substrate has a first major surface configured to have a process object placed thereon, and a second major surface opposite to the first major surface; the base plate has an upper surface at the ceramic dielectric substrate side and a lower surface opposite to the upper surface, and includes a coolant flow path for allowing a cooling medium to flow; the heater unit includes a first heater element, a bypass layer, and a first power feeding terminal and a second power feeding terminal electrically connected to the bypass layer; the bypass layer is a power feeding path to the first heater element; the first heater element is located between the first major surface and the upper surface; the first heater element includes multiple zones; the multiple zones of the first heater element include a first zone; the first zone includes a first heater line emitting heat by allowing a current to flow, and a first power feeding portion and a second power feeding portion feeding power to the first heater line; the first power feeding portion is electrically connected to the first power feeding terminal via the bypass layer, and is located at a position where the first power feeding portion does not overlap the first power feeding terminal in a Z-direction perpendicular to the first major surface; the second power feeding portion is electrically connected to the second power feeding terminal via the bypass layer, and is located at a position where the second power feeding portion does not overlap the second power feeding terminal in the Z-direction; the first heater line includes multiple extension portions and multiple protruding portions; the multiple extension portions extend along a first direction and are arranged in a second direction perpendicular to the first direction; the multiple protruding portions are provided in the multiple extension portions and protrude in the second direction; the multiple extension portions include a first extension portion and a second extension portion; the multiple protruding portions include a first protruding portion provided in the first extension portion, and a second protruding portion provided in the second extension portion; the first protruding portion protrudes toward the second protruding portion; the second protruding portion protrudes toward the first protruding portion; the first zone includes a first facing region in which the first protruding portion and the second protruding portion are disposed so as to face and be adjacent to each other; and the first facing region is located at a position where the first facing region overlaps at least one of the first power feeding terminal or the second power feeding terminal in the Z-direction.

When the number of zones of the heater unit is increased to increase the uniformity of the in-plane temperature distribution of the process object, the number of power feeding portions and the like for feeding power to the zones is increased. When the number of the power feeding portions and the like is increased, the number of protruding portions provided in the heater line to avoid the power feeding portions and the like also is increased. Normally, current flows over the shortest distance, so when a current flows in the protruding portion of the heater line, the current flows more easily at the inner side of the protruding portion than at the outer side of the protruding portion. Accordingly, the generated heat amount is likely to be less at the outer side of the protruding portion than at the inner side of the protruding portion. That is, the protruding portions are likely to become cool spots. To increase the uniformity of the in-plane temperature distribution of the heater unit, for example, it may be considered to dispose the protruding portions so as to be dispersed in the heater unit plane. However, when the protruding portions are disposed so as to be dispersed in the heater unit plane, there is a risk that temperature control may become complex due to the dispersion of the cool spots. On the other hand, when the protruding portions are disposed so as to be aggregated in the heater unit plane, there is a risk that the uniformity of the in-plane temperature distribution of the heater unit may degrade due to the reduction of the temperatures at the cool spots. Even when the coolant flow path for allowing the cooling medium to flow is provided inside the base plate, the coolant flow path is not provided at the position at which the power feeding terminal for feeding power to the bypass layer is located. Therefore, the position at which the power feeding terminal is located is difficult to cool compared to the other positions and is likely to become a hotspot. In contrast, according to the electrostatic chuck, the first facing region of the first zone in which the first protruding portion and the second protruding portion are disposed so as to face and be adjacent to each other (i.e., the protruding portions are aggregated) is located at a position where the first facing region overlaps at least one of the first power feeding terminal or the second power feeding terminal. Accordingly, a drastic reduction of the temperatures at the cool spots can be suppressed by suppressing the dispersion of the cool spots and by setting the first facing region of the first zone, i.e., the cool spot, so as to overlap the first power feeding terminal and/or the second power feeding terminal, i.e., the hotspots. That is, the temperature unevenness can be canceled. Accordingly, the uniformity of the in-plane temperature distribution of the process object can be increased while suppressing complex temperature control.

A tenth invention is the electrostatic chuck of the ninth invention, wherein the first zone includes a central region and an outer peripheral region; the central region is positioned at a center of the first zone when viewed along the Z-direction; the outer peripheral region is positioned outside the central region when viewed along the Z-direction; and the first facing region is located in the central region.

According to the electrostatic chuck, the first facing region of the first zone is located in the central region that is likely to have a higher temperature than the outer peripheral region in the first zone. Accordingly, a drastic reduction of the temperatures at the cool spots can be suppressed by setting the first facing region of the first zone, i.e., the cool spot, so as to overlap the central region of the first zone, i.e., the hotspot. That is, the temperature unevenness can be canceled. Accordingly, the uniformity of the in-plane temperature distribution of the process object can be increased while suppressing complex temperature control.

An eleventh invention is the electrostatic chuck of the ninth invention, wherein the multiple zones of the first heater element are divided in a radial direction; and the first direction is a circumferential direction.

According to the electrostatic chuck, the control of the in-plane temperature of the process object can be efficiently performed.

A twelfth invention is the electrostatic chuck of the ninth invention, wherein the multiple zones of the first heater element are divided in a radial direction; and the first direction is the radial direction.

According to the electrostatic chuck, the control of the in-plane temperature of the process object can be efficiently performed.

A thirteenth invention is the electrostatic chuck of any one of the ninth to twelfth inventions, wherein the multiple extension portions further include a third extension portion positioned between the first extension portion and the second extension portion in the second direction; and the third extension portion is located at a position where the third extension portion does not overlap the first and second protruding portions in the second direction.

The first protruding portion and the second protruding portion are disposed so as to face and be adjacent to each other. Therefore, there are cases where the shortest distance between the first extension portion and the second extension portion is greater than the shortest distance when the first protruding portion and the second protruding portion are not formed.

According to the electrostatic chuck, the area of the first facing region can be relatively small because the third extension portion is disposed between the first extension portion and the second extension portion at a position where the third extension portion does not overlap the first and second protruding portions. Accordingly, the uniformity of the in-plane temperature distribution of the process object can be increased.

A fourteenth invention is the electrostatic chuck of any one of the ninth to twelfth inventions, wherein the multiple protruding portions further include a third protruding portion that is located in the first extension portion and protrudes toward the second protruding portion; and the third protruding portion is disposed so as to face and be adjacent to the second protruding portion.

According to the electrostatic chuck, the number of cool spots in the entire plane can be relatively low by disposing a region (the second facing region) in which the second protruding portion and the third protruding portion are aggregated proximate to the first facing region. Accordingly, the uniformity of the in-plane temperature distribution of the process object can be increased while suppressing complex temperature control.

A fifteenth invention is an electrostatic chuck including a ceramic dielectric substrate, a base plate supporting the ceramic dielectric substrate, and a heater unit heating the ceramic dielectric substrate; the ceramic dielectric substrate has a first major surface configured to have a process object placed thereon, and a second major surface opposite to the first major surface; the base plate has an upper surface at the ceramic dielectric substrate side and a lower surface opposite to the upper surface, and includes a coolant flow path for allowing a cooling medium to flow; the heater unit includes a first heater element, a second heater element, a bypass layer, and first to fourth power feeding terminals electrically connected to the bypass layer; the bypass layer is a power feeding path to the first and second heater elements; the first heater element is located between the first major surface and the upper surface; the second heater element is located between the first major surface and the first heater element or between the first heater element and the upper surface; the first heater element includes multiple zones; the multiple zones of the first heater element include a first zone; the first zone includes a first heater line emitting heat by allowing a current to flow, and a first power feeding portion and a second power feeding portion feeding power to the first heater line; the first power feeding portion is electrically connected to the first power feeding terminal via the bypass layer and is located at a position where the first power feeding portion does not overlap the first power feeding terminal in a Z-direction perpendicular to the first major surface; the second power feeding portion is electrically connected to the second power feeding terminal via the bypass layer and is located at a position where the second power feeding portion does not overlap the second power feeding terminal in the Z-direction; the second heater element includes multiple zones; the multiple zones of the second heater element include a second zone; the second zone includes a second heater line emitting heat by allowing a current to flow, and a third power feeding portion and a fourth power feeding portion feeding power to the second heater line; the third power feeding portion is electrically connected to the third power feeding terminal via the bypass layer and is located at a position where the third power feeding portion does not overlap the third power feeding terminal in the Z-direction; the fourth power feeding portion is electrically connected to the fourth power feeding terminal via the bypass layer and is located at a position where the fourth power feeding portion does not overlap the fourth power feeding terminal in the Z-direction; at least one of the third power feeding terminal or the fourth power feeding terminal is located at a position where the at least one of the third power feeding terminal or the fourth power feeding terminal overlaps a virtual line segment in the Z-direction; and the virtual line segment connects a center of the first power feeding portion and a center of the second power feeding portion.

When the number of zones of the heater unit is increased to increase the uniformity of the in-plane temperature distribution of the process object, the number of power feeding portions and the like for feeding power to the zones is increased. The power feeding portions are likely to become cool spots. On the other hand, even when the coolant flow path for allowing the cooling medium to flow is provided inside the base plate, the coolant flow path is not provided at the position at which the power feeding terminal for feeding power to the bypass layer is located. Therefore, the position at which the power feeding terminal is located is difficult to cool compared to the other positions, and is likely to become a hotspot. In contrast, according to the electrostatic chuck, at least one of the third power feeding terminal or the fourth power feeding terminal for feeding power to the second heater element via the bypass layer is located at a position where the at least one of the third power feeding terminal or the fourth power feeding terminal overlaps a virtual line segment connecting the center of the first power feeding portion and the center of the second power feeding portion that feed power to the first heater line. Accordingly, the temperature unevenness can be canceled by providing the third and fourth power feeding terminals, i.e., the hotspots, between the first power feeding portion and the second power feeding portion, i.e., the cool spots. Accordingly, the uniformity of the in-plane temperature distribution of the process object can be increased while suppressing complex temperature control.

A sixteenth invention is the electrostatic chuck of the fifteenth invention, wherein at least one of a center of the third power feeding terminal or a center of the fourth power feeding terminal is located at a position overlapping the virtual line segment.

According to the electrostatic chuck, the third power feeding terminal and the fourth power feeding terminal are located at positions such that at least one of the center of the third power feeding terminal or the center of the fourth power feeding terminal overlaps the virtual line segment. The uniformity of the in-plane temperature distribution of the process object can be increased thereby.

A seventeenth invention is the electrostatic chuck of the fifteenth or the sixteenth invention, wherein the first zone includes a central region and an outer peripheral region; the central region is positioned at a center of the first zone when viewed along the Z-direction; the outer peripheral region is positioned outside the central region when viewed along the Z-direction; and at least one of the first power feeding portion or the second power feeding portion is located in the central region.

According to the electrostatic chuck, at least one of the first power feeding portion or the second power feeding portion is located in the central region, which is likely to have a higher temperature than the outer peripheral region in the first zone. Accordingly, a drastic reduction of the temperatures at the cool spots can be suppressed by disposing the first power feeding portion and/or the second power feeding portion, i.e., the cool spots, so as to overlap the central region of the first zone, i.e., the hotspot. That is, the temperature unevenness can be canceled. Accordingly, the uniformity of the in-plane temperature distribution of the process object can be increased.

An eighteenth invention is the electrostatic chuck of the fifteenth or the sixteenth invention, wherein the first zone includes an outer circumference edge of the first heater element; the first zone includes an inner circumference portion and an outer circumference portion; the inner circumference portion is positioned radially inward of a center line of a radial direction; the center line of the radial direction bisects the first zone in the radial direction; the outer circumference portion includes the outer circumference edge and is positioned radially outward of the center line of the radial direction; and at least one of the first power feeding portion or the second power feeding portion is located in the inner circumference portion.

According to the electrostatic chuck, when the first zone includes the outer circumference edge of the first heater element (i.e., the first zone is positioned at the outermost circumference portion of the first heater element), at least one of the first power feeding portion or the second power feeding portion is located in the inner circumference portion, which is likely to have a higher temperature than the outer circumference portion in the first zone. Accordingly, a drastic reduction of the temperatures at the cool spots can be suppressed by providing the first power feeding portion and/or the second power feeding portion, i.e., the cool spots, in the inner circumference portion of the first zone, i.e., the hotspot. That is, the temperature unevenness can be canceled. Accordingly, the uniformity of the in-plane temperature distribution of the process object can be increased.

Hereinafter, embodiments of the invention will be described with reference to the drawings. It is noted that, in each figure, similar components are denoted by the same reference numerals, and detailed description thereof will be omitted as appropriate.

FIG. 1 is a perspective view schematically illustrating an electrostatic chuck according to an embodiment.

Figure 2A:
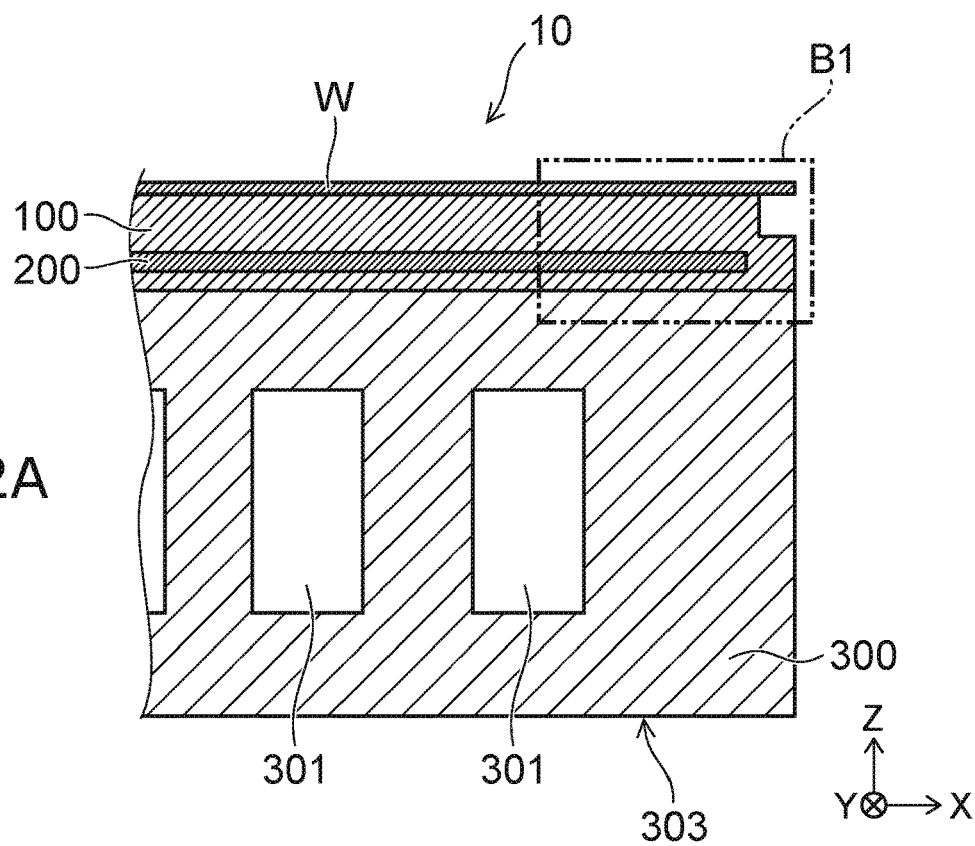
FIGS. 2A and 2B are cross-sectional views schematically illustrating portions of the electrostatic chuck according to the embodiment.
Figure 2B:
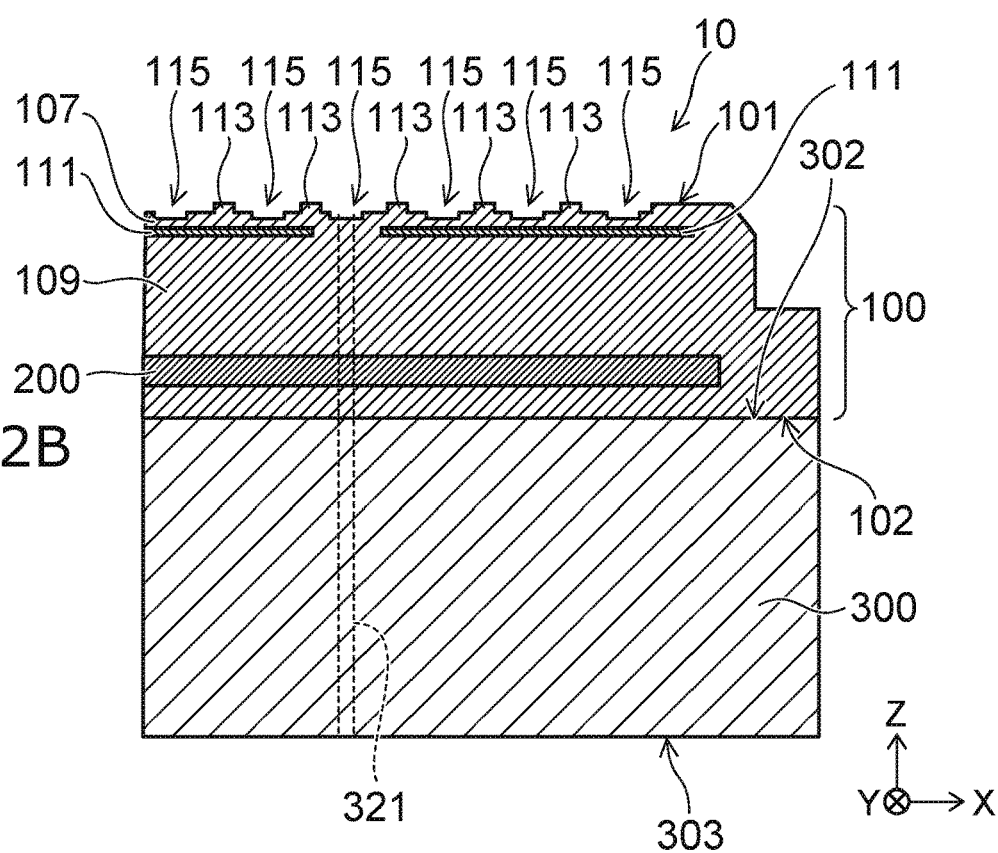

FIGS. 2A and 2B are cross-sectional views schematically illustrating portions of the electrostatic chuck according to the embodiment. For convenience of description in FIG. 1, a cross-sectional view is illustrated in a portion of the electrostatic chuck.

FIG. 2A is a cross-sectional view along line A1-A2 shown in FIG. 1.

FIG. 2B is an enlarged view of region B1 shown in FIG. 2A. A process object W is not illustrated in FIG. 2B.

As illustrated in FIGS. 1, 2A, and 2B, the electrostatic chuck 10 according to the embodiment includes a ceramic dielectric substrate 100, a heater unit 200, and a base plate 300.

The ceramic dielectric substrate 100 is, for example, a flat plate-shaped base material made of a polycrystalline ceramic sintered body and has a first major surface 101 on which a process object W such as a semiconductor wafer is mounted and a second major surface 102 which is a side opposite to the first major surface 101.

In the specification, the direction perpendicular to the first major surface 101 is defined as a Z-direction. In other words, the Z-direction is a direction connecting the first major surface 101 and the second major surface 102. In other words, the Z-direction is a direction from the base plate 300 toward the ceramic dielectric substrate 100. One of the directions orthogonal to the Z-direction is defined as an X-direction, and the direction orthogonal to the Z-direction and the X-direction is defined as a Y-direction. In the specification, "in-plane" denotes, for example, in an XY plane. In the specification, "plan view" indicates a state viewed along the Z-direction.

For example, $Al_2O_3$, AlN, SiC, $Y_2O_3$, YAG, etc., are examples of the material of the crystal included in the ceramic dielectric substrate 100. By using such a material, the infrared transmissivity, thermal conductivity, insulation resistance, and plasma resistance of the ceramic dielectric substrate 100 can be increased.

An electrode layer 111 is provided inside the ceramic dielectric substrate 100. The electrode layer 111 is interposed between the first major surface 101 and the second major surface 102. That is, the electrode layer 111 is formed so as to be inserted into the ceramic dielectric substrate 100. The electrode layer 111 is integrally sintered on the ceramic dielectric substrate 100.

The electrode layer 111 is not limited to being interposed between the first major surface 101 and the second major surface 102, and the electrode layer 111 may be attached to the second major surface 102.

The electrostatic chuck 10 generates charges on the first major surface 101 side of the electrode layer 111 by applying a clamping voltage to the electrode layer 111 and clamps the process object W by the electrostatic force.

The electrode layer 111 is provided along the first major surface 101 and the second major surface 102. The electrode layer 111 is a clamping electrode for clamping the process object W. The electrode layer 111 may be of a unipolar type or a bipolar type. The electrode layer 111 may be of a tripolar type or of a multipolar type. The number of electrode layers 111 and the arrangement of the electrode layers 111 are appropriately selected.

The base plate 300 is located at the second major surface 102 side of the ceramic dielectric substrate 100 and supports the ceramic dielectric substrate 100. The base plate 300 has an upper surface 302 at the ceramic dielectric substrate 100 side, and a lower surface 303 opposite to the upper surface 302. A coolant flow path 301 for allowing a cooling medium to flow is provided in the base plate 300. That is, the coolant flow path 301 is located inside the base plate 300. For example, aluminum, aluminum alloys, titanium, and titanium alloys are examples of the material of the base plate 300.

The base plate 300 performs the role of temperature adjustment of the ceramic dielectric substrate 100. For example, when cooling the ceramic dielectric substrate 100, a cooling medium is caused to flow into the coolant flow path 301, pass through the coolant flow path 301, and flow out of the coolant flow path 301. Accordingly, the heat of the base plate 300 is absorbed by the cooling medium; and the ceramic dielectric substrate 100 mounted on the base plate 300 can be cooled.

Convex portions 113 are provided on the first major surface 101 side of the ceramic dielectric substrate 100, as needed. Grooves 115 are provided between the adjacent convex portions 113. The grooves 115 communicate with each other. A space is formed between the grooves 115 and a back side of the process object W mounted on the electrostatic chuck 10.

An introduction path 321 penetrating the base plate 300 and the ceramic dielectric substrate 100 is connected to the groove 115. When a transfer gas such as helium (He) is introduced from the introduction path 321 in a state where the process object W is clamped and held, the transfer gas flows into the space provided between the process object W and the groove 115, and the process object W can be directly heated or cooled by the transfer gas.

The heater unit 200 heats the ceramic dielectric substrate 100. The heater unit 200 heats the process object W via the ceramic dielectric substrate 100 by heating the ceramic dielectric substrate 100. In the example, the heater unit 200 is located between the first major surface 101 and the second major surface 102. In other words, the heater unit 200 is formed so as to be inserted into the ceramic dielectric substrate 100. In other words, the heater unit 200 is embedded in the ceramic dielectric substrate 100.

The heater unit 200 may be located separately from the ceramic dielectric substrate 100. In such a case, for example, the heater unit 200 is located between the ceramic dielectric substrate 100 and the base plate 300 with an adhesive layer interposed. A heat-resistant resin that has a relatively high thermal conductivity such as silicone or the like is an example of the material of the adhesive layer.

Figure 3:
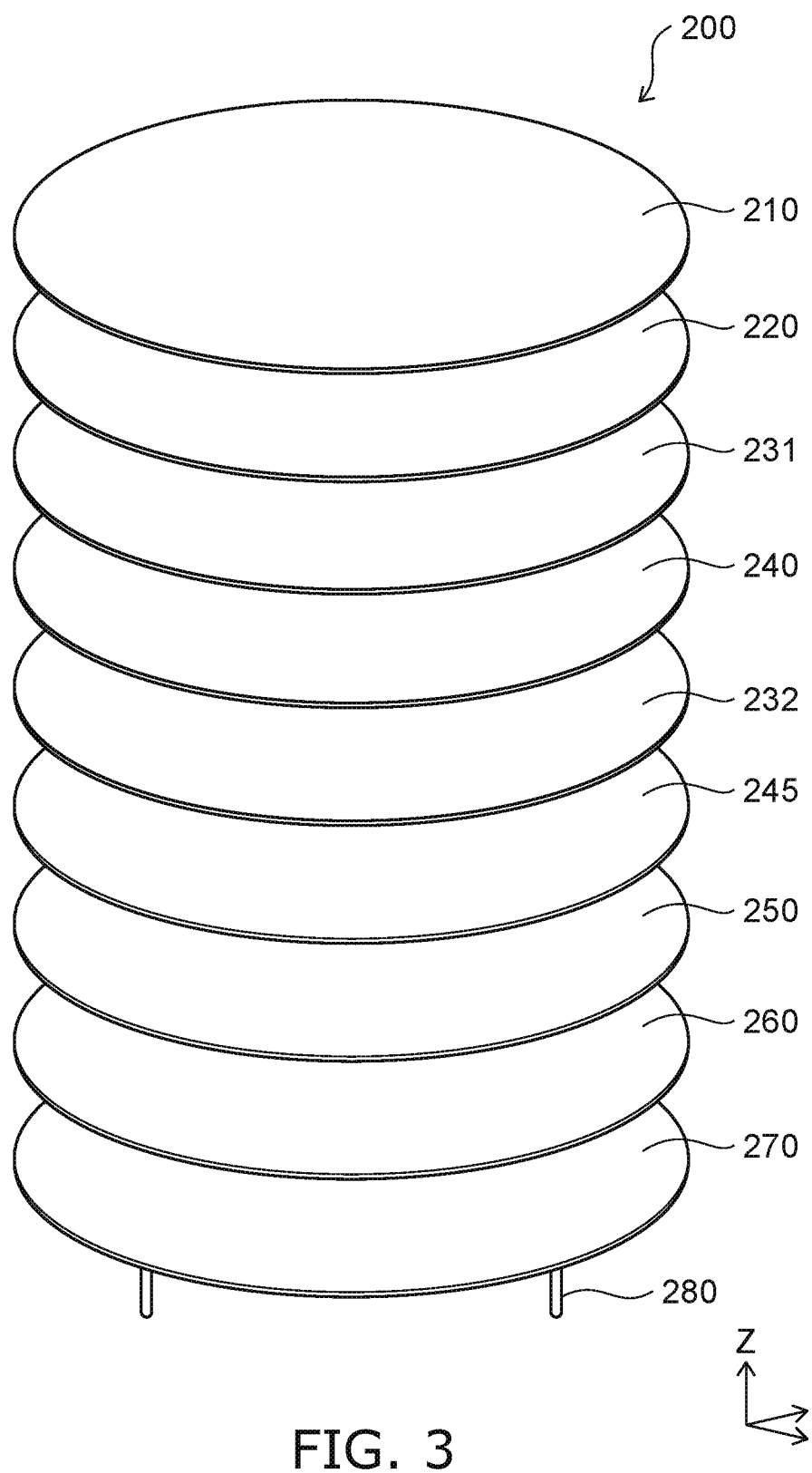
FIG. 3 is an exploded perspective view schematically illustrating the heater unit according to the embodiment.

FIG. 3 is an exploded perspective view schematically illustrating the heater unit according to the embodiment.

Figure 4:
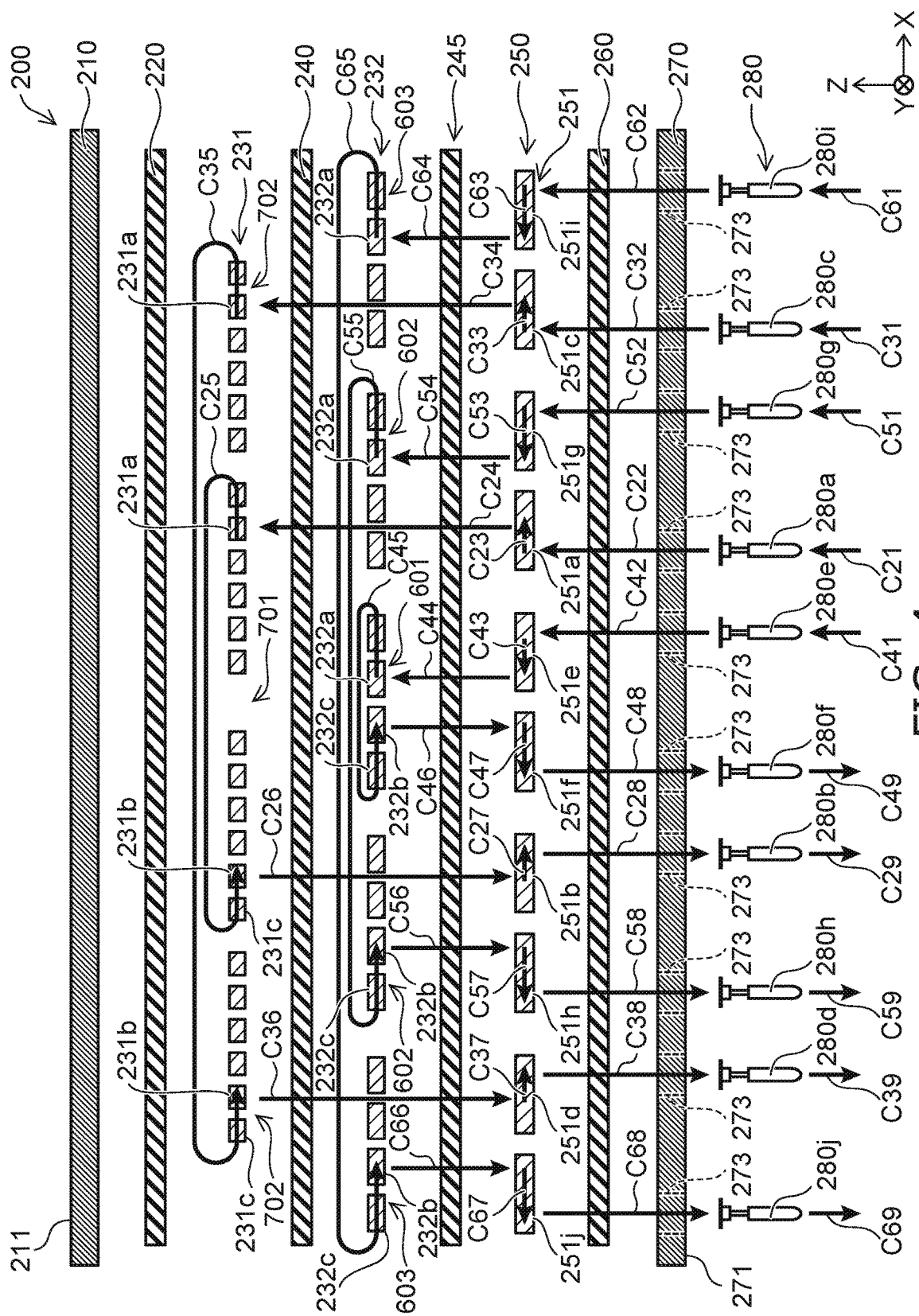
FIG. 4 is an exploded cross-sectional view schematically illustrating the heater unit according to the embodiment.

FIG. 4 is an exploded cross-sectional view schematically illustrating the heater unit according to the embodiment.

In the example as illustrated in FIGS. 3 and 4, the heater unit 200 includes a first support plate 210, a first insulating layer 220, a sub-heater element 231, a second insulating layer 240, a main heater element 232, a third insulating layer 245, a bypass layer 250, a fourth insulating layer 260, a second support plate 270, and a power feeding terminal 280.

The first support plate 210 is located on the sub-heater element 231, the main heater element 232, the bypass layer 250, etc. The second support plate 270 is located under the sub-heater element 231, the main heater element 232, the bypass layer 250, etc. A surface 211 (the upper surface) of the first support plate 210 is the upper surface of the heater unit 200. A surface 271 (the lower surface) of the second support plate 270 is the lower surface of the heater unit 200. When the heater unit 200 is embedded in the ceramic dielectric substrate 100, the first support plate 210 and the second support plate 270 may be omitted.

The first support plate 210 and the second support plate 270 are support plates supporting the sub-heater element 231, the main heater element 232, etc. In the example, the first support plate 210 and the second support plate 270 support the first insulating layer 220, the sub-heater element 231, the second insulating layer 240, the main heater element 232, the third insulating layer 245, the bypass layer 250, and the fourth insulating layer 260 with these components interposed.

The first insulating layer 220 is located between the first support plate 210 and the second support plate 270. The sub-heater element 231 is located between the first insulating layer 220 and the second support plate 270. Thus, the sub-heater element 231 is provided so as to overlap the first support plate 210. In other words, the first insulating layer 220 is located between the first support plate 210 and the sub-heater element 231. When the heater unit 200 is embedded in the ceramic dielectric substrate 100, the ceramic dielectric substrate 100 also serves as the first insulating layer 220.

The second insulating layer 240 is located between the sub-heater element 231 and the second support plate 270. The main heater element 232 is located between the second insulating layer 240 and the second support plate 270. Thus, the main heater element 232 is located in a different layer from the layer in which the sub-heater element 231 is located. At least a portion of the main heater element 232 overlaps the sub-heater element 231 in the Z-direction. The third insulating layer 245 is located between the main heater element 232 and the second support plate 270. The bypass layer 250 is located between the third insulating layer 245 and the second support plate 270. The fourth insulating layer 260 is located between the bypass layer 250 and the second support plate 270.

In other words, the sub-heater element 231 is located between the first insulating layer 220 and the second insulating layer 240. In other words, the main heater element 232 is located between the second insulating layer 240 and the third insulating layer 245. In other words, the bypass layer 250 is located between the third insulating layer 245 and the fourth insulating layer 260.

For example, the sub-heater element 231 contacts the first and second insulating layers 220 and 240. For example, the main heater element 232 contacts the second and third insulating layers 240 and 245. For example, the bypass layer 250 contacts the third and fourth insulating layers 245 and 260.

The bypass layer 250 and the fourth insulating layer 260 are provided as necessary and can be omitted. When the bypass layer 250 and the fourth insulating layer 260 are not provided, the third insulating layer 245 is in contact with the second support plate 270. Hereinafter, a case where the heater unit 200 includes the bypass layer 250 and the fourth insulating layer 260 will be described as an example.

The first support plate 210 has a relatively high thermal conductivity. For example, the thermal conductivity of the first support plate 210 is greater than the thermal conductivity of the sub-heater element 231 and greater than the thermal conductivity of the main heater element 232. For example, a metal that includes at least one of aluminum, copper, or nickel, graphite that has a multilayer structure, etc., are examples of the material of the first support plate 210. The thickness (the Z-direction length) of the first support plate 210 is, for example, not less than about 0.1 mm and not more than about 3.0 mm. More favorably, the thickness of the first support plate 210 is, for example, not less than about 0.3 mm and not more than about 1.0 mm. The first support plate 210 increases the uniformity of the in-plane temperature distribution of the heater unit 200. For example, the first support plate 210 functions as a soaking plate. The first support plate 210 suppresses the warp of the heater unit 200. The first support plate 210 increases the bonding strength between the heater unit 200 and the ceramic dielectric substrate 100.

The material, thickness, and function of the second support plate 270 are respectively the same as the material, thickness, and function of the first support plate 210. For example, the thermal conductivity of the second support plate 270 is greater than the thermal conductivity of the sub-heater element 231 and greater than the thermal conductivity of the main heater element 232. According to the embodiment, at least one of the first support plate 210 or the second support plate 270 may be omitted.

For example, an insulating material such as a resin, a ceramic, etc., can be used as the material of the first insulating layer 220. Polyimide, polyamideimide, etc., are examples when the first insulating layer 220 is a resin. $Al_2O_3$, AlN, SiC, $Y_2O_3$, YAG, etc., are examples when the first insulating layer 220 is a ceramic. The thickness (the Z-direction length) of the first insulating layer 220 is, for example, not less than about 0.01 mm and not more than about 0.20 mm. The first insulating layer 220 bonds the first support plate 210 and the sub-heater element 231. The first insulating layer 220 electrically insulates between the first support plate 210 and the sub-heater element 231. Thus, the first insulating layer 220 has an electrical insulation function and a surface bonding function. It is sufficient for the first insulating layer 220 to have at least an insulation function; and the first insulating layer 220 may have other functions such as, for example, a heat conduction function, a diffusion prevention function, etc.

The material and thickness of the second insulating layer 240 are about the same as the material and thickness of the first insulating layer 220, respectively. The material and thickness of the third insulating layer 245 are about the same as the material and thickness of the first insulating layer 220, respectively. The material and thickness of the fourth insulating layer 260 are about the same as the material and thickness of the first insulating layer 220, respectively.

The second insulating layer 240 bonds the sub-heater element 231 and the main heater element 232. The second insulating layer 240 electrically insulates between the sub-heater element 231 and the main heater element 232. Thus, the second insulating layer 240 has an electrical insulation function and a surface bonding function. It is sufficient for the second insulating layer 240 to have at least an insulation function; and the second insulating layer 240 may have other functions such as, for example, a heat conduction function, a diffusion prevention function, etc.

The third insulating layer 245 bonds the main heater element 232 and the bypass layer 250. The third insulating layer 245 electrically insulates between the main heater element 232 and the bypass layer 250. Thus, the third insulating layer 245 has an electrical insulation function and a surface bonding function. It is sufficient for the third insulating layer 245 to have at least an insulation function; and the third insulating layer 245 may have other functions such as, for example, a heat conduction function, a diffusion prevention function, etc.

The fourth insulating layer 260 bonds the bypass layer 250 and the second support plate 270. The fourth insulating layer 260 electrically insulates between the bypass layer 250 and the second support plate 270. Thus, the fourth insulating layer 260 has the electrical insulation function and the surface bonding function. The fourth insulating layer 260 may have at least an insulation function and may have other functions such as a heat conduction function and a diffusion prevention function.

When the sub-heater element 231 is located inside the ceramic dielectric substrate 100, for example, metals including at least one of titanium, chrome, nickel, copper, aluminum, molybdenum, tungsten, palladium, platinum, silver, tantalum, molybdenum carbide, or tungsten carbide, etc., are examples of the material of the sub-heater element 231. It is favorable for the material of the sub-heater element 231 to include a ceramic material and such a metal. Aluminum oxide ($Al_2O_3$), yttrium oxide ($Y_2O_3$), yttrium aluminum garnet (YAG ($Y_3Al_5O_{12}$)), aluminum nitride (AlN), silicon carbide (SiC), etc., are examples of ceramic materials. It is favorable for the ceramic material included in the sub-heater element 231 to be the same as the components of the ceramic dielectric substrate 100. When the sub-heater element 231 is located outside the ceramic dielectric substrate 100, for example, metals including at least one of stainless steel, titanium, chrome, nickel, copper, aluminum, Inconel (registered trademark), molybdenum, tungsten, palladium, platinum, silver, tantalum, molybdenum carbide, or tungsten carbide, etc., are examples of the material of the sub-heater element 231. The thickness (the Z-direction length) of the sub-heater element 231 is, for example, not less than about 0.01 mm and not more than about 0.20 mm. The material and thickness of the main heater element 232 are respectively similar to the material and thickness of the sub-heater element 231. For example, when the main heater element 232 is located inside the ceramic dielectric substrate 100, the same materials as the materials of the sub-heater element 231 when the sub-heater element 231 is located inside the ceramic dielectric substrate 100 are examples of the material of the main heater element 232. For example, when the main heater element 232 is located outside the ceramic dielectric substrate 100, the same materials as the materials of the sub-heater element 231 when the sub-heater element 231 is located outside the ceramic dielectric substrate 100 are examples of the material of the main heater element 232. For example, the sub-heater element 231 and the main heater element 232 each are electrically connected to the bypass layer 250. On the other hand, the sub-heater element 231 and the main heater element 232 each are electrically insulated from the first support plate 210 and the second support plate 270.

The sub-heater element 231 and the main heater element 232 each generate heat when a current flows. The sub-heater element 231 and the main heater element 232 heat the ceramic dielectric substrate 100 by emitting heat. For example, the sub-heater element 231 and the main heater element 232 make the in-plane temperature distribution of the process object W uniform by heating the process object W via the ceramic dielectric substrate 100. Or, for example, the sub-heater element 231 and the main heater element 232 also can intentionally cause a difference in the in-plane temperature of the process object W by heating the process object W via the ceramic dielectric substrate 100.

The bypass layer 250 is disposed substantially parallel to the first support plate 210 and substantially parallel to the second support plate 270. The bypass layer 250 includes multiple bypass portions 251. In the example, the bypass layer 250 includes ten bypass portions 251 (bypass portions 251a to 251j). The number of the bypass portions 251 is not limited to "ten". The bypass layer 250 has a plate shape.

The bypass layer 250 is, for example, electrically conductive. For example, the bypass layer 250 is electrically connected to the sub-heater element 231 and the main heater element 232. The bypass layer 250 is a power feeding path of the sub-heater element 231 and the main heater element 232. On the other hand, for example, the bypass layer 250 is electrically insulated from the first support plate 210 and the second support plate 270 by an insulating layer.

The thickness (length in the Z-direction) of the bypass layer 250 is, for example, not less than about 0.03 mm and not more than about 0.30 mm. The thickness of the bypass layer 250 is larger than that of the first insulating layer 220. The thickness of the bypass layer 250 is larger than that of the second insulating layer 240. The thickness of the bypass layer 250 is larger than that of the third insulating layer 245. The thickness of the bypass layer 250 is larger than that of the fourth insulating layer 260.

For example, when the bypass layer 250 is located outside the ceramic dielectric substrate 100, metals including at least one of stainless steel, titanium, chrome, nickel, copper, aluminum, Inconel (registered trademark), molybdenum, tungsten, palladium, platinum, silver, tantalum, molybdenum carbide, or tungsten carbide, etc., are examples of the material of the bypass layer 250. For example, when the heater unit 200 (the bypass layer 250, the sub-heater element 231, and the main heater element 232) is located inside the ceramic dielectric substrate 100, the material of the bypass layer 250 is the same as the material of the sub-heater element 231 and the main heater element 232. On the other hand, the thickness of the bypass layer 250 is greater than the thickness of the sub-heater element 231 and greater than the thickness of the main heater element 232. Therefore, the electrical resistance of the bypass layer 250 is less than the electrical resistance of the sub-heater element 231 and less than the electrical resistance of the main heater element 232. Heat generation by the bypass layer 250 in the manner of the sub-heater element 231 and the main heater element 232 can be suppressed thereby, even when the material of the bypass layer 250 is the same as the material of the sub-heater element 231 and the main heater element 232. That is, the electrical resistance of the bypass layer 250 can be reduced, and the generated heat amount of the bypass layer 250 can be reduced.

The technique of reducing the electrical resistance of the bypass layer 250 and reducing the generated heat amount of the bypass layer 250 may be realized by using a material having a relatively low volume resistivity instead of using the thickness of the bypass layer 250. In other words, the material of the bypass layer 250 may be a different material from the sub-heater element 231 and the main heater element 232. For example, metals including at least one of stainless steel, titanium, chrome, nickel, copper, aluminum, Inconel (registered trademark), molybdenum, tungsten, palladium, platinum, silver, tantalum, molybdenum carbide, or tungsten carbide, etc., are examples of the material of the bypass layer 250.

For example, when the bypass layer 250 is located inside the ceramic dielectric substrate 100, the same materials as the materials of the sub-heater element 231 when the sub-heater element 231 is located inside the ceramic dielectric substrate 100 are examples of the material of the bypass layer 250. For example, when the bypass layer 250 is located outside the ceramic dielectric substrate 100, the same materials as the materials of the sub-heater element 231 when the sub-heater element 231 is located outside the ceramic dielectric substrate 100 are examples of the material of the bypass layer 250.

The power feeding terminals 280 are electrically connected to the bypass layer 250. The power feeding terminals 280 are provided from the heater unit 200 toward the base plate 300 in the state in which the heater unit 200 is located between the base plate 300 and the ceramic dielectric substrate 100. The power feeding terminals 280 supply the power supplied from outside an electrostatic chuck 10 to the sub-heater element 231 and the main heater element 232 via the bypass layer 250. For example, the power feeding terminals 280 may be directly connected to the sub-heater element 231 and the main heater element 232. The bypass layer 250 is omissible thereby.

On the other hand, when the sub-heater element 231 and/or the main heater element 232 includes many zones, e.g., not less than 20, not less than 50, or not less than 100, it is difficult to dispose the power feeding terminals 280 corresponding to each zone. By providing the bypass layer 250, the layout degree of freedom of the power feeding terminals 280 is increased compared to when the power feeding terminals 280 are disposed for each zone.

The heater unit 200 includes multiple power feeding terminals 280. In the example, the heater unit 200 includes ten power feeding terminals 280 (power feeding terminals 280a to 280j). The number of the power feeding terminals 280 is not limited to "ten". One power feeding terminal 280 is electrically connected to one bypass portion 251. That is, the number of the power feeding terminals 280 is equal to the number of the bypass portions 251. A hole 273 penetrates the second support plate 270. The power feeding terminal 280 is electrically connected to the bypass portion 251 through the hole 273.

The sub-heater element 231 includes a first region 701 and a second region 702. Each of the first and second regions 701 and 702 includes a first sub-power feeding portion 231a, a second sub-power feeding portion 231b, and a sub-heater line 231c. The sub-heater line 231c is electrically connected to the first and second sub-power feeding portions 231a and 231b. The first sub-power feeding portion 231a is located at one end of the sub-heater line 231c; and the second sub-power feeding portion 231b is located at the other end of the sub-heater line 231c. The sub-heater line 231c generates heat by allowing a current to flow. The first sub-power feeding portion 231a and the second sub-power feeding portion 231b feed power to the sub-heater line 231c. The sub-heater element 231 is electrically connected to the bypass layer 250 at the first and second sub-power feeding portions 231a and 231b.

When power is supplied from outside the electrostatic chuck 10 to the power feeding terminal 280a as indicated by arrows C21 and C22 illustrated in FIG. 4, the current flows from the power feeding terminal 280a to the bypass portion 251a. As indicated by arrows C23 and C24 illustrated in FIG. 4, the current flowing to the bypass portion 251a flows from the bypass portion 251a to the first region 701 of the sub-heater element 231. As indicated by arrows C25 and C26 illustrated in FIG. 4, the current flowing to the first region 701 flows from the first region 701 to a bypass portion 251b. More specifically, the current flowing to the bypass portion 251a flows to the sub-heater line 231c of the first region 701 via the first sub-power feeding portion 231a of the first region 701, and flows to the bypass portion 251b via the second sub-power feeding portion 231b of the first region 701. As indicated by arrows C27 and C28 illustrated in FIG. 4, the current flowing to the bypass portion 251b flows from the bypass portion 251b to the power feeding terminal 280b. As indicated by arrow C29 illustrated in FIG. 4, the current flowing to the power feeding terminal 280b flows outside the electrostatic chuck 10.

Similarly, when power is supplied to the power feeding terminal 280c from outside the electrostatic chuck 10, the current flows in the order of the power feeding terminal 280c, the bypass portion 251c, the second region 702 of the sub-heater element 231, the bypass portion 251d, and the power feeding terminal 280d as indicated by arrows C31 to C39 illustrated in FIG. 4.

The main heater element 232 includes a main zone 601, a main zone 602, and a main zone 603. Each of the main zones 601 to 603 includes a first main power feeding portion 232a, a second main power feeding portion 232b, and a main heater line 232c. The main heater line 232c is electrically connected to the first and second main power feeding portions 232a and 232b. The first main power feeding portion 232a is located at one end of the main heater line 232c; and the second main power feeding portion 232b is located at the other end of the main heater line 232c. The main heater line 232c generates heat by allowing a current to flow. The first main power feeding portion 232a and the second main power feeding portion 232b feed power to the main heater line 232c. The main heater element 232 is electrically connected to the bypass layer 250 at the first and second main power feeding portions 232a and 232b.

As indicated by arrows C41 and C42 illustrated in FIG. 4, when power is supplied from outside the electrostatic chuck 10 to the power feeding terminal 280e, the current flows from the power feeding terminal 280e to the bypass portion 251e. As indicated by arrows C43 and C44 illustrated in FIG. 4, the current flowing to the bypass portion 251e flows from the bypass portion 251e to the main zone 601 of the main heater element 232. As indicated by arrows C45 and 426 illustrated in FIG. 4, the current flowing to the main zone 601 flows from the main zone 601 to the bypass portion 251f. More specifically, the current flowing to the bypass portion 251e flows to the main heater line 232c of the main zone 601 via the first main power feeding portion 232a of the main zone 601, and flows to the bypass portion 251f via the second main power feeding portion 232b of the main zone 601. As indicated by arrows C47 and C48 illustrated in FIG. 4, the current flowing to the bypass portion 251f flows to the power feeding terminal 280f from the bypass portion 251f. As indicated by arrow C49 illustrated in FIG. 4, the current flowing to the power feeding terminal 280f flows outside the electrostatic chuck 10.

Similarly, when power is supplied from outside the electrostatic chuck 10 to the power feeding terminal 280g, the current flows in the order of the power feeding terminal 280g, the bypass portion 251g, the main zone 602 of the main heater element 232, the bypass portion 251h, and the power feeding terminal 280h as indicated by arrows C51 to C59.

Similarly, when power is supplied from outside the electrostatic chuck 10 to the power feeding terminal 280i, the current flows in the order of the power feeding terminal 280i, the bypass portion 251i, the main zone 603 of the main heater element 232, the bypass portion 251j, and the power feeding terminal 280j as indicated by arrows C61 to C69.

For example, the current flowing in the sub-heater element 231 and the current flowing in the main heater element 232 are separately controlled. In the example, the bypass portions 251 (the bypass portions 251a, 251b, 251c, and 251d) connected to the sub-heater element 231 and the bypass portions 251 (the bypass portions 251e, 251f, 251g, 251h, 251i, and 251j) connected to the main heater element 232 are different from each other. The bypass portions 251 connected to the sub-heater element 231 and the bypass portions 251 connected to the main heater element 232 may be the same.

For example, the output of the sub-heater element 231 and the output of the main heater element 232 can be set to be different from each other by setting the voltage applied to the power feeding terminals 280 (the power feeding terminals 280a, 280b, 280c, and 280d) feeding power to the sub-heater element 231 and the voltage applied to the power feeding terminals 280 (the power feeding terminals 280e, 280f, 280g, 280h, 280i, and 280j) feeding power to the main heater element 232 to be different from each other. That is, the outputs of the heater elements can be controlled independently.

For example, the current flowing in the first region 701 of the sub-heater element 231 and the current flowing in the second region 702 are separately controlled. In the example, the bypass portions 251 (the bypass portions 251a and 251b) connected to the first region 701 and the bypass portions 251 (the bypass portions 251c and 251d) connected to the second region 702 are different from each other. The bypass portions 251 connected to the first region 701 and the bypass portions 251 connected to the second region 702 may be the same.

For example, the output of the first region 701 and the output of the second region 702 can be set to be different from each other by setting the voltage applied to the power feeding terminals 280 (the power feeding terminals 280a and 280b) feeding power to the first region 701 and the voltage applied to the power feeding terminals 280 (the power feeding terminals 280c and 280d) feeding power to the second region 702 to be different from each other. That is, the outputs of the regions (the sub-zones) can be controlled independently.

For example, the current flowing in the main zone 601 of the main heater element 232, the current flowing in the main zone 602, and the current flowing in the main zone 603 are separately controlled. In the example, the bypass portions 251 (the bypass portions 251e and 251f) connected to the main zone 601, the bypass portions 251 (the bypass portions 251g and 251h) connected to the main zone 602, and the bypass portions 251 (the bypass portions 251i and 251j) connected to the main zone 603 are different from each other. The bypass portions 251 connected to the main zone 601, the bypass portions 251 connected to the main zone 602, and the bypass portions 251 connected to the main zone 603 may be the same.

For example, the output of the main zone 601, the output of the main zone 602, and the output of the main zone 603 can be set to be different from each other by setting the voltage applied to the power feeding terminals 280 (the power feeding terminals 280e and 280f) feeding power to the main zone 601, the voltage applied to the power feeding terminals 280 (the power feeding terminals 280g and 280h) feeding power to the main zone 602, and the voltage applied to the power feeding terminals 280 (the power feeding terminals 280i and 280j) feeding power to the main zone 603 to be different from each other. That is, the outputs of the main zones can be controlled independently.

The sub-heater element 231 generates less heat than the main heater element 232. In other words, the sub-heater element 231 is a low-output sub-heater; and the main heater element 232 is a high-output main heater.

Thus, the in-plane temperature unevenness of the process object W caused by the pattern of the main heater element 232 can be suppressed by the sub-heater element 231 by the sub-heater element 231 generating less heat than the main heater element 232. Accordingly, the uniformity of the in-plane temperature distribution of the process object W can be increased.

The volume resistivity of the sub-heater element 231 is, for example, greater than the volume resistivity of the main heater element 232. The volume resistivity of the sub-heater element 231 is the volume resistivity of the sub-heater line 231c. That is, the volume resistivity of the sub-heater element 231 is the volume resistivity between the first sub-power feeding portion 231a and the second sub-power feeding portion 231b. In other words, the volume resistivity of the sub-heater element 231 is the volume resistivity of the path indicated by arrows C25 and C35 in FIG. 4. Similarly, the volume resistivity of the main heater element 232 is the volume resistivity of the main heater line 232c. That is, the volume resistivity of the main heater element 232 is the volume resistivity between the first main power feeding portion 232a and the second main power feeding portion 232b. In other words, the volume resistivity of the main heater element 232 is the volume resistivity of the path indicated by arrow C45, arrow C55, and arrow C65 in FIG. 4.

Thus, the output (generated heat amount, power consumption) of the sub-heater element 231 can be set to be less than the output (generated heat amount, power consumption) of the main heater element 232 by setting the volume resistivity of the sub-heater element 231 to be greater than the volume resistivity of the main heater element 232. Accordingly, the in-plane temperature unevenness of the process object W caused by the pattern of the main heater element 232 can be suppressed by the sub-heater element 231. Accordingly, the uniformity of the in-plane temperature distribution of the process object can be increased.

Temperature singularities (points where the temperatures are relatively significantly different from the surrounding regions) tend to occur around the power feeding terminals 280. In contrast, by providing the bypass layer 250, the degree of freedom in arranging the power feeding terminals 280 can be increased. For example, the power feeding terminals 280 that tend to have temperature singularities can be arranged in a dispersed manner, so that the heat is easily diffused around the singularities. The uniformity of the in-plane temperature distribution of the process object W can be increased thereby.

A configuration in which the power feeding terminal 280 that has a large heat capacity is not directly connected to the sub-heater element 231 or the main heater element 232 is possible by providing the bypass layer 250. The uniformity of the in-plane temperature distribution of the process object W can be increased thereby. By providing the bypass layer 250, it is unnecessary to directly connect the power feeding terminals 280 to the sub-heater element 231 and the main heater element 232 that are relatively thin. The reliability of the heater unit 200 can be increased thereby.

As described above, the power feeding terminal 280 is provided from the heater unit 200 toward the base plate 300. For this reason, power can be supplied from the side of the lower surface 303 (see to FIGS. 2A and 2B) of the base plate 300 to the power feeding terminal 280 via a member called a socket or the like. Accordingly, the wiring of the heater is implemented while suppressing the power feeding terminal 280 from being exposed in the chamber in which the electrostatic chuck 10 is installed.

In the example, the sub-heater element 231 is positioned higher than the main heater element 232. In other words, the sub-heater element 231 is located between the main heater element 232 and the first major surface 101. The position of the sub-heater element 231 and the position of the main heater element 232 may be reversed. That is, the main heater element 232 may be positioned higher than the sub-heater element 231. In other words, the main heater element 232 may be located between the first major surface 101 and the sub-heater element 231. From the perspective of temperature control, it is favorable for the sub-heater element 231 to be positioned higher than the main heater element 232.

When the sub-heater element 231 is positioned higher than the main heater element 232, the distance between the sub-heater element 231 and the process object W is less than the distance between the main heater element 232 and the process object W. By providing the sub-heater element 231 relatively proximate to the process object W, the temperature of the process object W is more easily controlled by the sub-heater element 231. In other words, the in-plane temperature unevenness of the process object W caused by the pattern of the main heater element 232 is more easily suppressed by the sub-heater element 231. Accordingly, the uniformity of the in-plane temperature distribution of the process object W can be increased.

On the other hand, when the main heater element 232 is positioned higher than the sub-heater element 231, the high-output main heater element 232 is relatively proximate to the process object W. The responsiveness (the temperature raising rate/temperature lowering rate) of the temperature of the process object W can be improved thereby.

In the example, the main heater element 232 is located between the bypass layer 250 and the sub-heater element 231 in the Z-direction. That is, the bypass layer 250 is positioned lower than the sub-heater element 231 and the main heater element 232.

Thus, the sub-heater element 231 and the main heater element 232 can be disposed at one side of the bypass layer 250 by providing the main heater element 232 between the bypass layer 250 and the sub-heater element 231 in the Z-direction. Accordingly, when connecting the power feeding terminal 280 to the bypass layer 250, the power feeding terminal 280 can be connected to the bypass layer 250 from the side opposite to the sub-heater element 231 and the main heater element 232. Accordingly, it is unnecessary to provide a hole part for passing the power feeding terminal 280 in the sub-heater element 231 and the main heater element 232; temperature singularities in the heater pattern can be reduced; and the uniformity of the in-plane temperature distributions of the sub-heater element 231 and the main heater element 232 can be increased.

The bypass layer 250 may be positioned higher than the sub-heater element 231 and the main heater element 232. That is, the bypass layer 250 may be located between the first support plate 210 and the sub-heater element 231. The bypass layer 250 may be located between the first support plate 210 and the main heater element 232. The bypass layer 250 may be positioned between the sub-heater element 231 and the main heater element 232.

The number of heater elements included in the heater unit 200 is not limited to "two". That is, the heater unit 200 may further include another heater element located in a different layer from the sub-heater element 231 and the main heater element 232. The heater unit 200 may include only one of the sub-heater element 231 or the main heater element 232. That is, one of the sub-heater element 231 or the main heater element 232 may be omitted.

Figure 5:
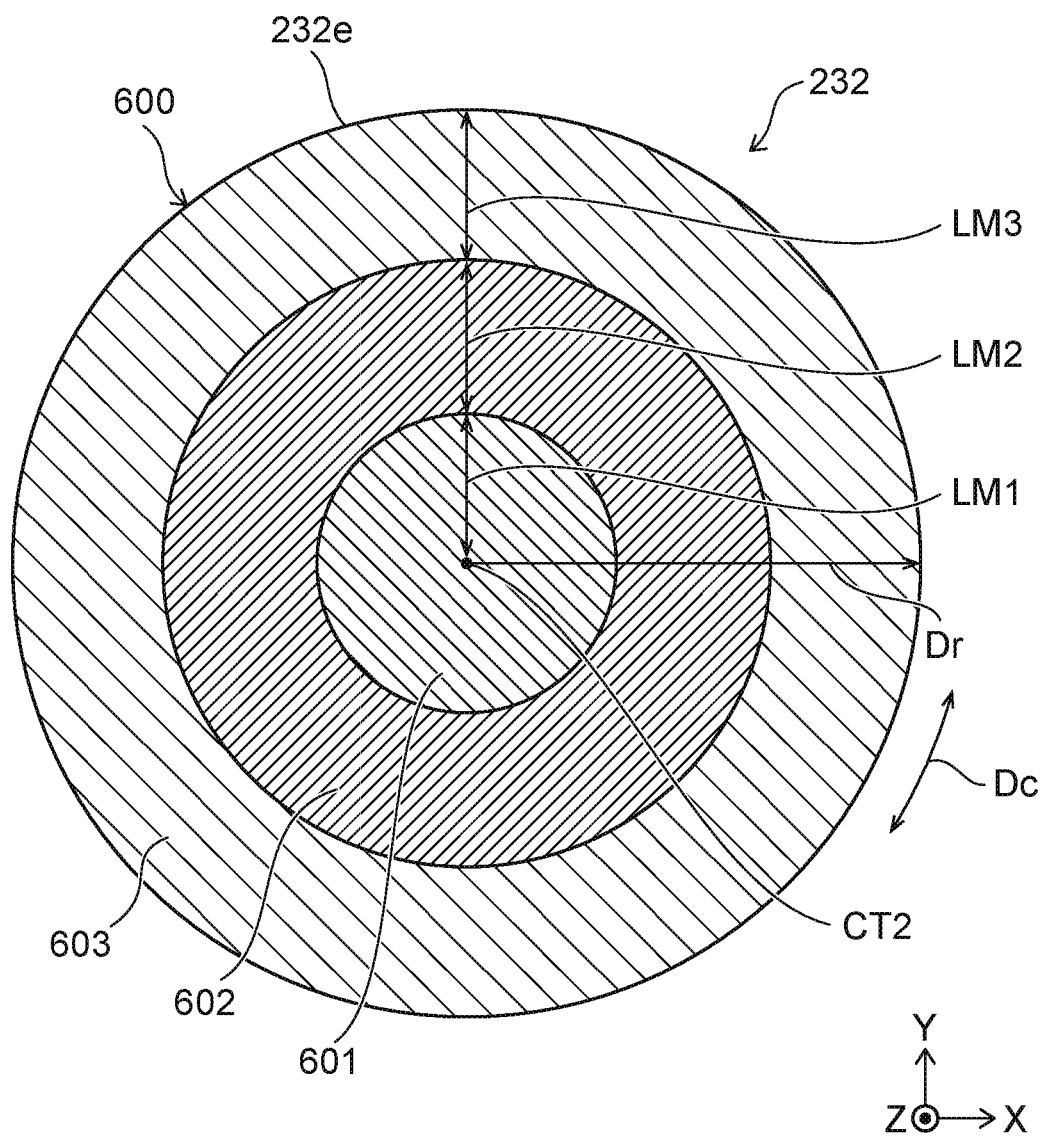
FIG. 5 is a plan view schematically illustrating main zones of the main heater element according to the embodiment.

FIG. 5 is a plan view schematically illustrating main zones of the main heater element according to the embodiment.

FIG. 5 is a view in which the main heater element 232 according to FIG. 3 is projected onto a plane perpendicular to the Z-direction.

As illustrated in FIG. 5, the main heater element 232 includes multiple main zones 600 divided in a radial direction Dr. In the main heater element 232, for example, independent temperature control is performed in each of the main zones 600.

In this specification, the "radial direction Dr" is a direction from the center of the heater element toward the outer circumference along a radius. A "circumferential direction Dc" is a direction along the outer circumference of the heater element.

In the example, the multiple main zones 600 include the three main zones 601 to 603 arranged in the radial direction Dr. That is, the main heater element 232 is divided into three zones in the radial direction Dr. The main zones 600 are arranged in the order of the main zone 601, the main zone 602, and the main zone 603 from a center CT2 of the main heater element 232 outward in the radial direction Dr.

In the example, the main zone 601 has a circular shape centered on the center CT2 when viewed in plan. The main zone 602 has an annular shape centered on the center CT2 positioned outside the main zone 601 when viewed in plan. The main zone 603 has an annular shape centered on the center CT2 positioned outside the main zone 602 when viewed in plan.

In the example, a width LM1 of the main zone 601 in the radial direction Dr, a width LM2 of the main zone 602 in the radial direction Dr, and a width LM3 of the main zone 603 in the radial direction Dr are the same as each other. The widths LM1 to LM3 may be different from each other.

The number of the main zones 600 and the shape of the main zone 600 when viewed in plan may be arbitrary. The main zone 600 may be divided in the circumferential direction Dc, or may be divided in the circumferential direction Dc and the radial direction Dr.

The main heater lines 232c that are included in the main zones 600 are independent of each other. Accordingly, a different voltage can be applied to each main zone 600 (main heater line 232c). Accordingly, the output (the generated heat amount) can be controlled independently for each main zone 600. In other words, the main zones 600 are heater units capable of mutually-independent temperature control; and the main heater element 232 is an aggregate of heater units including multiple heater units.

As described above, each main zone 600 includes one first main power feeding portion 232a, one second main power feeding portion 232b, and one main heater line 232c. The main heater line 232c is one electrode connecting the first and second main power feeding portions 232a and 232b, and generates heat by allowing a current to flow. The main zone 600 is a region that includes the continuous main heater line 232c connecting the first and second main power feeding portions 232a and 232b.

For convenience in FIG. 5, the end portions in the radial direction Dr of the main zones 600 are shown as being in contact with each other, but actually, a gap (i.e., a portion where the main heater line 232c is not provided) exists between the end portions; and the end portions in the radial direction Dr of adjacent main zones do not contact each other. This is the same for the following figures.

Figure 6:
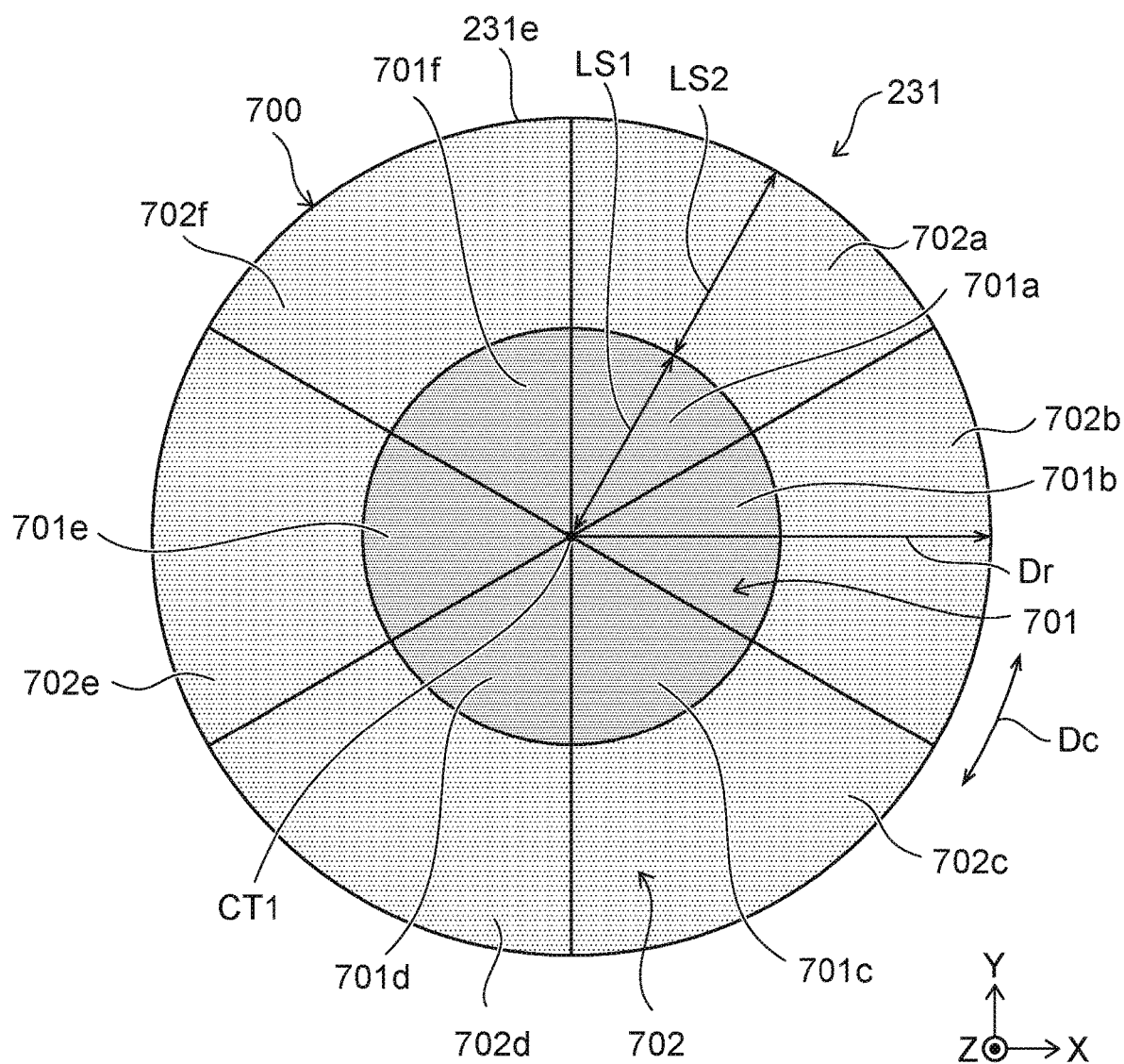
FIG. 6 is a plan view schematically illustrating sub-zones of the sub-heater element according to the embodiment.

FIG. 6 is a plan view schematically illustrating sub-zones of the sub-heater element according to the embodiment.

FIG. 6 is a view in which the sub-heater element 231 according to FIG. 3 is projected onto a plane perpendicular to the Z-direction.

In the example as illustrated in FIG. 6, the sub-heater element 231 includes multiple sub-zones 700 divided in the radial direction Dr and the circumferential direction Dc. In the sub-heater element 231, independent temperature control is performed in each sub-zone 700.

The multiple sub-zones 700 include the first region 701 made of sub-zones 701a to 701f arranged in the circumferential direction Dc, and the second region 702 made of sub-zones 702a to 702f arranged in the circumferential direction Dc. That is, the main heater element 232 is divided into two zones in the radial direction Dr. The first region 701 and the second region 702 each are divided into six zones in the circumferential direction Dc. The regions are arranged in the order of the first region 701 and the second region 702 from a center CT1 of the sub-heater element 231 outward in the radial direction Dr.

The first region 701 has a circular shape centered on the center CT1 in a plan view. The second region 702 has an annular shape located outside the first region 701 and centered on the center CT1 in a plan view.

The first region 701 has the sub-zones 701a to 701f. In the first region 701, the sub-zones 701a to 701f are disposed clockwise in the order of the sub-zone 701a, the sub-zone 701b, the sub-zone 701c, the sub-zone 701d, the sub-zone 701e, and the sub-zone 701f. Each of the sub-zones 701a to 701f is a portion of the circular first region 701.

The second region 702 has the sub-zones 702a to 702f. In the second region 702, the sub-zones 702a to 702f are disposed clockwise in the order of the sub-zone 702a, the sub-zone 702b, the sub-zone 702c, the sub-zone 702d, the sub-zone 702e, and the sub-zone 702f. In the example, the sub-zone 702a is located outside the sub-zone 701a. The sub-zone 702b is located outside the sub-zone 701b. The sub-zone 702c is located outside the sub-zone 701c. The sub-zone 702d is located outside the sub-zone 701d. The sub-zone 702e is located outside the sub-zone 701e. The sub-zone 702f is located outside the sub-zone 701f. Each of the sub-zones 702a to 702f is a portion of the annular second region 702.

A width LS1 in the radial direction Dr of the first region 701 and a width LS2 in the radial direction Dr of the second region 702 are, for example, the same. The width LS1 and the width LS2 may be different from each other.

The number of the multiple sub-zones 700 is, for example, greater than the number of the multiple main zones 600. That is, for example, the sub-heater element 231 is divided into more zones than the main heater element 232. The number of the multiple sub-zones 700 may be equal to the number of the multiple main zones 600 or less than the number of the multiple main zones 600.

By setting the number of the multiple sub-zones 700 included in the sub-heater element 231 to be greater than the number of the multiple main zones 600 included in the main heater element 232, the sub-heater element 231 can perform temperature adjustment of narrower regions than the main heater element 232. Finer temperature adjustment by the sub-heater element 231 is possible thereby, and the uniformity of the in-plane temperature distribution of the process object W can be increased.

The number of the sub-zones 700 and the shape of the sub-zone 700 when viewed in plan may be arbitrary. The sub-zone 700 may not be divided in the circumferential direction Dc. That is, the first region 701 and the second region 702 may not include the multiple sub-zones 700 divided in the circumferential direction Dc.

The sub-heater lines 231c included in the sub-zones 700 are independent of each other. Accordingly, a different voltage can be applied to each sub-zone 700 (sub-heater line 231c). Accordingly, the output (the generated heat amount) can be controlled independently for each sub-zone 700. In other words, the sub-zones 700 are heater units capable of performing mutually-independent temperature control; and the sub-heater element 231 is an aggregate of heater units including multiple heater units.

As described above, each sub-zone 700 includes one first sub-power feeding portion 231a, one second sub-power feeding portion 231b, and one sub-heater line 231c. The sub-heater line 231c is one electrode connecting the first sub-power feeding portion 231a and the second sub-power feeding portion 231b and generates heat by allowing a current to flow. The sub-zone 700 is a region including the continuous sub-heater line 231c that connects the first sub-power feeding portion 231a and the second sub-power feeding portion 231b.

For convenience in FIG. 6, the end portions in the radial direction Dr of the sub-zones 700 are shown as being in contact with each other, but actually, a gap (i.e., a portion where the sub-heater line 231c is not provided) exists between the end portions; and the end portions in the radial direction Dr of the adjacent sub-zones 700 do not contact each other. This is the same for the following figures.

Figure 7:
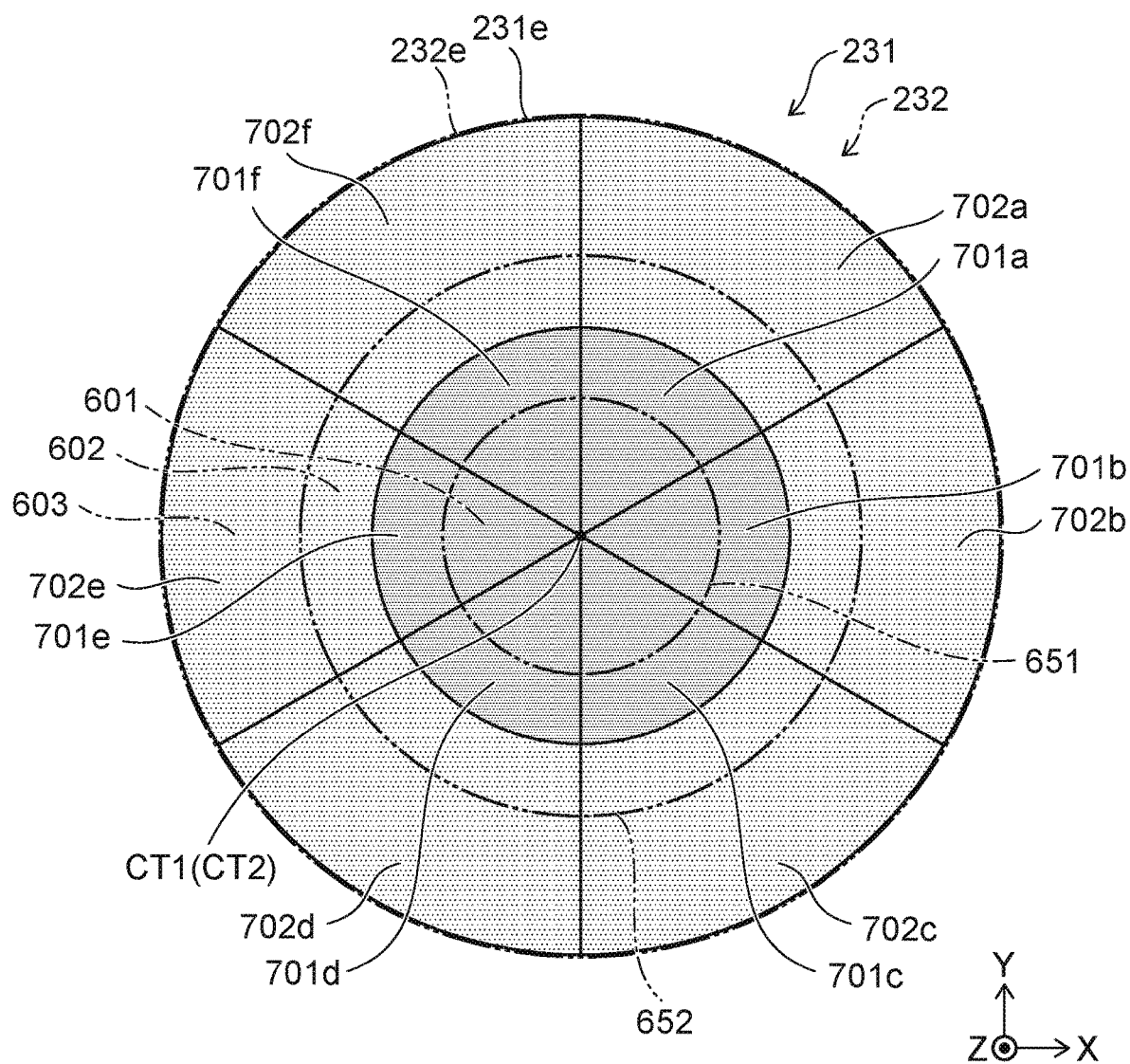
FIG. 7 is a plan view schematically illustrating the positional relationship between the main zones of the main heater element and the sub-zones of the sub-heater element according to the embodiment.

FIG. 7 is a plan view schematically illustrating the positional relationship between the main zones of the main heater element and the sub-zones of the sub-heater element according to the embodiment.

FIG. 7 shows the positional relationship when viewed along the Z-direction when the main heater element 232 illustrated in FIG. 5 and the sub-heater element 231 illustrated in FIG. 6 are overlaid.

In FIG. 7, the main zones 600 of the main heater element 232 are illustrated by double dot-dash lines, and the sub-zones 700 of the sub-heater element 231 are illustrated by solid lines.

As illustrated in FIG. 7, the sub-heater element 231 and the main heater element 232 are disposed so that, for example, the center CT1 of the sub-heater element 231 and the center CT2 of the main heater element 232 overlap in the Z-direction. For example, an outer circumference edge 231e of the sub-heater element 231 and an outer circumference edge 232e of the main heater element 232 also overlap in the Z-direction. The outer circumference edge 231e of the sub-heater element 231 and the outer circumference edge 232e of the main heater element 232 may not overlap in the Z-direction.

Figure 8:
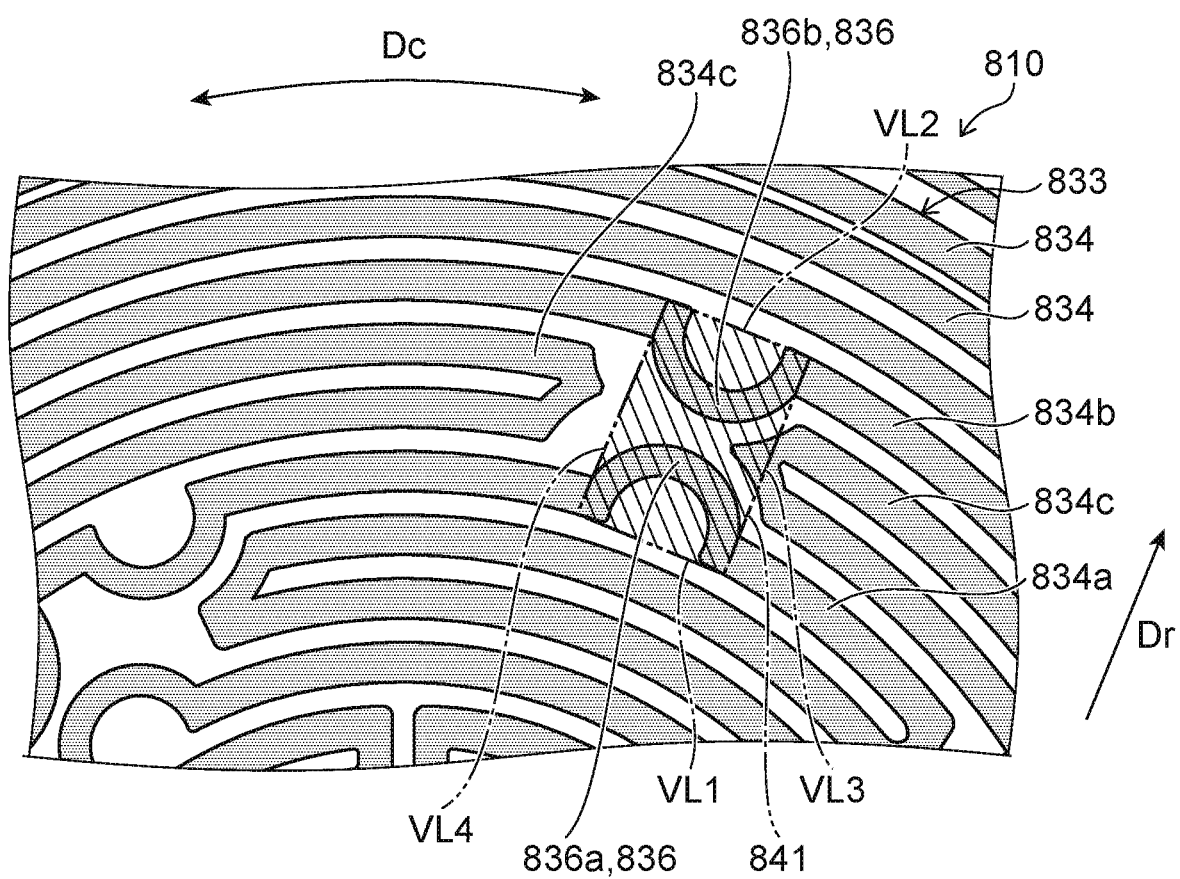
FIG. 8 is a plan view schematically illustrating a portion of the first zone of the heater unit according to the embodiment.

FIG. 8 is a plan view schematically illustrating a portion of the first zone of the heater unit according to the embodiment.

FIG. 8 illustrates an enlarged portion of a first zone 810 of the heater unit 200. The first zone 810 is one of multiple zones included in the first heater element of the heater unit 200. The first heater element may be the sub-heater element 231 or may be the main heater element 232. That is, the first zone 810 may be one of the sub-zones 700 of the sub-heater element 231 or one of the main zones 600 of the main heater element 232.

As illustrated in FIG. 8, the first zone 810 includes a first heater line 833. The first zone 810 further includes a first power feeding portion 831 (see FIGS. 13 to 16) and a second power feeding portion 832 (see FIGS. 13 to 16). The first heater line 833 generates heat by allowing a current to flow. The first power feeding portion 831 and the second power feeding portion 832 feed power to the first heater line 833.

When the first zone 810 is one of the sub-zones 700, the first power feeding portion 831, the second power feeding portion 832, and the first heater line 833 are respectively the first sub-power feeding portion 231a, the second sub-power feeding portion 231b, and the sub-heater line 231c. When the first zone 810 is one of the main zones 600, the first power feeding portion 831, the second power feeding portion 832, and the first heater line 833 are respectively the first main power feeding portion 232a, the second main power feeding portion 232b, and the main heater line 232c.

The first heater line 833 includes multiple extension portions 834 and a folded portion 835 (see FIGS. 13 to 16). The first heater line 833 has a structure in which the multiple extension portions 834 are connected by the folded portion 835. Accordingly, the first heater line 833 functions as one electrode connecting the first power feeding portion 831 and the second power feeding portion 832. The first heater line 833 includes multiple protruding portions 836 provided in the multiple extension portions 834. The protruding portion 836 is bent from the extension portion 834 extending along the first direction and extends in the second direction. The thickness of the first heater line 833 at the protruding portion 836 is, for example, equal to the thickness of the first heater line 833 at the extension portion 834.

The extension portions 834 extend along the first direction. The extension portions 834 are arranged in the second direction. The second direction is perpendicular to the first direction. The multiple protruding portions 836 each protrude in the second direction. In the example, the first direction is the circumferential direction Dc, and the second direction is the radial direction Dr. That is, the extension portions 834 extend along the circumferential direction Dc and are arranged in the radial direction Dr. The protruding portions 836 protrude in the radial direction Dr.

The multiple extension portions 834 include a first extension portion 834a, a second extension portion 834b, and a third extension portion 834c. The third extension portion 834c is positioned between the first extension portion 834a and the second extension portion 834b in the second direction. That is, for example, the first extension portion 834a and the second extension portion 834b are not adjacent to each other. The third extension portion 834c is provided as necessary and is omissible. That is, the first extension portion 834a and the second extension portion 834b may be adjacent to each other. Even when the third extension portion 834c is provided, a portion of the first extension portion 834a and a portion of the second extension portion 834b may be adjacent to each other.

The multiple protruding portions 836 include a first protruding portion 836a and a second protruding portion 836b. The first protruding portion 836a is provided in the first extension portion 834a and protrudes toward the second protruding portion 836b. The second protruding portion 836b is provided in the second extension portion 834b and protrudes toward the first protruding portion 836a.

The first zone 810 includes a first facing region 841. In the first facing region 841, the first protruding portion 836a and the second protruding portion 836b are disposed so as to face and be adjacent to each other. That is, another portion of the first heater line 833 (e.g., another extension portion 834, folded portion 835, or the like) is not included in at least a portion between the first protruding portion 836a and the second protruding portion 836b. Another portion of the first heater line 833 (e.g., another extension portion 834, folded portion 835, or the like) may be included in a portion between the first protruding portion 836a and the second protruding portion 836b. The first facing region 841 may become a cool spot having relatively low temperatures in the plane of the heater unit 200.

The first facing region 841 is, for example, the interior of a region surrounded with a first virtual line VL1, a second virtual line VL2, a third virtual line VL3, and a fourth virtual line VL4. The first virtual line VL1 is a line that extends along the first direction and overlaps one end (the inner end portion) in the second direction of the first protruding portion 836a. The second virtual line VL2 is a line that extends along the first direction and overlaps the other end (the outer end portion) in the second direction of the second protruding portion 836b. The third virtual line VL3 is a line that extends along the second direction and overlaps the end portion among one end in the first direction of the first protruding portion 836a and one end in the first direction of the second protruding portion 836b that is closer to the other end. The fourth virtual line VL4 is a line that extends along the second direction and overlaps the end portion among the other end in the first direction of the first protruding portion 836a and the other end in the first direction of the second protruding portion 836b that is closer to the one end.

The first facing region 841 includes at least a portion of the first protruding portion 836a and at least a portion of the second protruding portion 836b. In the example, the first facing region 841 includes the entire first protruding portion 836a and the entire second protruding portion 836b. That is, the one end in the first direction of the first protruding portion 836a overlaps the one end in the first direction of the second protruding portion 836b in the second direction. The other end in the first direction of the first protruding portion 836a overlaps the other end in the first direction of the second protruding portion 836b in the second direction.

For example, the entire first protruding portion 836a may not be included in the first facing region 841. For example, the entire second protruding portion 836b may not be included in the first facing region 841. That is, the one end in the first direction of the first protruding portion 836a may not overlap the one end in the first direction of the second protruding portion 836b in the second direction. The other end in the first direction of the first protruding portion 836a may not overlap the other end in the first direction of the second protruding portion 836b in the second direction.

In the example, a portion of the third extension portion 834c is located at a position where the portion of the third extension portion 834c overlaps the first and second protruding portions 836a and 836b in the second direction. That is, the portion of the third extension portion 834c is located at a position where the portion of the third extension portion 834c overlaps the first facing region 841. On the other hand, another portion of the third extension portion 834c is located at a position where the other portion of the third extension portion 834c does not overlap the first and second protruding portions 836a and 836b in the second direction. That is, the other portion of the third extension portion 834c is located at a position where the other portion of the third extension portion 834c does not overlap the first facing region 841. The third extension portion 834c may be located at a position where the entire third extension portion 834c does not overlap the first and second protruding portions 836a and 836b, or may be located at a position where a portion of the third extension portion 834c overlaps the first and second protruding portions 836a and 836b.

The size in the second direction of the first facing region 841 is increased when the third extension portion 834c or the like is disposed between the first protruding portion 836a and the second protruding portion 836b in the second direction. There is a risk that the temperature control may become complex because the first protruding portion 836a and the second protruding portion 836b, i.e., the cool spots, are disposed to be more separated. It is favorable for the first and second protruding portions 836a and 836b to be disposed so as to be proximate in the second direction as much as possible and for the third extension portion 834c to be located at a position where the entire third extension portion 834c does not overlap the first and second protruding portions 836a and 836b.

Figure 9:
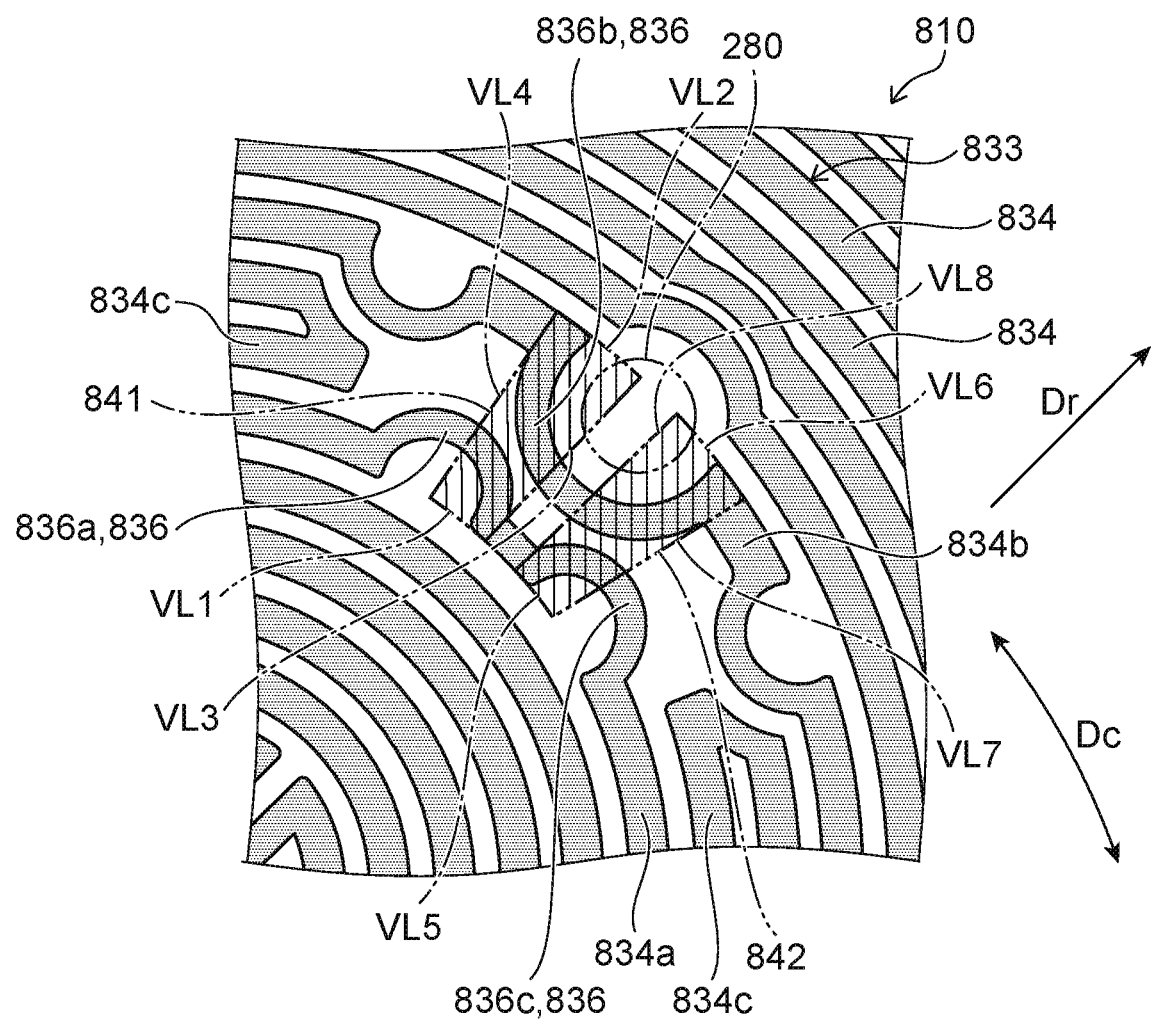
FIG. 9 is a plan view schematically illustrating a portion of a first zone of a heater unit according to a modification of the embodiment.

FIG. 9 is a plan view schematically illustrating a portion of a first zone of a heater unit according to a modification of the embodiment.

In the example as illustrated in FIG. 9, the first direction is the circumferential direction Dc, and the second direction is the radial direction Dr. That is, the extension portions 834 extend along the circumferential direction Dc and are arranged in the radial direction Dr. The protruding portions 836 protrude in the radial direction Dr.

The multiple protruding portions 836 further include a third protruding portion 836c in addition to the first and second protruding portions 836a and 836b. The third protruding portion 836c is provided in the first extension portion 834a and protrudes toward the second protruding portion 836b. The third protruding portion 836c is arranged with the first protruding portion 836a in the first direction.

In the example as well, the first zone 810 includes the first facing region 841. In the first facing region 841, the first protruding portion 836a and the second protruding portion 836b are disposed so as to face and be adjacent to each other. The first facing region 841 includes a portion of the first protruding portion 836a and a portion of the second protruding portion 836b. That is, one end in the first direction of the first protruding portion 836a does not overlap one end in the first direction of the second protruding portion 836b in the second direction. The other end in the first direction of the first protruding portion 836a does not overlap the other end in the first direction of the second protruding portion 836b in the second direction.

For example, the entire first protruding portion 836a may be included in the first facing region 841. That is, the other end in the first direction of the first protruding portion 836a may overlap the other end in the first direction of the second protruding portion 836b in the second direction.

The first zone 810 further includes a second facing region 842. In the second facing region 842, the third protruding portion 836c and the second protruding portion 836b are disposed so as to face and be adjacent to each other. That is, another portion of the first heater line 833 (e.g., another extension portion 834, folded portion 835, or the like) is not included in at least a portion between the third protruding portion 836c and the second protruding portion 836b. Another portion of the first heater line 833 (e.g., another extension portion 834, folded portion 835, or the like) may be included in a portion between the third protruding portion 836c and the second protruding portion 836b. The second facing region 842 may become a cool spot having relatively low temperatures in the plane of the heater unit 200.

The second facing region 842 is, for example, the interior of a region surrounded with a fifth virtual line VL5, a sixth virtual line VL6, a seventh virtual line VL7, and an eighth virtual line VL8. The fifth virtual line VL5 is a line that extends along the first direction and overlaps one end (the inner end portion) in the second direction of the third protruding portion 836c. The sixth virtual line VL6 is a line that extends along the first direction and overlaps the other end (the outer end portion) in the second direction of the second protruding portion 836b. The seventh virtual line VL7 is a line that extends along the second direction and overlaps the end portion among one end in the first direction of the third protruding portion 836c and one end in the first direction of the second protruding portion 836b that is closer to the other end. The eighth virtual line VL8 is a line that extends along the second direction and overlaps the end portion among the other end in the first direction of the third protruding portion 836c and the other end in the first direction of the second protruding portion 836b that is closer to the one end.

The second facing region 842 includes at least a portion of the third protruding portion 836c and at least a portion of the second protruding portion 836b. In the example, the second facing region 842 includes a portion of the third protruding portion 836c and a portion of the second protruding portion 836b. That is, the one end in the first direction of the third protruding portion 836c does not overlap the one end in the first direction of the second protruding portion 836b in the second direction. The other end in the first direction of the third protruding portion 836c does not overlap the other end in the first direction of the second protruding portion 836b in the second direction.

For example, the entire third protruding portion 836c may be included in the second facing region 842. That is, the one end in the first direction of the third protruding portion 836c may overlap the one end in the first direction of the second protruding portion 836b in the second direction.

In the example, two protruding portions also are disposed in the second extension portion 834b at the two sides of the second protruding portion 836b in the first direction. That is, in the example, five protruding portions are disposed so as to be proximate to each other. The number of cool spots in the entire plane can be relatively low by disposing many protruding portions so as to be aggregated. Accordingly, the uniformity of the in-plane temperature distribution of the process object can be increased while suppressing complex temperature control.

For example, the third extension portion 834c is located at a position where the third extension portion 834c does not overlap the third and second protruding portions 836c and 836b in the second direction. For example, the third extension portion 834c is located at a position where the third extension portion 834c does not overlap the second facing region 842.

Figure 10:
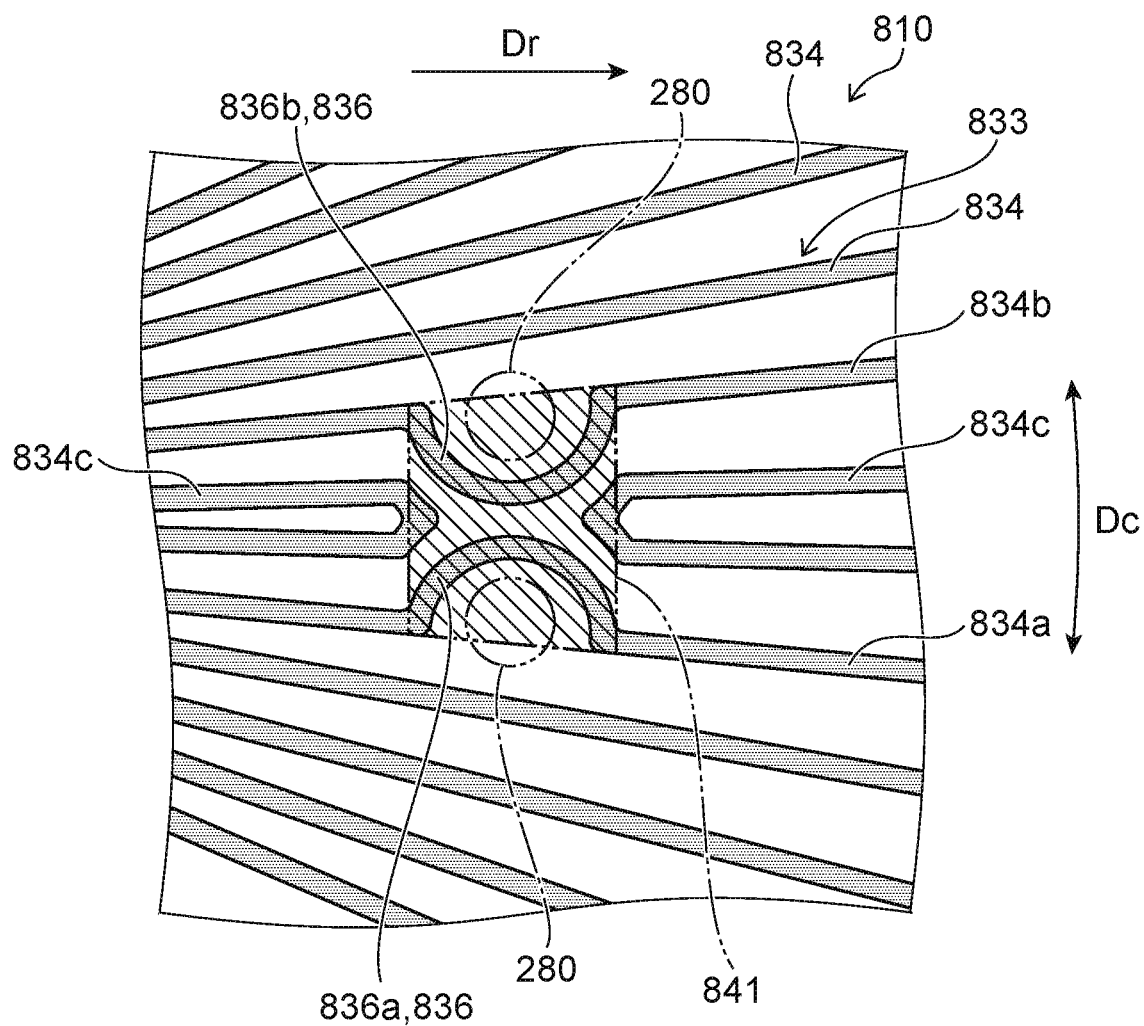
FIG. 10 is a plan view schematically illustrating a portion of a first zone of a heater unit according to a modification of the embodiment.

FIG. 10 is a plan view schematically illustrating a portion of a first zone of a heater unit according to a modification of the embodiment.

In the example as illustrated in FIG. 10, the first direction is the radial direction Dr, and the second direction is the circumferential direction Dc. That is, the extension portions 834 extend along the radial direction Dr and are arranged in the circumferential direction Dc. The protruding portions 836 protrude in the circumferential direction Dc.

In the example as well, the first zone 810 includes the first facing region 841. In the first facing region 841, the first protruding portion 836a and the second protruding portion 836b are disposed so as to face and be adjacent to each other. The first facing region 841 is substantially the same as that of the example shown in FIG. 8, and a description is therefore omitted.

Figure 11:
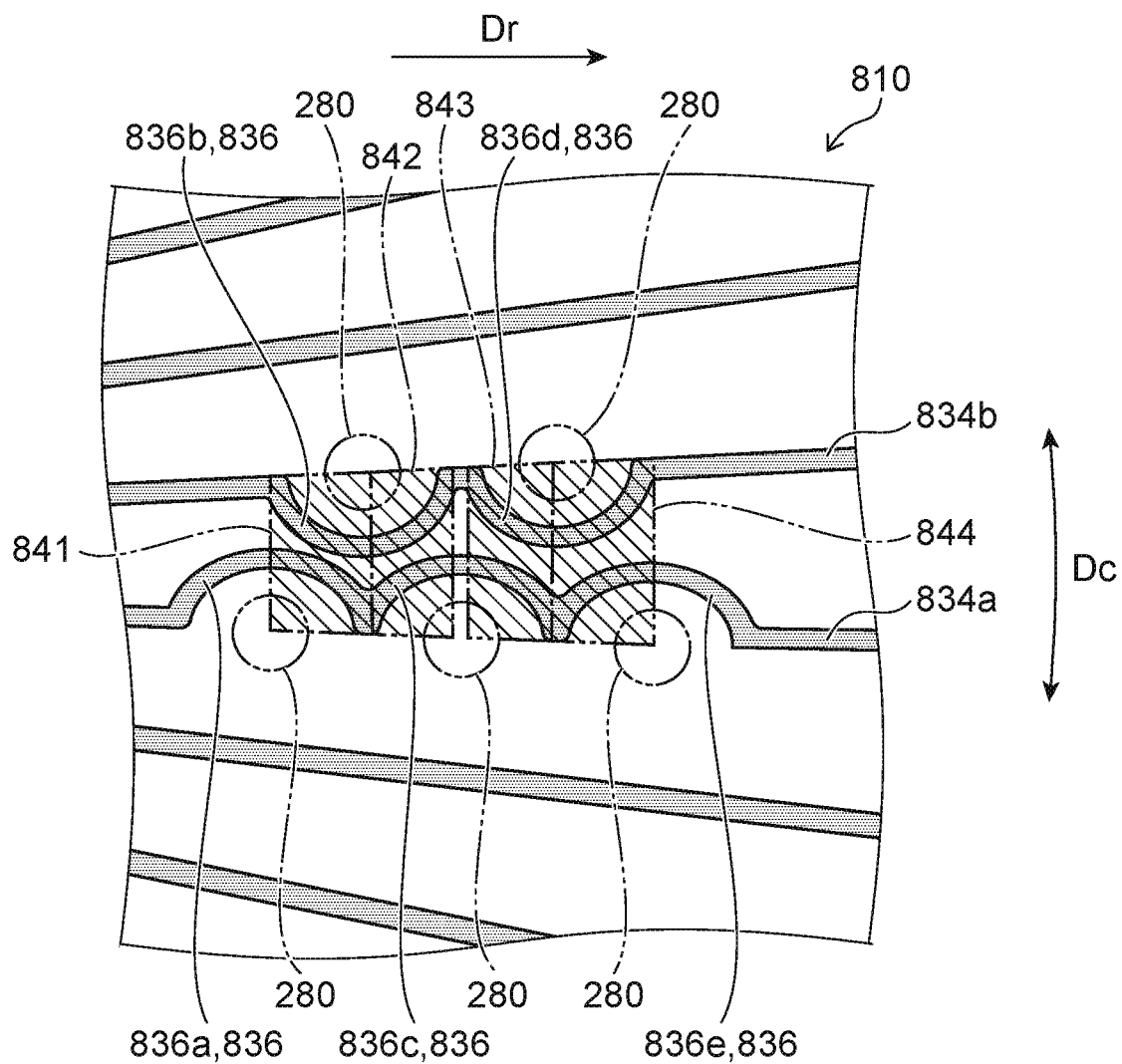
FIG. 11 is a plan view schematically illustrating a portion of a first zone of a heater unit according to a modification of the embodiment.

FIG. 11 is a plan view schematically illustrating a portion of a first zone of a heater unit according to a modification of the embodiment.

In the example as illustrated in FIG. 11, the first direction is the radial direction Dr, and the second direction is the circumferential direction Dc. That is, the extension portions 834 extend along the radial direction Dr and are arranged in the circumferential direction Dc. The protruding portions 836 protrude in the circumferential direction Dc.

The multiple protruding portions 836 further include a third protruding portion 836c, a fourth protruding portion 836d, and a fifth protruding portion 836e in addition to the first and second protruding portions 836a and 836b. The first protruding portion 836a, the third protruding portion 836c, and the fifth protruding portion 836e are arranged in the first direction. The second protruding portion 836b and the fourth protruding portion 836d are arranged in the first direction. The third protruding portion 836c is provided in the first extension portion 834a and protrudes toward the second and fourth protruding portions 836b and 836d. The fifth protruding portion 836e is provided in the first extension portion 834a and protrudes toward the fourth protruding portion 836d. The fourth protruding portion 836d is provided in the second extension portion 834b and protrudes toward the third and fifth protruding portions 836c and 836e.

In the example as well, the first zone 810 includes the first facing region 841 and the second facing region 842. In the first facing region 841, the first protruding portion 836a and the second protruding portion 836b are disposed so as to face and be adjacent to each other. In the second facing region 842, the third protruding portion 836c and the second protruding portion 836b are disposed so as to face and be adjacent to each other. The first facing region 841 and the second facing region 842 are substantially the same as those of the example shown in FIG. 9, and a description is therefore omitted.

In the example, the first zone 810 further includes a third facing region 843 and a fourth facing region 844. In the third facing region 843, the third protruding portion 836c and the fourth protruding portion 836d are disposed so as to face and be adjacent to each other. In the fourth facing region 844, the fifth protruding portion 836e and the fourth protruding portion 836d are disposed so as to face and be adjacent to each other. Other than including the protruding portions 836 of different configurations, the third facing region 843 and the fourth facing region 844 are substantially the same as the first and second facing regions 841 and 842, and a description is therefore omitted. The third facing region 843 and the fourth facing region 844 may become cool spots having relatively low temperatures in the plane of the heater unit 200.

Figure 12:
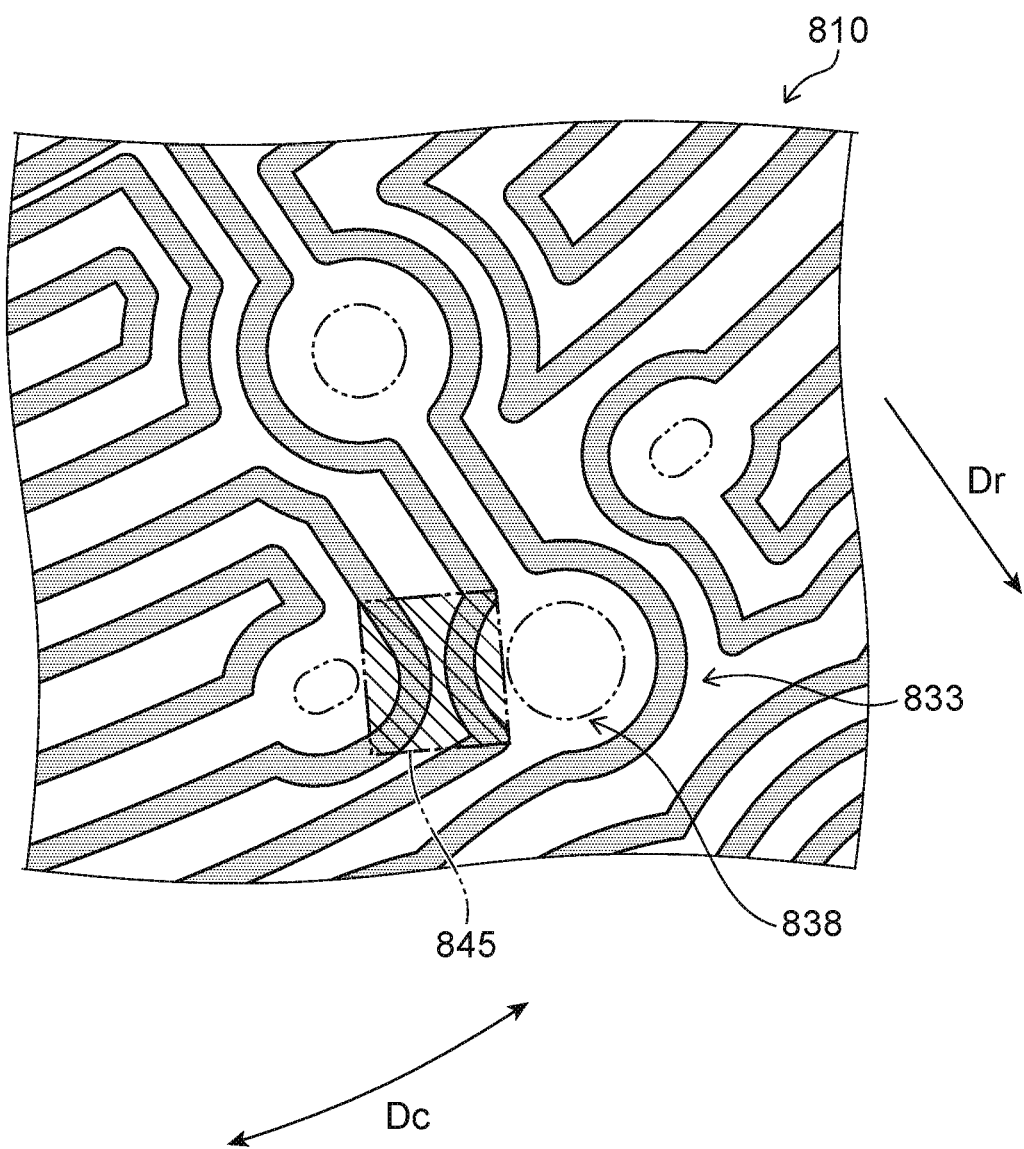
FIG. 12 is a plan view schematically illustrating a portion of a first zone of a heater unit according to a modification of the embodiment.

FIG. 12 is a plan view schematically illustrating a portion of a first zone of a heater unit according to a modification of the embodiment.

As illustrated in FIG. 12, the first zone 810 also may include a fifth facing region 845. For example, the fifth facing region 845 is located at a corner portion 838 at which the first heater line 833 is bent. In the fifth facing region 845, portions of the first heater line 833 are disposed so as to face and be adjacent to each other. More specifically, in the example, the first heater line 833 includes the first protruding portion 836a and the second protruding portion 836b. The first protruding portion 836a and the second protruding portion 836b each are curved. The curve direction of the first protruding portion 836a is opposite to the curve direction of the second protruding portion 836b. The first protruding portion 836a protrudes toward the second protruding portion 836b. The second protruding portion 836b protrudes toward the first protruding portion 836a. In the fifth facing region 845, the first protruding portion 836a and the second protruding portion 836b are disposed so as to face and be adjacent to each other. The fifth facing region 845 may become a cool spot having relatively low temperatures in the plane of the heater unit 200.

Figure 13:
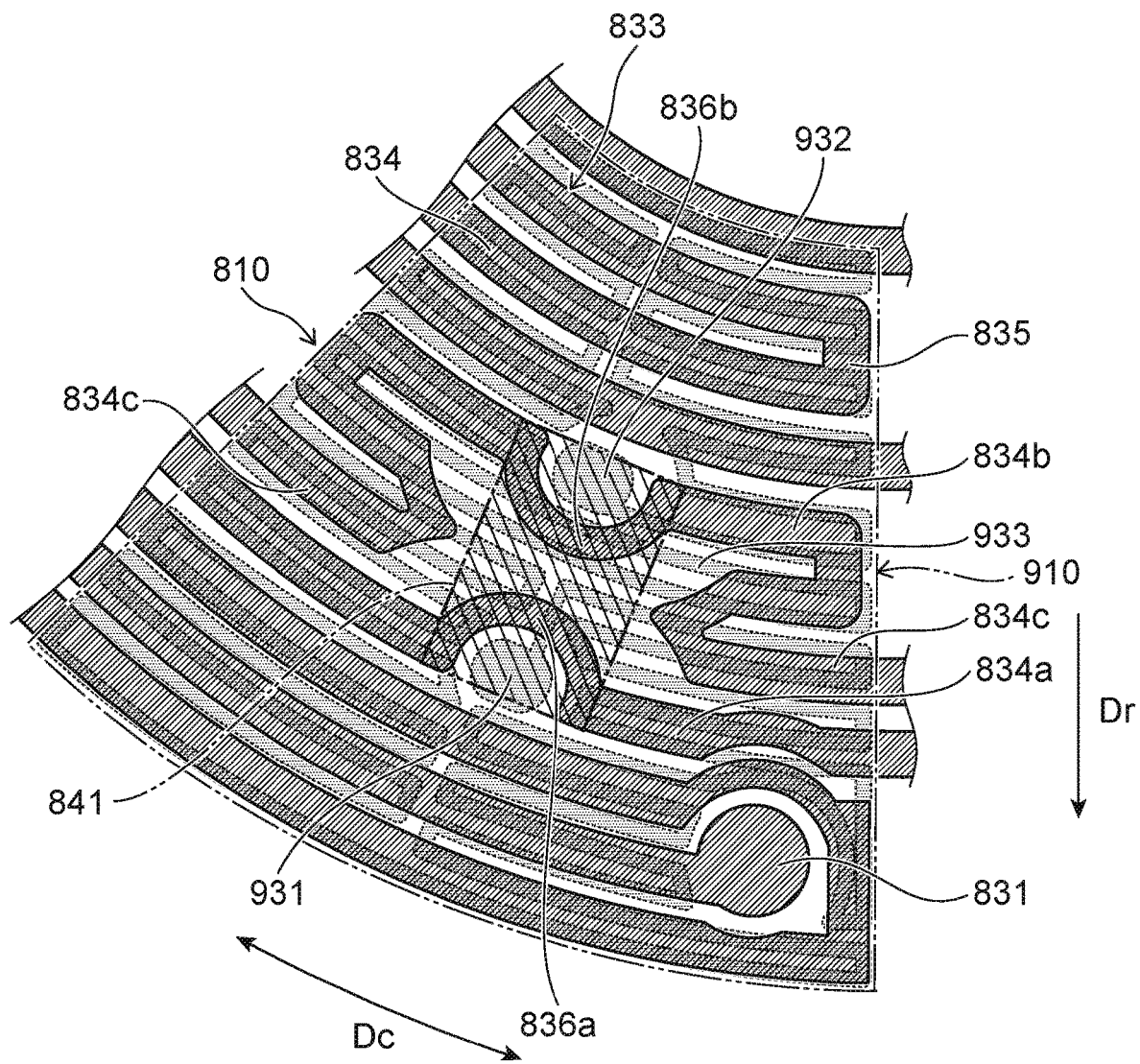
FIG. 13 is a plan views schematically illustrating the positional relationship between a second zone and a portion of the first zone of the heater unit according to the first embodiment.
Figure 14:
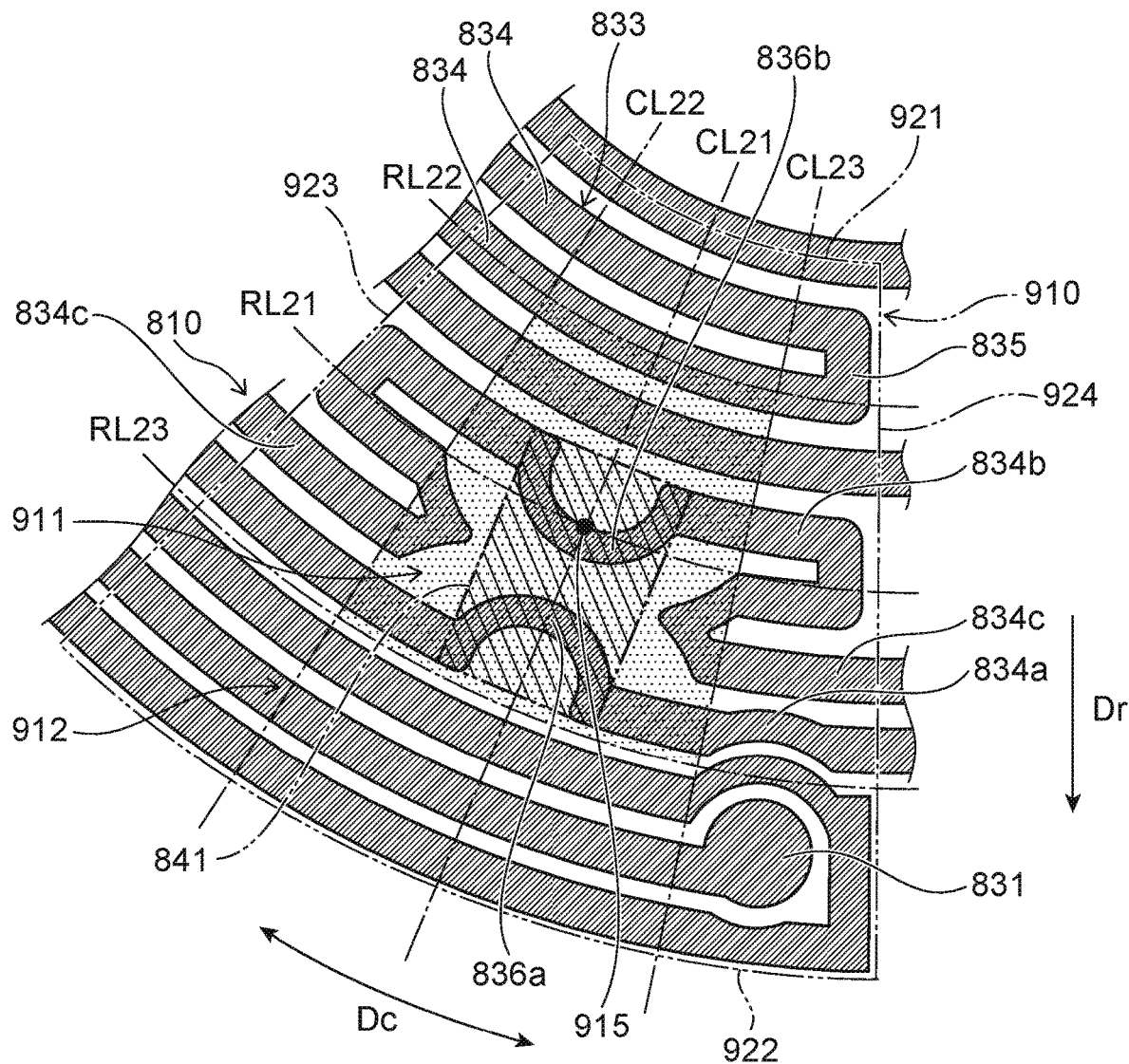
FIG. 14 is a plan views schematically illustrating the positional relationship between a second zone and a portion of the first zone of the heater unit according to the first embodiment.

FIGS. 13 and 14 are plan views schematically illustrating the positional relationship between a second zone and a portion of the first zone of the heater unit according to the first embodiment.

FIGS. 13 and 14 are enlarged illustrations of a second zone 910 and the portion of the first zone 810 of the heater unit 200. The second zone 910 is one of the multiple zones included in the second heater element of the heater unit 200. The second heater element is a different heater element from the first heater element. The second heater element may be the sub-heater element 231 or may be the main heater element 232. That is, the second zone 910 may be one of the sub-zones 700 of the sub-heater element 231 or one of the main zones 600 of the main heater element 232. The second zone 910 overlaps the first zone 810 in the Z-direction.

As illustrated in FIG. 13, the second zone 910 includes a third power feeding portion 931, a fourth power feeding portion 932, and a second heater line 933. The second heater line 933 generates heat by allowing a current to flow. The third power feeding portion 931 and the fourth power feeding portion 932 feed power to the second heater line 933. The third power feeding portion 931, the fourth power feeding portion 932, and the second heater line 933 are not illustrated in FIG. 14.

When the second zone 910 is one of the sub-zones 700, the third power feeding portion 931, the fourth power feeding portion 932, and the second heater line 933 are respectively the first sub-power feeding portion 231a, the second sub-power feeding portion 231b, and the sub-heater line 231c. When the second zone 910 is one of the main zones 600, the third power feeding portion 931, the fourth power feeding portion 932, and the second heater line 933 are respectively the first main power feeding portion 232a, the second main power feeding portion 232b, and the main heater line 232c.

Although an example will now be described in which the first zone 810 is one of the main zones 600 of the main heater element 232 and the second zone 910 is one of the sub-zones 700 of the sub-heater element 231, the first zone 810 may be one of the sub-zones 700 of the sub-heater element 231, and the second zone 910 may be one of the main zones 600 of the main heater element 232.

As illustrated in FIG. 14, the second zone 910 includes a central region 911 and an outer peripheral region 912. The central region 911 is positioned at the center of the second zone 910 when viewed in plan. The outer peripheral region 912 is positioned outside the central region 911 when viewed in plan. For example, the temperature of the central region 911 exceeds the temperature of the outer peripheral region 912 when the second zone 910 is heated.

In the example, the second zone 910 is a region surrounded with an inner circumference end 921, an outer circumference end 922, a side end 923, and a side end 924. The inner circumference end 921 overlaps one end in the second direction (the inner end portion in the radial direction Dr) of one of the third power feeding portion 931, the fourth power feeding portion 932, or the second heater line 933 included in the second zone 910. The outer circumference end 922 overlaps the other end in the second direction (the outer end portion in the radial direction Dr) of one of the third power feeding portion 931, the fourth power feeding portion 932, or the second heater line 933 included in the second zone 910. In the example, the inner circumference end 921 and the outer circumference end 922 have circular arc shapes.

The side end 923 is positioned between one end of the inner circumference end 921 and one end of the outer circumference end 922. The side end 923 overlaps one end in the first direction (the end portion at one side in the circumferential direction Dc) of one of the third power feeding portion 931, the fourth power feeding portion 932, or the second heater line 933 included in the second zone 910. The side end 924 is positioned between the other end of the inner circumference end 921 and the other end of the outer circumference end 922. The side end 924 overlaps the other end in the first direction (the end portion at the other side in the circumferential direction Dc) of one of the third power feeding portion 931, the fourth power feeding portion 932, or the second heater line 933 included in the second zone 910. In the example, the side end 923 and the side end 924 have linear shapes.

The central region 911 includes, for example, a center 915 of the second zone 910. The center 915 is the intersection between a center line RL21 of the second direction (the radial direction Dr) between the inner circumference end 921 and the outer circumference end 922 and a center line CL21 of the first direction (the circumferential direction Dc) between the side end 923 and the side end 924.

The central region 911 is the region between a center line RL22 of the second direction (the radial direction Dr) between the inner circumference end 921 and the center line RL21 and a center line RL23 of the second direction (the radial direction Dr) between the outer circumference end 922 and the center line RL21, and between a center line CL22 of the first direction (the circumferential direction Dc) between the side end 923 and the center line CL21 and a center line CL23 of the first direction (the circumferential direction Dc) between the side end 924 and the center line CL21. That is, the central region 911 is the interior of the region surrounded with the center line RL22, the center line RL23, the center line CL22, and the center line CL23.

The outer peripheral region 912 is the region positioned outward of the center line RL22, the center line RL23, the center line CL22, and the center line CL23 (that is, at the side opposite to the center 915). In other words, the outer peripheral region 912 is positioned between the center line RL22 and the inner circumference end 921, between the center line RL23 and the outer circumference end 922, between the center line CL22 and the side end 923, and between the center line CL23 and the side end 924.

In the example, the first facing region 841 of the first zone 810 is located at a position where the first facing region 841 overlaps the central region 911 of the second zone 910 in the Z-direction.

In this specification, the first facing region 841 being "located at a position where the first facing region 841 overlaps the central region 911" means that at least a portion of the first facing region 841 overlaps the central region 911 in the Z-direction. That is, the first facing region 841 is considered to be located in the central region 911 even when the first facing region 841 is located on the boundary between the central region 911 and the outer peripheral region 912. In other words, the first facing region 841 is considered to be located in the outer peripheral region 912 when no portion of the first facing region 841 overlaps the central region 911 in the Z-direction. This is similar for the second facing region 842, the third facing region 843, the fourth facing region 844, and the fifth facing region 845 as well.

When the number of zones of the heater unit 200 is increased to increase the uniformity of the in-plane temperature distribution of the process object W, the number of power feeding portions. power feeding terminals, and the like for feeding power to the zones is increased. When the number of the power feeding portions and the like is increased, the number of the protruding portions 836 provided in the heater line to avoid the power feeding portions and the like also is increased. Normally, current flows over the shortest distance, so when a current flows in the protruding portion 836 of the heater line, the current flows more easily at the inner side of the protruding portion 836 than at the outer side of the protruding portion 836. Accordingly, the generated heat amount is likely to be less at the outer side of the protruding portion 836 than at the inner side of the protruding portion 836. That is, the protruding portions 836 are likely to become cool spots.

To increase the uniformity of the in-plane temperature distribution of the heater unit 200, for example, it may be considered to dispose the protruding portions 836 so as to be dispersed in the plane of the heater unit 200. However, when the protruding portions 836 are disposed so as to be dispersed in the plane of the heater unit 200, there is a risk that the temperature control may become complex due to the dispersion of the cool spots. On the other hand, when the protruding portions 836 are disposed so as to be aggregated in the plane of the heater unit 200, there is a risk that the uniformity of the in-plane temperature distribution of the heater unit 200 may degrade due to the reduction of the temperatures at the cool spots.

In contrast, according to the embodiment, the first facing region 841 of the first zone 810 in which the first protruding portion 836a and the second protruding portion 836b are disposed so as to face and be adjacent to each other (i.e., the protruding portions 836 are aggregated) is located in a position where the first facing region 841 overlaps the central region 911, which is likely to have a higher temperature than the outer peripheral region 912 in the second zone 910. Accordingly, a drastic reduction of the temperatures at the cool spots can be suppressed by suppressing the dispersion of the cool spots and by the first facing region 841 of the first zone 810, i.e., the cool spot, overlapping the central region 911 of the second zone 910, i.e., the hotspot. That is, the temperature unevenness can be canceled. Accordingly, the uniformity of the in-plane temperature distribution of the process object W can be increased while suppressing complex temperature control.

It is favorable for at least one of the second facing region 842, the third facing region 843, the fourth facing region 844, or the fifth facing region 845 to be located at a position where the at least one of the second facing region 842, the third facing region 843, the fourth facing region 844, or the fifth facing region 845 overlaps the central region 911 of the second zone 910 in the Z-direction. Similarly to the first facing region 841, these regions also are likely to become cool spots; therefore, a drastic reduction of the temperatures at the cool spots can be suppressed by these regions overlapping the central region 911 of the second zone 910, i.e., the hotspot.

Figure 15:
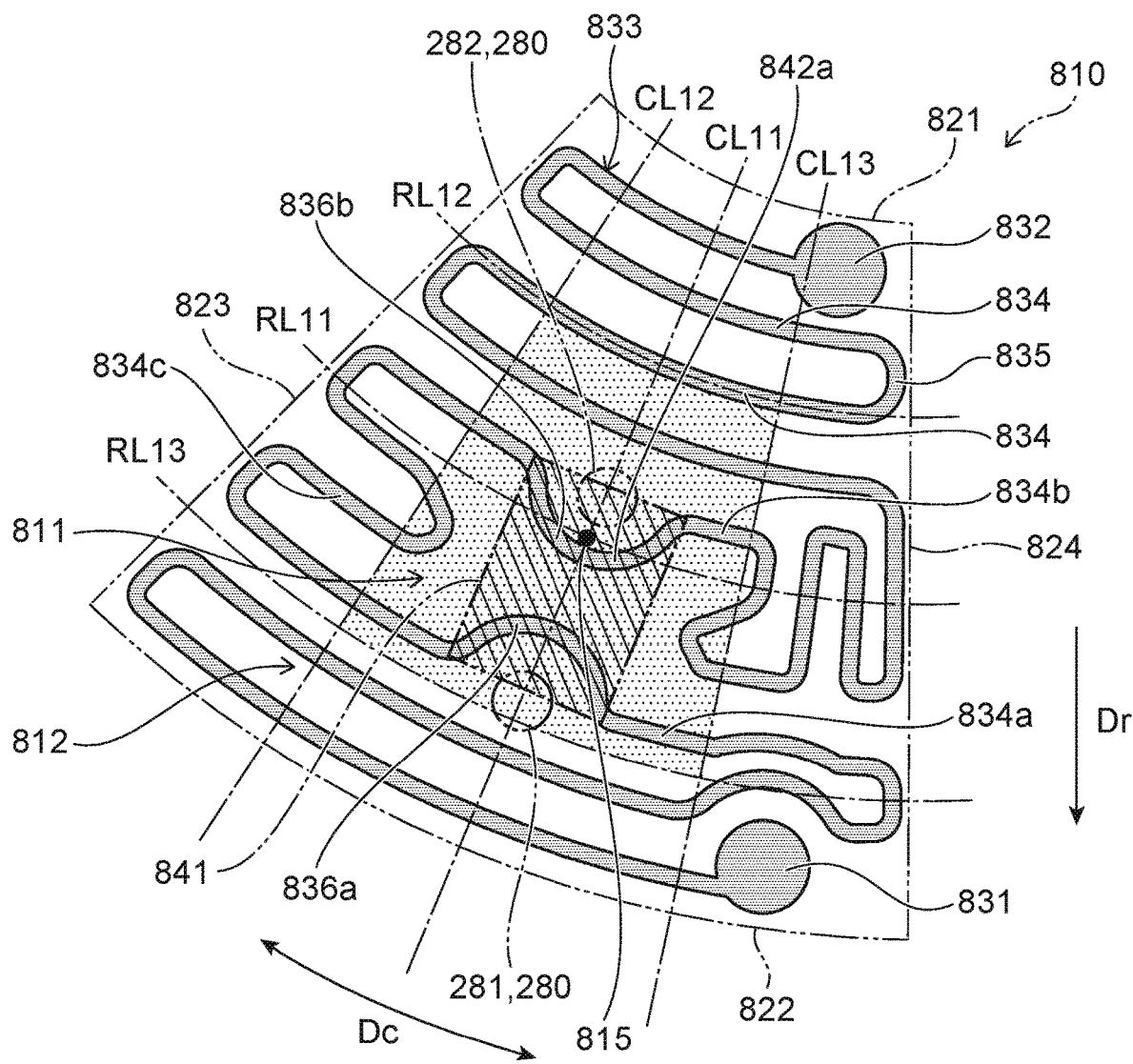
FIG. 15 is a plan view schematically illustrating a first zone of a heater unit according to a second embodiment.

FIG. 15 is a plan view schematically illustrating a first zone of a heater unit according to a second embodiment.

As illustrated in FIG. 15, the first zone 810 includes a central region 811 and an outer peripheral region 812. The central region 811 is positioned at the center of the first zone 810 when viewed in plan. The outer peripheral region 812 is positioned outside the central region 811 when viewed in plan. For example, the temperature of the central region 811 exceeds the temperature of the outer peripheral region 812 when the first zone 810 is heated.

In the example, the first zone 810 is a region surrounded with an inner circumference end 821, an outer circumference end 822, a side end 823, and a side end 824. The inner circumference end 821 overlaps one end in the second direction (the inner end portion in the radial direction Dr) of one of the first power feeding portion 831, the second power feeding portion 832, or the first heater line 833 included in the first zone 810. The outer circumference end 822 overlaps the other end in the second direction (the outer end portion in the radial direction Dr) of one of the first power feeding portion 831, the second power feeding portion 832, or the first heater line 833 included in the first zone 810. In the example, the inner circumference end 821 and the outer circumference end 822 have circular arc shapes.

The side end 823 is positioned between one end of the inner circumference end 821 and one end of the outer circumference end 822. The side end 823 overlaps one end in the first direction (the end portion at one side in the circumferential direction Dc) of one of the first power feeding portion 831, the second power feeding portion 832, or the first heater line 833 included in the first zone 810. The side end 824 is positioned between the other end of the inner circumference end 821 and the other end of the outer circumference end 822. The side end 824 overlaps the other end in the first direction (the end portion at the other side in the circumferential direction Dc) of one of the first power feeding portion 831, the second power feeding portion 832, or the first heater line 833 included in the first zone 810. In the example, the side end 823 and the side end 824 have linear shapes.

The central region 811 includes, for example, a center 815 of the first zone 810. The center 815 is the intersection between a center line RL11 of the radial direction Dr between the inner circumference end 821 and the outer circumference end 822 and a center line CL11 of the circumferential direction Dc between the side end 823 and the side end 824.

The central region 811 is a region between a center line RL12 of the second direction (the radial direction Dr) between the inner circumference end 821 and the center line RL11 and a center line RL13 of the second direction (the radial direction Dr) between the outer circumference end 822 and the center line RL11, and between a center line CL12 of the first direction (the circumferential direction Dc) between the side end 823 and the center line CL11 and a center line CL13 of the first direction (the circumferential direction Dc) between the side end 824 and the center line CL11. That is, the central region 811 is the interior of the region surrounded with the center line RL12, the center line RL13, the center line CL12, and the center line CL13.

The outer peripheral region 812 is the region positioned outward of the center line RL12, the center line RL13, the center line CL12, and the center line CL13 (that is, at the side opposite to the center 815). In other words, the outer peripheral region 812 is positioned between the center line RL12 and the inner circumference end 821, between the center line RL13 and the outer circumference end 822, between the center line CL12 and the side end 823, and between the center line CL13 and the side end 824.

In the example, the first facing region 841 of the first zone 810 is located in the central region 811 of the first zone 810.

In this specification, the first facing region 841 being "located in the central region 811" means that at least a portion of the first facing region 841 overlaps the central region 811 in the Z-direction. That is, the first facing region 841 is considered to be located in the central region 811 even when the first facing region 841 is located on the boundary between the central region 811 and the outer peripheral region 812. In other words, the first facing region 841 is considered to be located in the outer peripheral region 812 when no portion of the first facing region 841 overlaps the central region 811 in the Z-direction. This is similar for the second facing region 842, the third facing region 843, the fourth facing region 844, and the fifth facing region 845 as well.

According to the embodiment, the first facing region 841 of the first zone 810 in which the first protruding portion 836a and the second protruding portion 836b are disposed so as to face and be adjacent to each other (i.e., the protruding portions 836 are aggregated) is located in the central region 811, which is likely to have a higher temperature than the outer peripheral region 812 in the first zone 810. Accordingly, a drastic reduction of the temperatures at the cool spots can be suppressed by suppressing the dispersion of the cool spots and by providing the first facing region 841 of the first zone 810, i.e., the cool spot, in the central region 811 of the first zone 810, i.e., the hotspot. That is, the temperature unevenness can be canceled. Accordingly, the uniformity of the in-plane temperature distribution of the process object W can be increased while suppressing complex temperature control.

It is favorable for at least one of the second facing region 842, the third facing region 843, the fourth facing region 844, or the fifth facing region 845 to be located in the central region 811 of the first zone 810. Similarly to the first facing region 841, these regions also are likely to become cool spots; therefore, a drastic reduction of the temperatures at the cool spots can be suppressed by providing these regions in the central region 811 of the first zone 810, i.e., the hotspot.

In the example, the heater unit 200 also includes the first heater element including the first zone 810, the bypass layer 250 (see FIGS. 3 and 4) that is a power feeding path to the first heater element, and a first power feeding terminal 281 and a second power feeding terminal 282 electrically connected to the bypass layer 250. The first power feeding terminal 281 and the second power feeding terminal 282 are, for example, a pair of power feeding terminals 280 among the power feeding terminals 280 connected to the same bypass layer 250. Each of the first and second power feeding terminals 281 and 282 is, for example, one of the power feeding terminals 280a to 280j described above.

The first power feeding portion 831 is located at a position where the first power feeding portion 831 does not overlap the first power feeding terminal 281 in the Z-direction. The first power feeding portion 831 is electrically connected to the first power feeding terminal 281 via the bypass layer 250. The second power feeding portion 832 is located at a position where the second power feeding portion 832 does not overlap the second power feeding terminal 282 in the Z-direction. The second power feeding portion 832 is electrically connected to the second power feeding terminal 282 via the bypass layer 250.

The first facing region 841 is located at a position where the first facing region 841 overlaps at least one of the first power feeding terminal 281 or the second power feeding terminal 282 in the Z-direction. For example, the first facing region 841 is located at a position where the first facing region 841 overlaps the first and second power feeding terminals 281 and 282 in the Z-direction. For example, the first facing region 841 may be located at a position where the first facing region 841 overlaps the first power feeding terminal 281 but does not overlap the second power feeding terminal 282 in the Z-direction. For example, the first facing region 841 may be located at a position where the first facing region 841 overlaps the second power feeding terminal 282 but does not overlap the first power feeding terminal 281 in the Z-direction.

In this specification, the first facing region 841 being "located at a position where the first facing region 841 overlaps the first power feeding terminal 281" means that at least a portion of the first facing region 841 overlaps the first power feeding terminal 281 in the Z-direction. That is, the first facing region 841 is considered to be located at a position where the first facing region 841 overlaps the first power feeding terminal 281 even when the first facing region 841 is located on the boundary between the first power feeding terminal 281 and other portions. In other words, the first facing region 841 is considered to be located at a position where the first facing region 841 does not overlap the first power feeding terminal 281 when no portion of the first facing region 841 overlaps the first power feeding terminal 281 in the Z-direction. This is similar for the second power feeding terminal 282 as well. This is similar for the second facing region 842, the third facing region 843, the fourth facing region 844, and the fifth facing region 845 as well.

Even when the coolant flow path 301 for allowing a cooling medium to flow is provided inside the base plate 300, the coolant flow path 301 is not provided at a position at which the power feeding terminal 280 for feeding power to the bypass layer 250 is located. Therefore, the position at which the power feeding terminal 280 is located is difficult to cool compared to the other positions, and is likely to become a hotspot.

According to the embodiment, the first facing region 841 of the first zone 810 in which the first protruding portion 836a and the second protruding portion 836b are disposed so as to face and be adjacent to each other (i.e., the protruding portions 836 are aggregated) is located in a position where the first facing region 841 overlaps at least one of the first power feeding terminal 281 or the second power feeding terminal 282. Accordingly, a drastic reduction of the temperatures at the cool spots can be suppressed by suppressing the dispersion of the cool spots and by the first facing region 841 of the first zone 810, i.e., the cool spot, overlapping the first and second power feeding terminals 281 and 282, i.e., the hotspots. That is, the temperature unevenness can be canceled. Accordingly, the uniformity of the in-plane temperature distribution of the process object W can be increased while suppressing complex temperature control.

It is favorable for at least one of the second facing region 842, the third facing region 843, the fourth facing region 844, or the fifth facing region 845 to be located at a position where the at least one of the second facing region 842, the third facing region 843, the fourth facing region 844, or the fifth facing region 845 overlaps at least one of the first power feeding terminal 281 or the second power feeding terminal 282 in the Z-direction. Similarly to the first facing region 841, these regions also are likely to become cool spots; therefore, a drastic reduction of the temperatures at the cool spots can be suppressed by these regions overlapping the first and second power feeding terminals 281 and 282, i.e., the hotspots.

Figure 16:
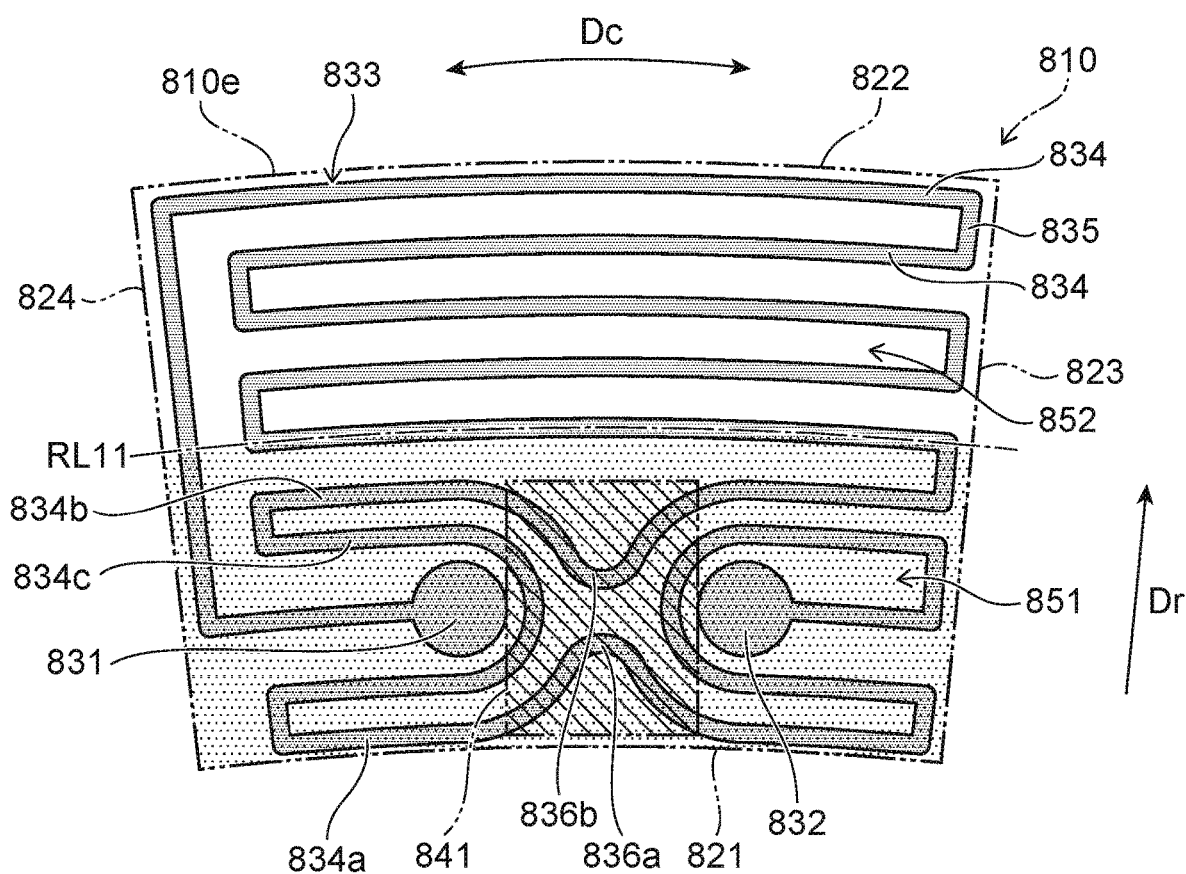
FIG. 16 is a plan view schematically illustrating a first zone of a heater unit according to a third embodiment.

FIG. 16 is a plan view schematically illustrating a first zone of a heater unit according to a third embodiment.

In the example as illustrated in FIG. 16, the first zone 810 includes an outer circumference edge 810e of the first heater element. That is, in the example, the first zone 810 is positioned at the outermost circumference portion of the first heater element. When the first zone 810 is one of the sub-zones 700, the outer circumference edge 810e is the outer circumference edge 231e of the sub-heater element 231. When the first zone 810 is one of the main zones 600, the outer circumference edge 810e is the outer circumference edge 232e of the main heater element 232.

The first zone 810 includes an inner circumference portion 851 and an outer circumference portion 852. The inner circumference portion 851 is a portion positioned at one side in the second direction (the inner side in the radial direction Dr) of the center line RL11 of the second direction (the radial direction Dr). The outer circumference portion 852 is a portion positioned at the other side in the second direction (the outer side in the radial direction Dr) of the center line RL11 of the second direction (the radial direction Dr). The outer circumference portion 852 includes the outer circumference edge 810e of the first heater element. The center line RL11 of the second direction (the radial direction Dr) passes through the center in the second direction (the radial direction Dr) between the inner circumference end 821 and the outer circumference end 822 of the first zone 810. That is, the center line RL11 of the second direction (the radial direction Dr) bisects the first zone 810 in the second direction (the radial direction Dr). For example, the temperature of the inner circumference portion 851 exceeds the temperature of the outer circumference portion 852 when the first zone 810 is heated.

In the example, the first facing region 841 of the first zone 810 is located in the inner circumference portion 851 of the first zone 810.

In this specification, the first facing region 841 being "located in the inner circumference portion 851" means that at least a portion of the first facing region 841 overlaps the inner circumference portion 851 in the Z-direction. That is, the first facing region 841 is considered to be located in the inner circumference portion 851 even when the first facing region 841 is located on the boundary between the inner circumference portion 851 and the outer circumference portion 852. In other words, the first facing region 841 is considered to be located in the outer circumference portion 852 when no portion of the first facing region 841 overlaps the inner circumference portion 851 in the Z-direction. This is similar for the second facing region 842, the third facing region 843, the fourth facing region 844, and the fifth facing region 845 as well.

According to the embodiment, the first facing region 841 of the first zone 810 in which the first protruding portion 836a and the second protruding portion 836b are disposed so as to face and be adjacent to each other (i.e., the protruding portions 836 are aggregated) is located in the inner circumference portion 851, which is likely to have a higher temperature than the outer circumference portion 852 in the first zone 810. Accordingly, a drastic reduction of the temperatures at the cool spots can be suppressed by suppressing the dispersion of the cool spots and by providing the first facing region 841 of the first zone 810, i.e., the cool spot, in the inner circumference portion 851 of the first zone 810, i.e., the hotspot. That is, the temperature unevenness can be canceled. Accordingly, the uniformity of the in-plane temperature distribution of the process object W can be increased while suppressing complex temperature control.

It is favorable for at least one of the second facing region 842, the third facing region 843, the fourth facing region 844, or the fifth facing region 845 to be located in the inner circumference portion 851 of the first zone 810. Similarly to the first facing region 841, these regions also are likely to become cool spots; therefore, a drastic reduction of the temperatures at the cool spots can be suppressed by providing these regions in the inner circumference portion 851 of the first zone 810, i.e., the hotspot.

It is favorable for the multiple zones of the first heater element including the first zone 810 to be divided in the radial direction Dr, and for the first direction to be the circumferential direction Dc. The control of the in-plane temperature of the process object W can be efficiently performed thereby.

It is also favorable for the multiple zones of the first heater element including the first zone 810 to be divided in the radial direction Dr, and for the first direction to be the radial direction Dr. The control of the in-plane temperature of the process object W can be efficiently performed thereby.

As described above, the first protruding portion 836a and the second protruding portion 836b are disposed so as to face and be adjacent to each other. Therefore, there are cases where the shortest distance between the first extension portion 834a and the second extension portion 834b is greater than the shortest distance when the first protruding portion 836a and the second protruding portion 836b are not formed. It is therefore favorable for the multiple extension portions 834 of the first zone 810 to include the third extension portion 834c positioned between the first extension portion 834a and the second extension portion 834b in the second direction. Accordingly, the third extension portion 834c can prevent the gap between the first extension portion 834a and the second extension portion 834b from becoming too wide. In such a case, it is favorable for the third extension portion 834c to be located at a position where the third extension portion 834c does not overlap the first and second protruding portions 836a and 836b in the second direction. Accordingly, the area of the first facing region 841 can be relatively small. Accordingly, the uniformity of the in-plane temperature distribution of the process object W can be increased.

There are cases where the multiple protruding portions 836 of the first zone 810 include the third protruding portion 836c that is provided in the first extension portion 834a and protrudes toward the second protruding portion 836b. In such a case, it is favorable for the third protruding portion 836c to be disposed so as to face and be adjacent to the second protruding portion 836b. Thus, the number of cool spots in the entire plane can be relatively low by disposing a region (the second facing region 842) in which the second protruding portion 836b and the third protruding portion 836c are aggregated proximate to the first facing region 841. Accordingly, the uniformity of the in-plane temperature distribution of the process object W can be increased while suppressing complex temperature control.

Figure 17:
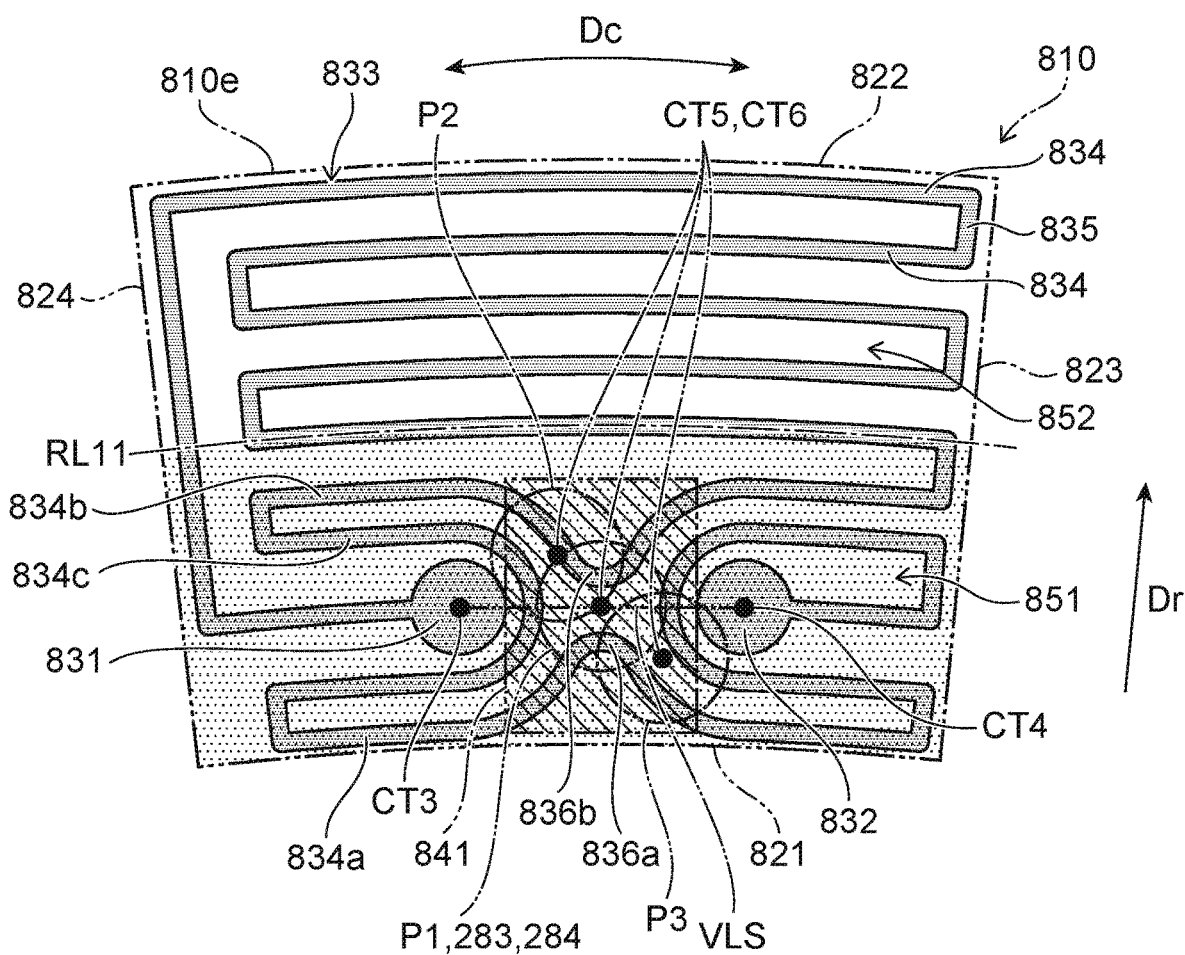
FIG. 17 is a plan view schematically illustrating a first zone of a heater unit according to a fourth embodiment.

FIG. 17 is a plan view schematically illustrating a first zone of a heater unit according to a fourth embodiment.

In the example, the heater unit 200 includes the first heater element including the first zone 810, the second heater element including the second zone 910, the bypass layer 250 (see FIGS. 3 and 4) that is a power feeding path to the first and second heater elements, and the first power feeding terminal 281, the second power feeding terminal 282, a third power feeding terminal 283, and a fourth power feeding terminal 284 electrically connected to the bypass layer 250. The first power feeding terminal 281 and the second power feeding terminal 282 are, for example, a pair of power feeding terminals 280 among the power feeding terminals 280 connected to the same bypass layer 250. The third power feeding terminal 283 and the fourth power feeding terminal 284 are, for example, a pair of power feeding terminals 280 among the power feeding terminals 280 connected to the same bypass layer 250. Each of the first power feeding terminal 281, the second power feeding terminal 282, the third power feeding terminal 283, and the fourth power feeding terminal 284 is, for example, one of the power feeding terminals 280a to 280j described above.

The first power feeding portion 831 of the first zone 810 is located at a position where the first power feeding portion 831 does not overlap the first power feeding terminal 281 in the Z-direction. The first power feeding portion 831 is electrically connected to the first power feeding terminal 281 via the bypass layer 250. The second power feeding portion 832 of the first zone 810 is located at a position where the second power feeding portion 832 does not overlap the second power feeding terminal 282 in the Z-direction. The second power feeding portion 832 is electrically connected to the second power feeding terminal 282 via the bypass layer 250.

The third power feeding portion 931 of the second zone 910 is located at a position where the third power feeding portion 931 does not overlap the third power feeding terminal 283 in the Z-direction. The third power feeding portion 931 is electrically connected to the third power feeding terminal 283 via the bypass layer 250. The fourth power feeding portion 932 of the second zone 910 is located at a position where the fourth power feeding portion 932 does not overlap the fourth power feeding terminal 284 in the Z-direction. The fourth power feeding portion 932 is electrically connected to the fourth power feeding terminal 284 via the bypass layer 250.

In the example, at least one of the third power feeding terminal 283 or the fourth power feeding terminal 284 is located at a position where the at least one of the third power feeding terminal 283 or the fourth power feeding terminal 284 overlaps a virtual line segment VLS in the Z-direction; and the virtual line segment VLS connects a center CT3 of the first power feeding portion 831 and a center CT4 of the second power feeding portion 832. As shown, such VLS is a straight line which connects the centers CT3 and CT4 at a shortest distance because it is a straight line.

In this specification, the third power feeding terminal 283 being "located at a position where the third power feeding terminal 283 overlaps the virtual line segment VLS" means that at least a portion of the third power feeding terminal 283 overlaps the virtual line segment VLS in the Z-direction. That is, the third power feeding terminal 283 is considered to be located at a position where the third power feeding terminal 283 overlaps the virtual line segment VLS not only when the third power feeding terminal 283 is at a position P1, but also when the third power feeding terminal 283 is at a position P2 and when the third power feeding terminal 283 is at a position P3. A center CT5 of the third power feeding terminal 283 overlaps the virtual line segment VLS when the third power feeding terminal 283 is at the position P1. The center CT5 of the third power feeding terminal 283 does not overlap the virtual line segment VLS when the third power feeding terminal 283 is at the position P2 or the position P3. This is similar for the fourth power feeding terminal 284 as well. A center CT6 of the fourth power feeding terminal 284 overlaps the virtual line segment VLS when the fourth power feeding terminal 284 is at the position P1. The center CT6 of the fourth power feeding terminal 284 does not overlap the virtual line segment VLS when the fourth power feeding terminal 284 is at the position P2 or the position P3.

According to the embodiment, at least one of the third power feeding terminal 283 or the fourth power feeding terminal 284 for feeding power to the second heater element via the bypass layer 250 is located at a position where the at least one of the third power feeding terminal 283 or the fourth power feeding terminal 284 overlaps the virtual line segment VLS connecting the center CT3 of the first power feeding portion 831 and the center CT4 of the second power feeding portion 832 that feed power to the first heater line 833. Accordingly, the temperature unevenness can be canceled by providing the third power feeding terminal 283 and the fourth power feeding terminal 284, i.e., the hotspots, between the first power feeding portion 831 and the second power feeding portion 832, i.e., the cool spots. Accordingly, the uniformity of the in-plane temperature distribution of the process object W can be increased while suppressing complex temperature control.

It is favorable for at least one of the center CT5 of the third power feeding terminal 283 or the center CT6 of the fourth power feeding terminal 284 to be located at a position where the at least one of the center CT5 of the third power feeding terminal 283 or the center CT6 of the fourth power feeding terminal 284 overlaps the virtual line segment VLS. That is, it is favorable for at least one of the center CT5 of the third power feeding terminal 283 or the fourth power feeding terminal 284 to be at the position P1. The uniformity of the in-plane temperature distribution of the process object W can be increased thereby.

In the example, the first zone 810 includes the outer circumference edge 810e of the first heater element. That is, in the example, the first zone 810 is positioned at the outermost circumference portion of the first heater element. In the example, the first zone 810 includes the inner circumference portion 851 and the outer circumference portion 852. The inner circumference portion 851 and the outer circumference portion 852 are substantially the same as the inner circumference portion 851 and the outer circumference portion 852 of FIG. 16 above, and a description is therefore omitted.

In the example, both the first and second power feeding portions 831 and 832 are located in the inner circumference portion 851 of the first zone 810. When the first zone 810 is positioned at the outermost circumference portion of the first heater element, it is favorable for at least one of the first power feeding portion 831 or the second power feeding portion 832 to be located in the inner circumference portion 851 of the first zone 810.

In this specification, the first power feeding portion 831 being "located in the inner circumference portion 851" means that at least a portion of the first power feeding portion 831 overlaps the inner circumference portion 851 in the Z-direction. That is, the first power feeding portion 831 is considered to be located in the inner circumference portion 851 even when the first power feeding portion 831 is located on the boundary between the inner circumference portion 851 and the outer circumference portion 852. In other words, the first power feeding portion 831 is considered to be located in the outer circumference portion 852 when no portion of the first power feeding portion 831 overlaps the inner circumference portion 851 in the Z-direction. This is similar for the second power feeding portion 832, the third power feeding portion 931, and the fourth power feeding portion 932 as well.

According to the embodiment, when the first zone 810 includes the outer circumference edge 810e of the first heater element (i.e., the first zone 810 is positioned at the outermost circumference portion of the first heater element), at least one of the first power feeding portion 831 or the second power feeding portion 832 is located in the inner circumference portion 851, which is likely to have a higher temperature than the outer circumference portion 852 in the first zone 810. Accordingly, a drastic reduction of the temperatures at the cool spots can be suppressed by providing the first power feeding portion 831 and the second power feeding portion 832, i.e., the cool spots, in the inner circumference portion 851 of the first zone 810, i.e., the hotspot. That is, the temperature unevenness can be canceled. Accordingly, the uniformity of the in-plane temperature distribution of the process object W can be increased.

Figure 18:
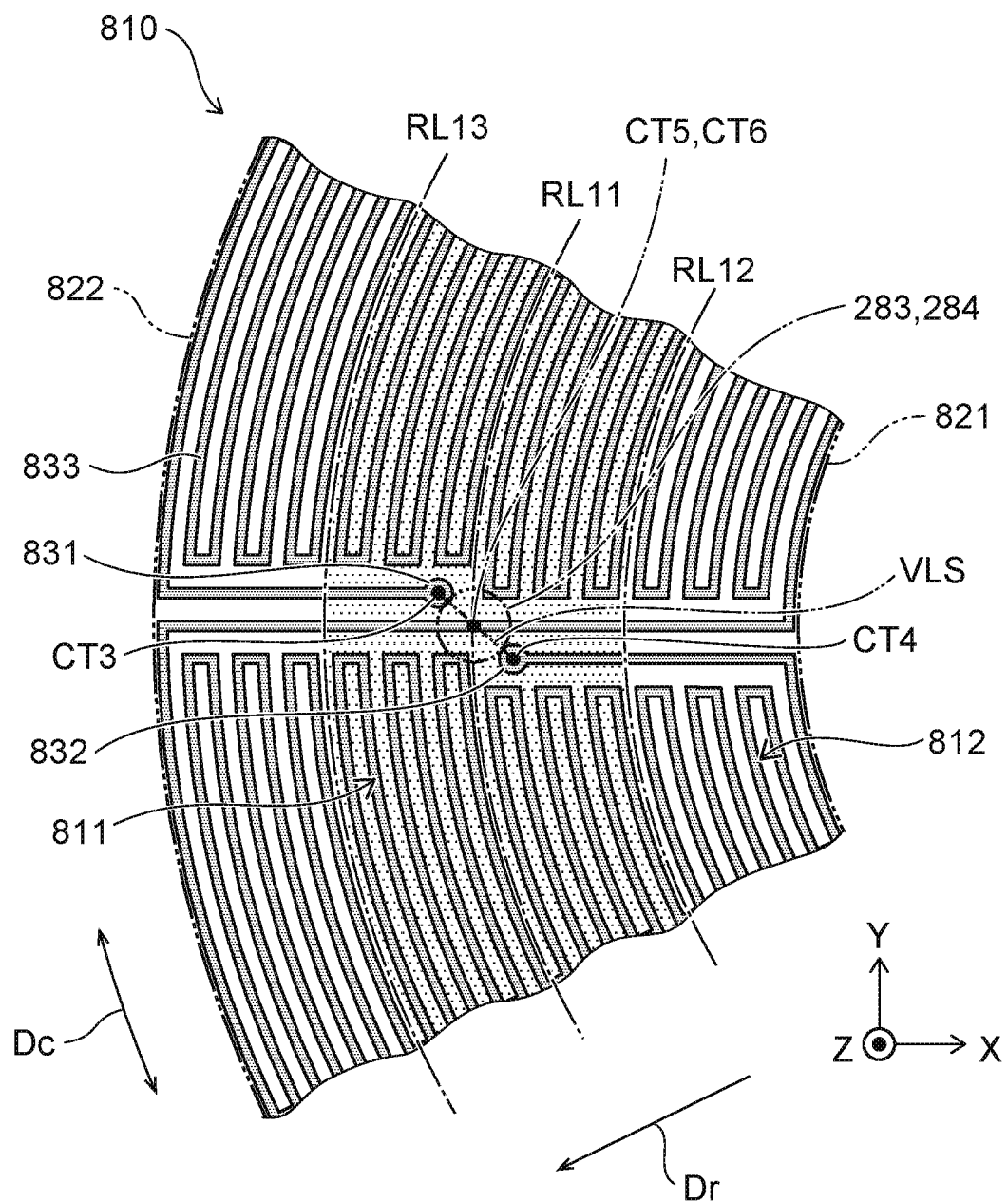
FIG. 18 is a plan view schematically illustrating a first zone of a heater unit according to a fifth embodiment.

FIG. 18 is a plan view schematically illustrating a first zone of a heater unit according to a fifth embodiment.

In the example as illustrated in FIG. 18, the first power feeding portion 831 and the second power feeding portion 832 are located in the central region 811 of the first zone 810. Otherwise, the first zone of the heater unit according to the fifth embodiment is substantially the same as the first zone of the heater unit according to the fourth embodiment illustrated in FIG. 17.

More specifically, the first zone 810 includes the central region 811 and the outer peripheral region 812. In the example, the central region 811 is the region between the center line RL12 and the center line RL13. That is, the central region 811 is the interior of the region surrounded with the center lines RL12 and RL13. The outer peripheral region 812 is positioned between the center line RL12 and the inner circumference end 821 and between the center line RL13 and the outer circumference end 822. Otherwise, the central region 811 and the outer peripheral region 812 are substantially the same as the central region 811 and the outer peripheral region 812 of FIG. 15 above.

In the example, both the first and second power feeding portions 831 and 832 are located in the central region 811 of the first zone 810. It is favorable for at least one of the first power feeding portion 831 or the second power feeding portion 832 to be located in the central region 811 of the first zone 810.

In this specification, the first power feeding portion 831 being "located in the central region 811" means that at least a portion of the first power feeding portion 831 overlaps the central region 811 in the Z-direction. That is, the first power feeding portion 831 is considered to be located in the central region 811 even when the first power feeding portion 831 is located on the boundary between the central region 811 and the outer peripheral region 812. In other words, the first power feeding portion 831 is considered to be located in the outer peripheral region 812 when no portion of the first power feeding portion 831 overlaps the central region 811 in the Z-direction. This is similar for the second power feeding portion 832, the third power feeding portion 931, and the fourth power feeding portion 932 as well.

According to the embodiment, at least one of the first power feeding portion 831 or the second power feeding portion 832 is located in the central region 811, which is likely to have a higher temperature than the outer peripheral region 812 in the first zone 810. Accordingly, a drastic reduction of the temperatures at the cool spots can be suppressed by the first and second power feeding portions 831 and 832, i.e., the cool spots, overlapping the central region 811 of the first zone 810, i.e., the hotspot. That is, the temperature unevenness can be canceled. Accordingly, the uniformity of the in-plane temperature distribution of the process object W can be increased.

In the example as well, at least one of the third power feeding terminal 283 or the fourth power feeding terminal 284 for feeding power to the second heater element via the bypass layer 250 is located at a position where the at least one of the third power feeding terminal 283 or the fourth power feeding terminal 284 overlaps the virtual line segment VLS connecting the center CT3 of the first power feeding portion 831 and the center CT4 of the second power feeding portion 832 that feed power to the first heater line 833. Accordingly, the temperature unevenness can be canceled by providing the third power feeding terminal 283 and the fourth power feeding terminal 284, i.e., the hotspots, between the first power feeding portion 831 and the second power feeding portion 832, i.e., the cool spots. Accordingly, the uniformity of the in-plane temperature distribution of the process object W can be increased while suppressing complex temperature control.

Embodiments may include the following configurations.
(Configuration 1)
An electrostatic chuck, comprising:
a ceramic dielectric substrate having a first major surface configured to have a process object placed thereon and a second major surface opposite to the first major surface;
a base plate having an upper surface and a lower surface, the upper surface being at the ceramic dielectric substrate side, the lower surface being opposite to the upper surface, the base plate supporting the ceramic dielectric substrate; and
a heater unit which heats the ceramic dielectric substrate, the heater unit including a first heater element and a second heater element,
the first heater element being located between the first major surface and the upper surface,
the second heater element being located between the first major surface and the first heater element or between the first heater element and the upper surface,
the first heater element including a plurality of zones,
the plurality of zones of the first heater element including a first zone,
the first zone including
a first heater line emitting heat by allowing a current to flow, and
a first power feeding portion and a second power feeding portion feeding power to the first heater line,
the first heater line including a plurality of extension portions extending along a first direction, the plurality of extension portions being arranged
in a second direction perpendicular to the first direction, and a plurality of protruding portions provided in the plurality of extension portions, the plurality of protruding portions protruding in the second direction,
the plurality of extension portions including a first extension portion and a second extension portion,
the plurality of protruding portions including
a first protruding portion provided in the first extension portion, and
a second protruding portion provided in the second extension portion,
the first protruding portion protruding toward the second protruding portion,
the second protruding portion protruding toward the first protruding portion,
the first zone including a first facing region in which the first protruding portion and the second protruding portion are disposed so as to face and be adjacent to each other,
the second heater element including a plurality of zones,
the plurality of zones of the second heater element including a second zone,
the second zone including
a second heater line emitting heat by allowing a current to flow, and
a third power feeding portion and a fourth power feeding portion feeding power to the second heater line,
the second zone including
a central region positioned at a center of the second zone when viewed along a Z-direction perpendicular to the first major surface, and
an outer peripheral region positioned outside the central region,
the first facing region being located at a position where the first facing region overlaps the central region in the Z-direction.

(Configuration 2)

An electrostatic chuck, comprising:
a ceramic dielectric substrate having a first major surface configured to have a process object placed thereon and a second major surface opposite to the first major surface;
a base plate having an upper surface and a lower surface, the upper surface being at the ceramic dielectric substrate side, the lower surface being opposite to the upper surface, the base plate supporting the ceramic dielectric substrate; and
a heater unit which heats the ceramic dielectric substrate, the heater unit including a first heater element,
the first heater element being located between the first major surface and the upper surface,
the first heater element including a plurality of zones,
the plurality of zones of the first heater element including a first zone,
the first zone including
a first heater line emitting heat by allowing a current to flow, and
a first power feeding portion and a second power feeding portion feeding power to the first heater line,
the first heater line including
a plurality of extension portions extending along a first direction, the plurality of extension portions being arranged in a second direction perpendicular to the first direction, and
a plurality of protruding portions provided in the plurality of extension portions, the plurality of protruding portions protruding in the second direction,
the plurality of extension portions including a first extension portion and a second extension portion,
the plurality of protruding portions including
a first protruding portion provided in the first extension portion, and
a second protruding portion provided in the second extension portion,
the first protruding portion protruding toward the second protruding portion,
the second protruding portion protruding toward the first protruding portion,
the first zone including a first facing region in which the first protruding portion and the second protruding portion are disposed so as to face and be adjacent to each other,
the first zone including
a central region positioned at a center of the first zone when viewed along a Z-direction perpendicular to the first major surface, and
an outer peripheral region positioned outside the central region when viewed along the Z-direction, the first facing region being located in the central region.

(Configuration 3)

An electrostatic chuck, comprising:
a ceramic dielectric substrate having a first major surface configured to have a process object placed thereon and a second major surface opposite to the first major surface;
a base plate having an upper surface and a lower surface, the upper surface being at the ceramic dielectric substrate side, the lower surface being opposite to the upper surface, the base plate supporting the ceramic dielectric substrate; and
a heater unit which heats the ceramic dielectric substrate, the heater unit including a first heater element,
the first heater element being located between the first major surface and the upper surface,
the first heater element including a plurality of zones, the plurality of zones being divided in a radial direction,
the plurality of zones of the first heater element including a first zone,
the first zone including
a first heater line emitting heat by allowing a current to flow, and
a first power feeding portion and a second power feeding portion feeding power to the first heater line,
the first heater line including
a plurality of extension portions extending along a first direction, the plurality of extension portions being arranged in a second direction perpendicular to the first direction, and
a plurality of protruding portions provided in the plurality of extension portions, the plurality of protruding portions protruding in the second direction,
the plurality of extension portions including a first extension portion and a second extension portion,
the plurality of protruding portions including
a first protruding portion provided in the first extension portion, and a second protruding portion provided in the second extension portion,
the first protruding portion protruding toward the second protruding portion,
the second protruding portion protruding toward the first protruding portion,
the first zone including a first facing region in which the first protruding portion and the second protruding portion are disposed so as to face and be adjacent to each other,
the first zone includes an outer circumference edge of the first heater element,
the first zone includes:
   an inner circumference portion positioned radially inward of a center line of a radial direction, the center line of the radial direction bisecting the first zone in the radial direction; and
   an outer circumference portion positioned radially outward of the center line of the radial direction, the outer circumference portion including the outer circumference edge, and
the first facing region being located in the inner circumference portion.

(Configuration 4)
The chuck according to any one of configurations 1 to 3, wherein
the plurality of zones of the first heater element is divided in a radial direction, and
the first direction is a circumferential direction.

(Configuration 5)
The chuck according to any one of configurations 1 to 3, wherein
the plurality of zones of the first heater element is divided in a radial direction, and
the first direction is the radial direction.

(Configuration 6)
The chuck according to any one of configurations 1 to 5, wherein
the plurality of extension portions further includes a third extension portion positioned between the first extension portion and the second extension portion in the second direction, and
the third extension portion is located at a position where the third extension portion does not overlap the first and second protruding portions in the second direction.

(Configuration 7)
The chuck according to any one of configurations 1 to 6, wherein
the plurality of protruding portions further includes a third protruding portion provided in the first extension portion,
the third protruding portion protrudes toward the second protruding portion, and
the third protruding portion is disposed so as to face the second protruding portion and to be adjacent to the second protruding portion.

(Configuration 8)
An electrostatic chuck, comprising:
a ceramic dielectric substrate having a first major surface configured to have a process object placed thereon and a second major surface opposite to the first major surface;
a base plate having an upper surface and a lower surface, the upper surface being at the ceramic dielectric substrate side, the lower surface being opposite to the upper surface, the base plate supporting the ceramic dielectric substrate; and
a heater unit which heats the ceramic dielectric substrate, the heater unit including a first heater element,
the first heater element being located between the first major surface and the upper surface,
the first heater element including a plurality of zones,
the plurality of zones of the first heater element including a first zone,
the first zone including
   a first heater line emitting heat by allowing a current to flow, and
   a first power feeding portion and a second power feeding portion feeding power to the first heater line,
the first heater line including a first protruding portion and a second protruding portion that are curved,
a curve direction of the first protruding portion being the opposite of a curve direction of the second protruding portion,
the first zone including a first facing region in which the first protruding portion and the second protruding portion are disposed so as to face and be adjacent to each other,
the first zone including
   a central region positioned at a center of the first zone when viewed along a Z-direction perpendicular to the first major surface, and
   an outer peripheral region positioned outside the central region when viewed along the Z-direction,
the first facing region being located in the central region.

(Configuration 9)
An electrostatic chuck, comprising:
a ceramic dielectric substrate having a first major surface configured to have a process object placed thereon and a second major surface opposite to the first major surface;
a base plate having an upper surface, a lower surface, and a coolant flow path, the upper surface being at the ceramic dielectric substrate side, the lower surface being opposite to the upper surface, the coolant flow path allowing a cooling medium to flow, the base plate supporting the ceramic dielectric substrate; and
a heater unit which heats the ceramic dielectric substrate, the heater unit including
   a first heater element,
   a bypass layer that is a power feeding path to the first heater elements, and
   a first power feeding terminal and a second power feeding terminal electrically connected to the bypass layer,
the first heater element being located between the first major surface and the upper surface,
the first heater element including a plurality of zones,
the plurality of zones of the first heater element including a first zone,
the first zone including
   a first heater line emitting heat by allowing a current to flow, and
   a first power feeding portion and a second power feeding portion feeding power to the first heater line,
the first power feeding portion being located at a position where the first power feeding portion does not overlap the first power feeding terminal in a Z-direction perpendicular to the first major surface,
the first power feeding portion being electrically connected to the first power feeding terminal via the bypass layer, the second power feeding portion being located at a position where the second power feeding portion does not overlap the second power feeding terminal in the Z-direction,
the second power feeding portion being electrically connected to the second power feeding terminal via the bypass layer,
the first heater line including
a plurality of extension portions extending along a first direction, the plurality of extension portions being arranged in a second direction perpendicular to the first direction, and
a plurality of protruding portions provided in the plurality of extension portions, the plurality of protruding portions protruding in the second direction,
the plurality of extension portions including a first extension portion and a second extension portion,
the plurality of protruding portions including
a first protruding portion provided in the first extension portion, and
a second protruding portion provided in the second extension portion,
the first protruding portion protruding toward the second protruding portion,
the second protruding portion protruding toward the first protruding portion,
the first zone including a first facing region in which the first protruding portion and the second protruding portion are disposed so as to face and be adjacent to each other,
the first facing region is located at a position where the first facing region overlaps at least one of the first power feeding terminal or the second power feeding terminal in the Z-direction.

(Configuration 10)
The chuck according to configuration 15 or 16, wherein the first zone includes
a central region positioned at a center of the first zone when viewed along the Z-direction, and
an outer peripheral region positioned outside the central region when viewed along the Z-direction, and
the first facing region being located in the central region.

(Configuration 11)
The chuck according to configuration 9 or 10, wherein the plurality of zones of the first heater element is divided in a radial direction, and
the first direction is a circumferential direction.

(Configuration 12)
The chuck according to configuration 9 or 10, wherein the plurality of zones of the first heater element is divided in a radial direction, and
the first direction is the radial direction.

(Configuration 13)
The chuck according to any one of configurations 9 to 12, wherein
the plurality of extension portions further includes a third extension portion positioned between the first extension portion and the second extension portion in the second direction, and
the third extension portion is located at a position where the third extension portion does not overlap the first and second protruding portions in the second direction.

(Configuration 14)
The chuck according to configurations 9 to 13, wherein the plurality of protruding portions further includes a third protruding portion provided in the first extension portion,
the third protruding portion protrudes toward the second protruding portion, and
the third protruding portion is disposed so as to face the second protruding portion and to be adjacent to the second protruding portion.

(Configuration 15)
An electrostatic chuck, comprising:
a ceramic dielectric substrate having a first major surface configured to have a process object placed thereon and a second major surface opposite to the first major surface;
a base plate having an upper surface, a lower surface, and a coolant flow path, the upper surface being at the ceramic dielectric substrate side, the lower surface being opposite to the upper surface, the coolant flow path allowing a cooling medium to flow, the base plate supporting the ceramic dielectric substrate; and
a heater unit which heats the ceramic dielectric substrate, the heater unit including
a first heater element,
a second heater element,
a bypass layer that is a power feeding path to the first and second heater elements, and
a first power feeding terminal, a second power feeding terminal, a third power feeding terminal, and a fourth power feeding terminal electrically connected to the bypass layer,
the first heater element being located between the first major surface and the upper surface,
the second heater element being located between the first major surface and the first heater element or between the first heater element and the upper surface,
the first heater element including a plurality of zones,
the plurality of zones of the first heater element including a first zone,
the first zone including
a first heater line emitting heat by allowing a current to flow, and
a first power feeding portion and a second power feeding portion feeding power to the first heater line,
the first power feeding portion being located at a position where the first power feeding portion does not overlap the first power feeding terminal in a Z-direction perpendicular to the first major surface,
the first power feeding portion being electrically connected to the first power feeding terminal via the bypass layer,
the second power feeding portion being located at a position where the second power feeding portion does not overlap the second power feeding terminal in the Z-direction,
the second power feeding portion being electrically connected to the second power feeding terminal via the bypass layer,
the second heater element including a plurality of zones,
the plurality of zones of the second heater element including a second zone,
the second zone including
a second heater line emitting heat by allowing a current to flow, and
a third power feeding portion and a fourth power feeding portion feeding power to the second heater line,
the third power feeding portion being located at a position where the third power feeding portion does not overlap the third power feeding terminal in the Z-direction, the third power feeding portion being electrically connected to the third power feeding terminal via the bypass layer, the fourth power feeding portion being located at a position where the fourth power feeding portion does not overlap the fourth power feeding terminal in the Z-direction, the fourth power feeding portion being electrically connected to the fourth power feeding terminal via the bypass layer, at least one of the third power feeding terminal or the fourth power feeding terminal being located at a position where the at least one of the third power feeding terminal or the fourth power feeding terminal overlaps a virtual line segment in the Z-direction, the virtual line segment connecting a center of the first power feeding portion and a center of the second power feeding portion.

(Configuration 16)

The chuck according to configuration 15, wherein at least one of a center of the third power feeding terminal or a center of the fourth power feeding terminal is located at a position where the at least one of the center of the third power feeding terminal or the center of the fourth power feeding terminal overlaps the virtual line segment.

(Configuration 17)

The chuck according to configuration 15 or 16, wherein the first zone includes a central region positioned at a center of the first zone when viewed along the Z-direction, and an outer peripheral region positioned outside the central region when viewed along the Z-direction, and at least one of the first power feeding portion or the second power feeding portion is located in the central region.

(Configuration 18)

The chuck according to configuration 15 or 16, wherein the first zone includes an outer circumference edge of the first heater element, the first zone includes:

an inner circumference portion positioned radially inward of a center line of a radial direction, the center line of the radial direction bisecting the first zone in the radial direction; and an outer circumference portion positioned radially outward of the center line of the radial direction, the outer circumference portion including the outer circumference edge, and at least one of the first power feeding portion or the second power feeding portion is located in the inner circumference portion.

Thus, according to embodiments, an electrostatic chuck is provided in which the uniformity of the in-plane temperature distribution of the process object can be increased while suppressing complex temperature control.

The invention has been described with reference to the embodiments. However, the invention is not limited to these embodiments. Any design changes in the above embodiments suitably made by those skilled in the art are also encompassed within the scope of the invention as long as they fall within the spirit of the invention. For example, the shape, the size the material, the disposition and the arrangement or the like of the components included in the electrostatic chuck are not limited to illustrations and can be changed appropriately.

The components included in the embodiments described above can be combined to the extent possible, and these combinations are also encompassed within the scope of the invention as long as they include the features of the invention.

What is claimed is:

1. An electrostatic chuck, comprising:

a ceramic dielectric substrate having a first major surface configured to have a process object placed thereon and a second major surface opposite to the first major surface;

a base plate having an upper surface and a lower surface, the upper surface being at the ceramic dielectric substrate side, the lower surface being opposite to the upper surface, the base plate supporting the ceramic dielectric substrate; and a heater unit which heats the ceramic dielectric substrate, the heater unit including a first heater element and a second heater element, the first heater element being located between the first major surface and the upper surface, the second heater element being located between the first major surface and the first heater element or between the first heater element and the upper surface, the first heater element including a plurality of zones, the plurality of zones of the first heater element including a first zone, the first zone including a first heater line emitting heat by allowing a current to flow, and a first power feeding portion and a second power feeding portion feeding power to the first heater line, the first heater line including a plurality of extension portions extending along a first direction, the plurality of extension portions being arranged in a second direction perpendicular to the first direction, and a plurality of protruding portions provided in the plurality of extension portions, the plurality of protruding portions protruding in the second direction, the plurality of extension portions including a first extension portion and a second extension portion, the plurality of protruding portions including a first protruding portion provided in the first extension portion, and a second protruding portion provided in the second extension portion, the first protruding portion protruding toward the second protruding portion, the second protruding portion protruding toward the first protruding portion, the first zone including a first facing region in which the first protruding portion and the second protruding portion are disposed so as to face and be adjacent to each other, the second heater element including a plurality of zones, the plurality of zones of the second heater element including a second zone, the second zone including a second heater line emitting heat by allowing a current to flow, and a third power feeding portion and a fourth power feeding portion feeding power to the second heater line, the second zone including a central region positioned at a center of the second zone when viewed along a Z-direction perpendicular to the first major surface, and an outer peripheral region positioned outside the central region, the first facing region being located at a position where the first facing region overlaps the central region in the Z-direction.

2. The electrostatic chuck according to claim 1, wherein the plurality of zones of the first heater element is divided in a radial direction, and the first direction is a circumferential direction.

3. The electrostatic chuck according to claim 1, wherein the plurality of zones of the first heater element is divided in a radial direction, and the first direction is the radial direction.

4. The electrostatic chuck according to claim 1, wherein the plurality of extension portions further includes a third extension portion positioned between the first extension portion and the second extension portion in the second direction, and the third extension portion is located at a position where the third extension portion does not overlap the first and second protruding portions in the second direction.

5. The electrostatic chuck according to claim 1, wherein the plurality of protruding portions further includes a third protruding portion provided in the first extension portion, the third protruding portion protrudes toward the second protruding portion, and the third protruding portion is disposed so as to face the second protruding portion and to be adjacent to the second protruding portion.

6. An electrostatic chuck, comprising:

a ceramic dielectric substrate having a first major surface configured to have a process object placed thereon and a second major surface opposite to the first major surface;

a base plate having an upper surface and a lower surface, the upper surface being at the ceramic dielectric substrate side, the lower surface being opposite to the upper surface, the base plate supporting the ceramic dielectric substrate; and a heater unit which heats the ceramic dielectric substrate, the heater unit including a first heater element, the first heater element being located between the first major surface and the upper surface, the first heater element including a plurality of zones, the plurality of zones of the first heater element including a first zone, the first zone including a first heater line emitting heat by allowing a current to flow, and a first power feeding portion and a second power feeding portion feeding power to the first heater line, the first heater line including a plurality of extension portions extending along a first direction, the plurality of extension portions being arranged in a second direction perpendicular to the first direction, and a plurality of protruding portions provided in the plurality of extension portions, the plurality of protruding portions protruding in the second direction, the plurality of extension portions including a first extension portion and a second extension portion, the plurality of protruding portions including a first protruding portion provided in the first extension portion, and a second protruding portion provided in the second extension portion, the first protruding portion protruding toward the second protruding portion, the second protruding portion protruding toward the first protruding portion, the first zone including a first facing region in which the first protruding portion and the second protruding portion are disposed so as to face and be adjacent to each other, the first zone including a central region positioned at a center of the first zone when viewed along a Z-direction perpendicular to the first major surface, and an outer peripheral region positioned outside the central region when viewed along the Z-direction, the first facing region being located in the central region.

7. The electrostatic chuck according to claim 6, wherein the plurality of zones of the first heater element is divided in a radial direction, and the first direction is a circumferential direction.

8. The electrostatic chuck according to claim 6, wherein the plurality of zones of the first heater element is divided in a radial direction, and the first direction is the radial direction.

9. The electrostatic chuck according to claim 6, wherein the plurality of extension portions further includes a third extension portion positioned between the first extension portion and the second extension portion in the second direction, and the third extension portion is located at a position where the third extension portion does not overlap the first and second protruding portions in the second direction.

10. The electrostatic chuck according to claim 6, wherein the plurality of protruding portions further includes a third protruding portion provided in the first extension portion, the third protruding portion protrudes toward the second protruding portion, and the third protruding portion is disposed so as to face the second protruding portion and to be adjacent to the second protruding portion.

11. The electrostatic chuck according to claim 6, wherein the base plate further includes a coolant flow path for allowing a cooling medium to flow, the heater unit further includes:

a bypass layer that is a power feeding path to the first heater element; and a first power feeding terminal and a second power feeding terminal electrically connected to the bypass layer, the first power feeding portion is located at a position where the first power feeding portion does not overlap the first power feeding terminal in a Z-direction perpendicular to the first major surface, the first power feeding portion is electrically connected to the first power feeding terminal via the bypass layer, the second power feeding portion is located at a position where the second power feeding portion does not overlap the second power feeding terminal in the Z-direction, the second power feeding portion is electrically connected to the second power feeding terminal via the bypass layer, and the first facing region is located at a position where the first facing region overlaps at least one of the first power feeding terminal or the second power feeding terminal in the Z-direction.

12. The electrostatic chuck according to claim 11, wherein the plurality of zones of the first heater element is divided in a radial direction, and
the first direction is a circumferential direction.

13. The electrostatic chuck according to claim 11, wherein the plurality of zones of the first heater element is divided in a radial direction, and
the first direction is the radial direction.

14. The electrostatic chuck according to claim 11, wherein the plurality of extension portions further includes a third extension portion positioned between the first extension portion and the second extension portion in the second direction, and
the third extension portion is located at a position where the third extension portion does not overlap the first and second protruding portions in the second direction.

15. The electrostatic chuck according to claim 11, wherein the plurality of protruding portions further includes a third protruding portion provided in the first extension portion,
the third protruding portion protrudes toward the second protruding portion, and
the third protruding portion is disposed so as to face the second protruding portion and to be adjacent to the second protruding portion.

16. An electrostatic chuck, comprising:
a ceramic dielectric substrate having a first major surface configured to have a process object placed thereon and a second major surface opposite to the first major surface;
a base plate having an upper surface, a lower surface, and a coolant flow path, the upper surface being at the ceramic dielectric substrate side, the lower surface being opposite to the upper surface, the coolant flow path allowing a cooling medium to flow, the base plate supporting the ceramic dielectric substrate; and
a heater unit which heats the ceramic dielectric substrate, the heater unit including
a first heater element,
a second heater element,
a bypass layer that is a power feeding path to the first and second heater elements, and
a first power feeding terminal, a second power feeding terminal, a third power feeding terminal, and a fourth power feeding terminal electrically connected to the bypass layer,
the first heater element being located between the first major surface and the upper surface,
the second heater element being located between the first major surface and the first heater element or between the first heater element and the upper surface,
the first heater element including a plurality of zones,
the plurality of zones of the first heater element including a first zone,
the first zone including
a first heater line emitting heat by allowing a current to flow, and
a first power feeding portion and a second power feeding portion feeding power to the first heater line,
the first power feeding portion being located at a position where the first power feeding portion does not overlap the first power feeding terminal in a Z-direction perpendicular to the first major surface,
the first power feeding portion being electrically connected to the first power feeding terminal via the bypass layer,
the second power feeding portion being located at a position where the second power feeding portion does not overlap the second power feeding terminal in the Z-direction,
the second power feeding portion being electrically connected to the second power feeding terminal via the bypass layer,
the second heater element including a plurality of zones,
the plurality of zones of the second heater element including a second zone,
the second zone including
a second heater line emitting heat by allowing a current to flow, and
a third power feeding portion and a fourth power feeding portion feeding power to the second heater line,
the third power feeding portion being located at a position where the third power feeding portion does not overlap the third power feeding terminal in the Z-direction,
the third power feeding portion being electrically connected to the third power feeding terminal via the bypass layer,
the fourth power feeding portion being located at a position where the fourth power feeding portion does not overlap the fourth power feeding terminal in the Z-direction,
the fourth power feeding portion being electrically connected to the fourth power feeding terminal via the bypass layer,
at least one of the third power feeding terminal or the fourth power feeding terminal being located at a position where the at least one of the third power feeding terminal or the fourth power feeding terminal overlaps a virtual line segment in the Z-direction,
the virtual line segment being a straight line connecting a center of the first power feeding portion and a center of the second power feeding portion at a shortest distance.

17. The electrostatic chuck according to claim 16, wherein
at least one of a center of the third power feeding terminal or a center of the fourth power feeding terminal is located at a position where the at least one of the center of the third power feeding terminal or the center of the fourth power feeding terminal overlaps the virtual line segment.

18. The electrostatic chuck according to claim 16, wherein
the first zone includes
a central region positioned at a center of the first zone when viewed along the Z-direction, and
an outer peripheral region positioned outside the central region when viewed along the Z-direction, and
at least one of the first power feeding portion or the second power feeding portion is located in the central region.

19. The electrostatic chuck according to claim 16, wherein
the first zone includes an outer circumference edge of the first heater element,
the first zone includes:
an inner circumference portion positioned radially inward of a center line of a radial direction, the center line of the radial direction bisecting the first zone in the radial direction; and an outer circumference portion positioned radially outward of the center line of the radial direction, the outer circumference portion including the outer circumference edge, and at least one of the first power feeding portion or the second power feeding portion is located in the inner circumference portion.

* * * * *